US012119700B2

(12) United States Patent
Fasching et al.

(10) Patent No.: US 12,119,700 B2
(45) Date of Patent: Oct. 15, 2024

(54) SYSTEMS AND METHODS FOR ADAPTIVE ELECTROCHEMICAL CELL MANAGEMENT

(71) Applicant: Element Energy, Inc., Menlo Park, CA (US)

(72) Inventors: Rainer Johannes Fasching, Mill Valley, CA (US); Arnaud Devie, San Carlos, CA (US); Georgy Zerkalov, Santa Clara, CA (US); Anthony John Stratakos, Edgartown, MA (US)

(73) Assignee: Element Energy, Inc., Menlo Park, CA (US)

( * ) Notice: Subject to any disclaimer, the term of this patent is extended or adjusted under 35 U.S.C. 154(b) by 0 days.

(21) Appl. No.: 18/157,764

(22) Filed: Jan. 20, 2023

(65) Prior Publication Data
US 2024/0250549 A1  Jul. 25, 2024

(51) Int. Cl.
*B60L 58/16* (2019.01)
*B60L 3/00* (2019.01)
(Continued)

(52) U.S. Cl.
CPC ...... *H02J 7/007188* (2020.01); *B60L 3/0046* (2013.01); *B60L 58/16* (2019.02);
(Continued)

(58) Field of Classification Search
CPC .... H02J 7/007188; H02J 7/0013; H02J 7/005; H02J 7/0016; G01R 31/392; H01M 10/0525; H01M 10/441; B60L 58/16
(Continued)

(56) References Cited

U.S. PATENT DOCUMENTS 4,749,514 A * 6/1988 Murakami .............. C01B 32/22
428/408
5,993,993 A * 11/1999 Hall ................... H01M 10/625
429/231.95
(Continued)

FOREIGN PATENT DOCUMENTS

CA     2667825 A1   5/2008
CN   101924380 A   12/2010
(Continued)

OTHER PUBLICATIONS

Walker, Geoffrey R., et al., "Cascaded DC-DC Converter Connection of Photovoltaic Modules", IEEE Transactions on Power Electronics, vol. 19, No. 4, (Jul. 2004), 1130-1139.
(Continued)

*Primary Examiner* — John T Trischler
(74) *Attorney, Agent, or Firm* — PdZ Patent Law, PLLC

(57) ABSTRACT

A method for adaptive electrochemical cell management in an energy storage system including a plurality of battery management system (BMS) nodes, the method including (1) obtaining a first signal identifying one or more degradation mechanisms of a first cell assembly of a first BMS node of the plurality of BMS nodes, the first cell assembly including one or more first electrochemical cells, and (2) controlling a first BMS node controller of the first BMS node in response to the first signal, to change a state of operation of the first cell assembly to mitigate the one or more degradation mechanisms of the first cell assembly, independently of operation of a second BMS node of the plurality of BMS nodes.

27 Claims, 27 Drawing Sheets

(51) Int. Cl.
  *G01R 31/392* (2019.01)
  *H01M 10/0525* (2010.01)
  *H01M 10/44* (2006.01)
  *H02J 7/00* (2006.01)
  *H01M 10/42* (2006.01)

(52) U.S. Cl.
  CPC ...... *G01R 31/392* (2019.01); *H01M 10/0525* (2013.01); *H01M 10/441* (2013.01); *H02J 7/0013* (2013.01); *H02J 7/0016* (2013.01); *H02J 7/005* (2020.01); *H01M 2010/4271* (2013.01); *H01M 10/445* (2013.01)

(58) Field of Classification Search
  USPC ........................................................ 320/134
  See application file for complete search history.

(56) References Cited

U.S. PATENT DOCUMENTS

| | | | |
|---|---|---|---|
| 6,160,441 A | 12/2000 | Stratakos et al. | |
| 6,262,558 B1 | 7/2001 | Weinberg | |
| 6,292,337 B1 * | 9/2001 | Legatti | H02H 1/0015 361/46 |
| 6,404,163 B1 * | 6/2002 | Kapsokavathis | H02J 7/00302 320/104 |
| 6,445,244 B1 | 9/2002 | Stratakos et al. | |
| 6,621,669 B1 * | 9/2003 | Haun | H01H 71/125 361/42 |
| 6,777,953 B2 | 8/2004 | Blades | |
| 6,835,491 B2 * | 12/2004 | Gartstein | H01M 6/5044 429/61 |
| 6,876,203 B2 | 4/2005 | Blades | |
| 6,984,970 B2 | 1/2006 | Capel | |
| 7,068,017 B2 | 6/2006 | Willner et al. | |
| 7,391,218 B2 | 6/2008 | Kojori et al. | |
| 7,612,532 B2 * | 11/2009 | Verbrugge | H01M 10/48 320/132 |
| 8,046,181 B2 * | 10/2011 | Kang | G01R 31/3648 320/132 |
| 8,158,877 B2 * | 4/2012 | Klein | H02S 50/10 320/101 |
| 8,163,410 B2 * | 4/2012 | Fulop | H02J 7/0014 429/231.95 |
| 8,198,862 B2 * | 6/2012 | Zhang | B60L 58/22 320/118 |
| 8,242,745 B2 * | 8/2012 | Zhang | B60L 58/22 320/120 |
| 8,332,169 B2 * | 12/2012 | Kang | G01R 31/3648 320/132 |
| 8,395,355 B2 * | 3/2013 | Kaita | H02J 7/0049 180/68.5 |
| 8,395,519 B2 | 3/2013 | Cassidy | |
| 8,410,755 B2 * | 4/2013 | Chau | B60L 50/64 320/134 |
| 8,415,926 B2 * | 4/2013 | Bhardwaj | G01R 31/389 320/136 |
| 8,503,137 B2 | 8/2013 | Panetta | |
| 8,531,158 B2 * | 9/2013 | Wang | H01M 10/48 320/132 |
| 8,541,122 B2 * | 9/2013 | Fulop | H01M 50/559 429/231.95 |
| 8,581,555 B2 * | 11/2013 | Yamamoto | H01M 10/44 320/128 |
| 8,643,216 B2 | 2/2014 | Lattin | |
| 8,680,815 B2 * | 3/2014 | Wang | G01R 31/392 320/132 |
| 8,686,693 B2 * | 4/2014 | Bhowmik | H02J 7/0014 320/152 |
| 8,808,886 B2 * | 8/2014 | Kim | H02J 7/0016 338/68 |
| 8,810,199 B2 | 8/2014 | Roeper | |
| 8,817,431 B2 | 8/2014 | Tomimbang et al. | |
| 8,837,097 B2 * | 9/2014 | Zuercher | H02H 7/20 361/42 |
| 8,879,218 B2 | 11/2014 | Tomimbang | |
| 8,928,282 B2 * | 1/2015 | Kudo | H01M 10/441 320/122 |
| 8,981,683 B2 * | 3/2015 | Hambitzer | B60L 58/10 318/434 |
| 8,986,866 B2 * | 3/2015 | Lynch | G08B 29/181 429/61 |
| 9,106,090 B2 * | 8/2015 | Taniyama | H01M 10/425 |
| 9,132,734 B2 | 9/2015 | Auguet et al. | |
| 9,153,990 B2 * | 10/2015 | LePort | H02J 7/0014 |
| 9,172,120 B2 * | 10/2015 | Pariseau | H01M 10/48 |
| 9,209,643 B2 * | 12/2015 | Nishikawa | B60L 50/51 |
| 9,257,729 B2 | 2/2016 | Hermann et al. | |
| 9,312,769 B2 | 4/2016 | Stratakos et al. | |
| 9,331,497 B2 | 5/2016 | Beaston | |
| 9,343,781 B2 * | 5/2016 | Shrader | H01M 10/48 |
| 9,343,911 B2 * | 5/2016 | LePort | H02J 7/00 |
| 9,425,631 B2 | 8/2016 | Furtner | |
| 9,453,884 B2 * | 9/2016 | Patin | G01R 31/001 |
| 9,515,496 B1 | 12/2016 | Ying | |
| 9,525,290 B2 * | 12/2016 | Snyder | H02J 7/0016 |
| 9,529,048 B2 * | 12/2016 | LePort | G01R 31/382 |
| 9,564,762 B2 * | 2/2017 | Lee | H02J 7/0016 |
| 9,705,341 B2 | 7/2017 | Komatsu et al. | |
| 9,728,820 B2 * | 8/2017 | Diamond | B60L 3/04 |
| 9,806,545 B2 | 10/2017 | Fink | |
| 9,812,742 B2 * | 11/2017 | Yamamoto | H01M 10/0525 |
| 9,865,901 B2 | 1/2018 | Hwang | |
| 9,893,385 B1 * | 2/2018 | Nayar | H01M 10/399 |
| 9,965,007 B2 | 5/2018 | Amelio et al. | |
| 10,018,682 B2 | 7/2018 | Kaupp et al. | |
| 10,067,198 B2 * | 9/2018 | Maluf | H02J 7/0048 |
| 10,137,792 B2 * | 11/2018 | He | B60L 58/14 |
| 10,153,651 B2 * | 12/2018 | Taylor | H02J 7/0014 |
| 10,205,334 B2 * | 2/2019 | Unno | B60L 58/24 |
| 10,236,696 B2 * | 3/2019 | Ishigaki | H02J 7/0013 |
| 10,270,262 B2 * | 4/2019 | Kim | H02J 7/0018 |
| 10,283,974 B2 * | 5/2019 | Macris | G01R 31/3842 |
| 10,286,801 B2 * | 5/2019 | Shimizu | B60L 58/15 |
| 10,322,824 B1 * | 6/2019 | Demont | B60L 3/0061 |
| 10,361,467 B2 * | 7/2019 | Kubo | H02J 7/0029 |
| 10,374,444 B2 * | 8/2019 | Worry | H01M 10/425 |
| 10,479,223 B2 * | 11/2019 | Demont | B64F 5/60 |
| 10,553,851 B2 | 2/2020 | Kim | |
| 10,576,843 B2 * | 3/2020 | Demont | H02P 5/00 |
| 10,601,239 B2 * | 3/2020 | Taylor | H02J 7/0048 |
| 10,714,956 B2 * | 7/2020 | Gleason | G01R 31/392 |
| 10,714,974 B2 | 7/2020 | Clifton et al. | |
| 10,734,649 B2 * | 8/2020 | Tolbert | H01M 4/625 |
| 10,761,530 B2 * | 9/2020 | Uppalapati | H02J 7/0029 |
| 10,777,851 B2 * | 9/2020 | Razzell | H01M 10/425 |
| 10,804,690 B2 | 10/2020 | Ronne et al. | |
| 10,809,308 B2 * | 10/2020 | Ballantine | G01R 31/392 |
| 10,910,858 B2 * | 2/2021 | Taylor | H01M 10/288 |
| 10,916,812 B2 * | 2/2021 | Chen | H01M 10/425 |
| 10,928,461 B1 * | 2/2021 | Stafl | G01R 31/371 |
| 10,938,075 B2 * | 3/2021 | Fujita | H01M 10/482 |
| 10,938,221 B1 * | 3/2021 | Tenorio | H01M 10/482 |
| 10,944,278 B1 * | 3/2021 | Kang | H02J 7/0013 |
| 10,944,279 B1 * | 3/2021 | Chen | H01M 10/4257 |
| 10,960,776 B2 * | 3/2021 | Foley | G01R 31/3842 |
| 10,989,760 B2 * | 4/2021 | Ballantine | H01M 10/4285 |
| 10,992,149 B1 * | 4/2021 | Kahn | H02J 7/0036 |
| 11,038,214 B2 * | 6/2021 | Rahimian | H01M 10/049 |
| 11,043,821 B2 * | 6/2021 | Nishikawa | H02J 7/0024 |
| 11,059,386 B2 * | 7/2021 | Demont | B60L 58/18 |
| 11,061,076 B1 | 7/2021 | Fasching et al. | |
| 11,065,979 B1 * | 7/2021 | Demont | H01M 10/482 |
| 11,095,140 B1 * | 8/2021 | Chen | H02J 1/001 |
| 11,108,251 B2 * | 8/2021 | Kirleis | H02J 7/0018 |
| 11,114,257 B2 * | 9/2021 | Wu | H01H 33/04 |
| 11,125,707 B1 * | 9/2021 | Fasching | H01M 10/48 |
| 11,131,717 B1 * | 9/2021 | Fasching | H02J 7/0048 |
| 11,133,534 B2 * | 9/2021 | Kirleis | B64U 70/60 |
| 11,133,690 B1 * | 9/2021 | Chen | H01M 10/0525 |
| 11,193,985 B2 * | 12/2021 | Bae | G01R 31/382 |
| 11,214,168 B2 * | 1/2022 | Aoyama | B60L 58/13 |

(56) References Cited

U.S. PATENT DOCUMENTS

| | | | |
|---|---|---|---|
| 11,215,156 B2* | 1/2022 | Ciaccio | H02J 7/342 |
| 11,258,279 B1* | 2/2022 | Kahn | H02J 7/0029 |
| 11,269,012 B1* | 3/2022 | Kahn | H02J 7/0047 |
| 11,336,104 B2* | 5/2022 | Poland | G01R 31/392 |
| 11,360,152 B1* | 6/2022 | Fasching | G01R 31/3842 |
| 11,415,630 B2* | 8/2022 | Dubarry | G01R 31/392 |
| 11,451,079 B2* | 9/2022 | Gleason | H02J 7/007188 |
| 11,462,918 B2* | 10/2022 | Crouse, Jr. | G01R 31/3842 |
| 11,466,656 B2* | 10/2022 | Ciaccio | B60L 1/02 |
| 11,476,677 B2* | 10/2022 | Liu | H01M 10/4257 |
| 11,485,238 B2* | 11/2022 | Foley | B60L 3/0092 |
| 11,489,343 B2* | 11/2022 | Liu | H01M 10/482 |
| 11,513,164 B2* | 11/2022 | Zhang | G01R 31/3835 |
| 11,552,479 B2* | 1/2023 | Liu | H01M 10/482 |
| 11,575,146 B2* | 2/2023 | Taylor | H02J 7/005 |
| 11,609,276 B2* | 3/2023 | Ruan | H01M 10/425 |
| 11,656,291 B2* | 5/2023 | Xu | G01R 31/3842 209/575 |
| 11,675,020 B2* | 6/2023 | Haga | G01R 31/3835 702/63 |
| 11,894,708 B2* | 2/2024 | Hoyt | H01M 10/48 |
| 2004/0162683 A1* | 8/2004 | Verbrugge | G01R 31/367 702/64 |
| 2005/0121067 A1 | 6/2005 | Toyomura et al. | |
| 2005/0139258 A1 | 6/2005 | Liu et al. | |
| 2005/0151513 A1 | 7/2005 | Cook et al. | |
| 2006/0284600 A1* | 12/2006 | Verbrugge | G01R 31/367 320/132 |
| 2007/0223165 A1 | 9/2007 | Itri et al. | |
| 2008/0236648 A1* | 10/2008 | Klein | H02J 3/46 320/101 |
| 2008/0303503 A1 | 12/2008 | Wolfs | |
| 2009/0066291 A1* | 3/2009 | Tien | H02J 7/0016 320/118 |
| 2009/0104510 A1* | 4/2009 | Fulop | H01M 50/553 429/50 |
| 2009/0198399 A1* | 8/2009 | Kubo | H02J 7/0019 701/22 |
| 2009/0284078 A1 | 11/2009 | Zhang et al. | |
| 2009/0284232 A1 | 11/2009 | Zhang et al. | |
| 2009/0284240 A1 | 11/2009 | Zhang et al. | |
| 2009/0284998 A1 | 11/2009 | Zhang et al. | |
| 2010/0019729 A1* | 1/2010 | Kaita | B60L 58/25 320/134 |
| 2010/0036626 A1* | 2/2010 | Kang | G01R 31/392 702/63 |
| 2010/0085894 A1* | 4/2010 | Johnson | H02G 3/00 370/254 |
| 2010/0207455 A1 | 8/2010 | Erickson, Jr. et al. | |
| 2010/0253150 A1 | 10/2010 | Porter et al. | |
| 2010/0288327 A1 | 11/2010 | Lisi et al. | |
| 2010/0305770 A1* | 12/2010 | Bhowmik | H02J 7/0025 324/426 |
| 2010/0315043 A1* | 12/2010 | Chau | B60L 50/64 320/134 |
| 2010/0327659 A1 | 12/2010 | Lisi et al. | |
| 2011/0062784 A1 | 3/2011 | Wolfs | |
| 2011/0089897 A1* | 4/2011 | Zhang | H02J 7/0016 320/116 |
| 2011/0089907 A1* | 4/2011 | Bhardwaj | G01R 31/389 320/136 |
| 2011/0090607 A1 | 4/2011 | Luebke et al. | |
| 2011/0140650 A1* | 6/2011 | Zhang | H02J 7/0016 320/118 |
| 2011/0141644 A1 | 6/2011 | Hastings et al. | |
| 2011/0187312 A1* | 8/2011 | Yamamoto | H01M 10/44 320/101 |
| 2011/0260687 A1* | 10/2011 | Kudo | H01M 10/441 320/118 |
| 2011/0301772 A1* | 12/2011 | Zuercher | H01L 31/02021 700/292 |
| 2012/0013201 A1* | 1/2012 | Pariseau | H01M 10/48 307/125 |
| 2012/0035873 A1* | 2/2012 | Kang | G01R 31/3648 702/63 |
| 2012/0043818 A1 | 2/2012 | Stratakos et al. | |
| 2012/0043823 A1 | 2/2012 | Stratakos et al. | |
| 2012/0043923 A1 | 2/2012 | Ikriannikov et al. | |
| 2012/0044014 A1 | 2/2012 | Stratakos et al. | |
| 2012/0089266 A1 | 4/2012 | Tomimbang et al. | |
| 2012/0094151 A1* | 4/2012 | Kim | H02J 7/007194 429/61 |
| 2012/0105068 A1* | 5/2012 | Wang | H01M 10/0525 324/427 |
| 2012/0105069 A1* | 5/2012 | Wang | G01R 31/392 324/427 |
| 2012/0112760 A1 | 5/2012 | Yoscovich et al. | |
| 2012/0119746 A1* | 5/2012 | Macris | H02J 7/0048 324/431 |
| 2012/0133521 A1* | 5/2012 | Rothkopf | G01R 31/50 340/636.1 |
| 2012/0263986 A1* | 10/2012 | Fulop | H02J 7/0068 429/94 |
| 2012/0313560 A1* | 12/2012 | Hambitzer | H01M 10/4207 320/118 |
| 2013/0092208 A1* | 4/2013 | Robbins | H01L 31/02021 324/536 |
| 2013/0106194 A1 | 5/2013 | Jergovic et al. | |
| 2013/0162258 A1* | 6/2013 | Patin | G01R 27/02 324/426 |
| 2013/0170084 A1 | 7/2013 | Strobl et al. | |
| 2013/0176401 A1 | 7/2013 | Monari et al. | |
| 2013/0234669 A1 | 9/2013 | Huang et al. | |
| 2013/0257323 A1* | 10/2013 | Diamond | B60L 3/12 320/118 |
| 2013/0278221 A1* | 10/2013 | Maeda | G01R 31/392 320/134 |
| 2013/0323542 A1* | 12/2013 | Wijayawardhana | H01M 10/48 324/426 |
| 2014/0023888 A1* | 1/2014 | Fulop | H02J 7/0068 429/50 |
| 2014/0028264 A1* | 1/2014 | Taniyama | H01M 10/058 320/134 |
| 2014/0152258 A1* | 6/2014 | LePort | H02J 7/00302 702/63 |
| 2014/0152259 A1* | 6/2014 | LePort | H02J 7/0014 320/118 |
| 2014/0152260 A1* | 6/2014 | LePort | H02J 7/00306 320/118 |
| 2014/0152315 A1* | 6/2014 | LePort | G01R 31/382 324/430 |
| 2014/0167657 A1* | 6/2014 | Nishikawa | B60L 58/15 320/134 |
| 2014/0175869 A1* | 6/2014 | Phillips | B60L 58/13 320/160 |
| 2014/0197799 A1* | 7/2014 | Leblanc | H02J 7/0069 320/136 |
| 2014/0253045 A1 | 9/2014 | Poznar | |
| 2014/0347014 A1* | 11/2014 | Lee | H02J 7/0047 320/134 |
| 2014/0368205 A1 | 12/2014 | Svensson et al. | |
| 2014/0373894 A1 | 12/2014 | Stratakos et al. | |
| 2015/0115736 A1* | 4/2015 | Snyder | H02J 7/0048 307/115 |
| 2015/0118523 A1* | 4/2015 | Shrader | H01M 10/617 429/61 |
| 2015/0155602 A1* | 6/2015 | Hwang | H01M 10/425 429/61 |
| 2015/0171628 A1 | 6/2015 | Ponec et al. | |
| 2015/0244032 A1* | 8/2015 | Yamamoto | H01M 10/0525 29/623.1 |
| 2015/0372279 A1* | 12/2015 | Li | H02J 7/00712 429/50 |
| 2015/0377976 A1* | 12/2015 | Maluf | G01R 31/392 702/63 |
| 2016/0047862 A1* | 2/2016 | Shimizu | G06Q 20/145 702/63 |
| 2016/0105042 A1* | 4/2016 | Taylor | H01M 10/049 320/134 |

(56) References Cited

U.S. PATENT DOCUMENTS

| | | | |
|---|---|---|---|
| 2016/0197501 A1* | 7/2016 | LePort | H02J 7/0048 320/118 |
| 2016/0261127 A1* | 9/2016 | Worry | H02J 7/0029 |
| 2016/0372940 A1 | 12/2016 | Canadi | |
| 2017/0123008 A1* | 5/2017 | Frias | H02H 9/005 |
| 2017/0162875 A1* | 6/2017 | Tolbert | H01G 11/06 |
| 2017/0176538 A1* | 6/2017 | Matsumura | H02J 7/00 |
| 2017/0179736 A1* | 6/2017 | Kim | H02J 7/0018 |
| 2017/0203660 A1* | 7/2017 | He | B60L 58/14 |
| 2017/0232851 A1* | 8/2017 | Unno | H02P 27/08 307/10.1 |
| 2017/0237128 A1* | 8/2017 | Kubo | H02J 7/0029 429/7 |
| 2017/0256946 A1* | 9/2017 | Ishigaki | H02J 7/0031 |
| 2018/0147947 A1 | 5/2018 | Gebhart | |
| 2018/0252195 A1* | 9/2018 | Ciaccio | H01M 10/635 |
| 2018/0252774 A1* | 9/2018 | Ciaccio | G01R 31/388 |
| 2018/0321323 A1* | 11/2018 | Dubarry | G01R 31/3835 |
| 2019/0036350 A1* | 1/2019 | Gleason | H01M 10/6563 |
| 2019/0115629 A1* | 4/2019 | Chen | H01M 10/425 |
| 2019/0198938 A1* | 6/2019 | Fujita | H02J 7/0029 |
| 2019/0212383 A1 | 7/2019 | Elliott | |
| 2019/0229518 A1* | 7/2019 | Ronne | H02H 1/0069 |
| 2019/0229650 A1* | 7/2019 | Demont | B60L 50/40 |
| 2019/0252734 A1* | 8/2019 | Razzell | G01R 31/3644 |
| 2019/0311864 A1* | 10/2019 | Wu | H01H 9/30 |
| 2019/0319460 A1* | 10/2019 | Taylor | H01M 10/441 |
| 2019/0337409 A1* | 11/2019 | Demont | B60L 50/40 |
| 2019/0361075 A1 | 11/2019 | Lee et al. | |
| 2019/0391577 A1* | 12/2019 | Uppalapati | H02J 7/0029 |
| 2020/0021107 A1 | 1/2020 | Collins et al. | |
| 2020/0036047 A1* | 1/2020 | Aikens | H01M 50/204 |
| 2020/0055407 A1* | 2/2020 | Foley | G01R 31/3842 |
| 2020/0110134 A1* | 4/2020 | Li | G01R 31/374 |
| 2020/0127489 A1 | 4/2020 | Chen et al. | |
| 2020/0161875 A1* | 5/2020 | Nishikawa | H02J 7/02 |
| 2020/0207219 A1 | 7/2020 | Slepchenkov et al. | |
| 2020/0209317 A1* | 7/2020 | Ballantine | H01M 10/48 |
| 2020/0209318 A1* | 7/2020 | Ballantine | H01M 10/482 |
| 2020/0212959 A1 | 7/2020 | Eriksen et al. | |
| 2020/0235441 A1* | 7/2020 | Rahimian | H01M 10/425 |
| 2020/0247268 A1* | 8/2020 | Aoyama | G01R 31/392 |
| 2020/0254882 A1 | 8/2020 | Kwon et al. | |
| 2020/0259338 A1* | 8/2020 | Taylor | H01M 4/0447 |
| 2020/0274203 A1* | 8/2020 | Kirleis | B60L 8/003 |
| 2020/0274271 A1* | 8/2020 | Kirleis | H01M 10/441 |
| 2020/0298728 A1* | 9/2020 | Demont | B64D 27/24 |
| 2020/0341067 A1* | 10/2020 | Ruan | H01M 10/425 |
| 2020/0343737 A1* | 10/2020 | Gleason | G01R 31/387 |
| 2020/0350779 A1 | 11/2020 | Tikhonski et al. | |
| 2021/0021141 A1* | 1/2021 | Alipoor | H02J 7/0016 |
| 2021/0041506 A1* | 2/2021 | Bae | G01R 31/3842 |
| 2021/0044119 A1* | 2/2021 | Poland | H02J 7/005 |
| 2021/0044130 A1* | 2/2021 | Burger | H02J 7/00711 |
| 2021/0055356 A1* | 2/2021 | Stafl | B60L 58/18 |
| 2021/0083486 A1* | 3/2021 | Klicpera | H01M 10/443 |
| 2021/0096398 A1* | 4/2021 | Hekmat | H01M 10/425 |
| 2021/0119455 A1* | 4/2021 | Jaipaul | H02J 7/005 |
| 2021/0175485 A1* | 6/2021 | Sieber | H01M 10/657 |
| 2021/0184272 A1* | 6/2021 | Kwak | H01M 10/4285 |
| 2021/0213838 A1* | 7/2021 | Foley | G01R 31/392 |
| 2021/0349150 A1* | 11/2021 | Li | G01R 19/16542 |
| 2021/0359527 A1* | 11/2021 | Taylor | H01M 10/049 |
| 2021/0376629 A1* | 12/2021 | Chen | H02J 7/00032 |
| 2021/0391731 A1* | 12/2021 | Kirleis | B60L 8/003 |
| 2021/0396816 A1* | 12/2021 | Zominy | H02J 7/0044 |
| 2022/0013814 A1* | 1/2022 | Kirleis | B60L 3/0092 |
| 2022/0045534 A1* | 2/2022 | Hoyt | H02J 7/005 |
| 2022/0057350 A1* | 2/2022 | Fasching | G01R 31/382 |
| 2022/0057455 A1* | 2/2022 | Fasching | H01M 10/4228 |
| 2022/0063443 A1* | 3/2022 | Demont | B64D 45/00 |
| 2022/0115879 A1* | 4/2022 | Kahn | H01M 10/4235 |
| 2022/0128631 A1* | 4/2022 | Zhang | G01R 31/3835 |
| 2022/0131391 A1* | 4/2022 | Trippel | H02J 7/0013 |
| 2022/0140626 A1* | 5/2022 | Kahn | H02J 7/0029 320/135 |
| 2022/0176849 A1* | 6/2022 | Demont | H02P 25/022 |
| 2022/0187385 A1* | 6/2022 | Laurent | G01R 31/382 |
| 2022/0188481 A1* | 6/2022 | Okabe | G06F 30/20 |
| 2022/0190619 A1* | 6/2022 | Fasching | H01M 10/052 |
| 2022/0209311 A1* | 6/2022 | Ye | H01M 10/44 |
| 2022/0224129 A1* | 7/2022 | Liu | H01M 10/441 |
| 2022/0239119 A1* | 7/2022 | Liu | H02J 7/0014 |
| 2022/0239136 A1* | 7/2022 | Fasching | H01M 10/425 |
| 2022/0252670 A1* | 8/2022 | Xu | G01R 31/367 |
| 2022/0252674 A1* | 8/2022 | Xu | G01R 31/3828 |
| 2022/0263333 A1* | 8/2022 | Saita | H02J 7/0047 |
| 2022/0294238 A1* | 9/2022 | Liu | H01M 10/482 |
| 2022/0294239 A1* | 9/2022 | Liu | H01M 10/425 |
| 2022/0302719 A1* | 9/2022 | Tenorio | H02J 7/00712 |
| 2022/0311261 A1* | 9/2022 | Izumi | H02J 7/0031 |
| 2022/0336844 A1* | 10/2022 | Kang | H01M 4/0404 |
| 2022/0371472 A1* | 11/2022 | Okubo | B60L 3/0046 |
| 2022/0404429 A1* | 12/2022 | Haga | G01R 31/392 |
| 2022/0412054 A1* | 12/2022 | Takeo | B60L 58/12 |
| 2023/0011716 A1* | 1/2023 | Kahn | H02J 7/0016 |
| 2023/0022353 A1* | 1/2023 | Ryu | B60L 58/16 |
| 2023/0025900 A1* | 1/2023 | Kahn | H02J 7/0014 |
| 2023/0204674 A1* | 6/2023 | Ruan | H01M 10/48 324/427 |
| 2023/0393203 A1* | 12/2023 | Li | G01R 31/374 |
| 2024/0027536 A1* | 1/2024 | Han | H01M 10/482 |
| 2024/0054269 A1* | 2/2024 | Lyu | H02J 7/0047 |
| 2024/0085486 A1* | 3/2024 | Lee | B60L 58/12 |
| 2024/0139571 A1* | 5/2024 | Fang | A62C 37/40 |

FOREIGN PATENT DOCUMENTS

| | | |
|---|---|---|
| CN | 109860740 | 6/2019 |
| EP | 0762591 A2 | 3/1997 |
| EP | 3550581 A1 | 10/2019 |
| JP | 2017069011 A * | 4/2017 |
| WO | 2013053445 A1 | 4/2013 |
| WO | 2015200366 A1 | 12/2015 |

OTHER PUBLICATIONS

Wolfs, Peter, et al., "Distributed Maximum Power Tracking for High Performance Vehicle Solar Arrays", Australian Universities Power Engineering Conference (AUPEC 2004), (Sep. 2004), 6 pgs.
Machine translation of Description of WO 2012/053445, 11 pages.
Martinez et al., Arc Fault Management by Solid State Switches for Enhanced Automotive Safety, Jan. 2005, IEEE, pp. 1029-1034, 2005.
Machine translation of CN 109860740, 24 pages.
U.S. Appl. No. 17/821,179, filed Aug. 21, 2022, 124 pages.
U.S. Appl. No. 17/650,472, filed Feb. 9, 2022, 82 pages.
Machine Translation of CN 10924380, 15 pages.

\* cited by examiner

1900

1902 Obtain a First Signal Identifying One or More Degradation Mechanisms of a First Cell Assembly of an Energy Storage System

1904 Control a Respective BMS Node Controller Electrically Coupled to the First Cell Assembly in Response to the First Signal, to Change a State of Operation of the First Cell Assembly to Mitigate the One or More Degradation Mechanisms of the First Cell Assembly, Independently of Operation of Other BMS nodes of the Energy Storage System.

1906 Determine a Desired Change in State of Operation of the First Cell Assembly to Mitigate the One or More Degradation Mechanisms of the First Cell Assembly

1908 Control the Respective BMS Node Controller Electrically Coupled to the First Cell Assembly to Achieve the Desired Change in State of Operation of the First Cell Assembly

```
┌─────────────────────────────────────────────────────────────────────┐
│   Obtain a First Signal Identifying One or More Hazardous Failure   │
│          Mechanisms of a First Cell Assembly of an Energy           │
│                          Storage System                             │
│                                                              2102   │
└─────────────────────────────────────────────────────────────────────┘
                                    │
                                    ▼
┌─────────────────────────────────────────────────────────────────────┐
│   Control a Respective BMS Node Controller Electrically Coupled     │
│   to the First Cell Assembly in Response to the First Signal, to    │
│   Change a State of Operation of the First Cell Assembly to         │
│   Mitigate the One or More Hazardous Failure Mechanisms of the      │
│   First Cell Assembly, Independently of Operation of Other BMS      │
│                   Nodes of the Energy Storage System                │
│                                                                     │
│   ┌ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ┐  │
│     Determine a Desired Change in State of Operation of the First  │
│   │ Cell Assembly to Mitigate the One or More Hazardous Failure │  │
│         Mechanisms of the First Cell Assembly                      │
│   │                                                    2106     │  │
│   └ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ┘  │
│                                                                     │
│   ┌ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ┐  │
│       Control the Respective BMS Node Controller Electrically      │
│   │   Coupled to the First Cell Assembly to Achieve the Desired │  │
│         Change in State of Operation of the First Cell Assembly    │
│   │                                                    2108     │  │
│   └ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ┘  │
│                                                              2104   │
└─────────────────────────────────────────────────────────────────────┘
```

FIG. 21

SYSTEMS AND METHODS FOR ADAPTIVE ELECTROCHEMICAL CELL MANAGEMENT

BACKGROUND

A battery is a device including one or more electrochemical cells that may be discharged to convert chemical energy into electrical energy. Batteries may be grouped into primary batteries and secondary batteries. A primary battery is single-use device which undergoes an irreversible change during its discharge. A secondary battery, in contrast, can be recharged by applying an electric current to the battery, and a secondary battery can therefore be discharged and recharged multiple times.

Batteries are widely used as electrical power sources in applications where a continuous connection to a fixed electric power source, such as an electric utility's grid, is undesirable or infeasible. For example, batteries are widely used to power mobile information technology devices, such as mobile telephones and tablet computers. Additionally, batteries are increasingly being used as a power source in vehicles, either as a vehicle's sole power source or to supplement a vehicle's internal combustion engine. It is anticipated that batteries will largely supplant internal combustion engines in future new vehicles.

Furthermore, there is great interest in using batteries in electric infrastructure to store energy. For example, an electric utility may charge a battery to store energy when there is a surplus of electrical power, and the electric utility may subsequently discharge the battery to withdraw the stored energy when additional electrical power is needed. Accordingly, batteries are anticipated to be a key component in the ongoing transition from fossil fuel electrical power sources to renewable electric power sources, as batteries can compensate for the intermittent nature of renewable electric power sources.

One popular electrochemical cell is the Lithium-ion (Li-ion) electrochemical cell. Examples of Li-ion electrochemical cells include Lithium Cobalt Oxide (LCO) electrochemical cells, Lithium Manganese Oxide (LMO) electrochemical cells, Lithium Nickel Manganese Cobalt Oxide (NMC) electrochemical cells, Lithium Iron Phosphate (LFP) electrochemical cells, Lithium Nickel Cobalt Aluminum Oxide (NCA) electrochemical cells, and Lithium Titanate (LTO) electrochemical cells. Li-ion electrochemical cells advantageously have a high energy density relative to most other secondary battery electrochemical cells. However, Li-ion electrochemical cells can easily be damaged by operation outside of their intended operating range, such as by overcharging the cell or by excessively discharging the cell. Additionally, the high energy density and use of flammable electrolyte of Li-ion electrochemical cells makes them susceptible to catching fire in case of cell damage or cell failure. Battery management systems, which control battery operation, such as battery charging and discharging, are therefore used with batteries including Li-ion electrochemical cells (and other batteries) to help achieve long battery life and safe battery operation.

SUMMARY

In a first aspect, a method for adaptive electrochemical cell management in an energy storage system including a plurality of battery management system (BMS) nodes includes the following steps: (1) obtaining a first signal identifying one or more degradation mechanisms of a first cell assembly of a first BMS node of the plurality of BMS nodes, the first cell assembly including one or more first electrochemical cells, and (2) controlling a first BMS node controller of the first BMS node in response to the first signal, to change a state of operation of the first cell assembly to mitigate the one or more degradation mechanisms of the first cell assembly, independently of operation of a second BMS node of the plurality of BMS nodes.

In an embodiment of the first aspect, controlling the first BMS node controller in response to the first signal includes (1) determining a desired change in state of operation of the first cell assembly to mitigate the one or more degradation mechanisms of the first cell assembly and (2) controlling the first BMS node controller to achieve the desired change in state of operation of the first cell assembly.

In another embodiment of the first aspect, determining the desired change in state of operation of the first cell assembly to mitigate the one or more degradation mechanisms of the first cell assembly includes (1) determining respective relative stress costs for each of a plurality of possible changes in state of operation of the first cell assembly and (2) designating a possible change in state of operation of the first cell assembly having a lowest respective relative stress cost as the desired change in state of operation of the first cell assembly.

In another embodiment of the first aspect, the one or more degradation mechanisms of the first cell assembly include a plurality of degradation mechanisms of the first cell assembly, and the method further comprises weighing each of the plurality of degradation mechanisms of the first cell assembly when determining the desired change in state of operation of the first cell assembly.

In another embodiment of the first aspect, weighing each of the plurality of degradation mechanisms of the first cell assembly includes equally weighing each of the plurality of degradation mechanisms.

In another embodiment of the first aspect, weighing each of the plurality of degradation mechanisms of the first cell assembly comprises unequally weighing at least two of the plurality of degradation mechanisms.

In another embodiment of the first aspect, the one or more first electrochemical cells are Lithium-ion electrochemical cells, and the one or more degradation mechanisms of the first cell assembly include at least one of loss of Lithium inventory of the one or more first electrochemical cells, loss of active material in respective anodes of the one or more first electrochemical cells, loss of active material in respective cathodes of the one or more first electrochemical cells, impedance growth on the respective anodes of the one or more first electrochemical cells, impedance growth on the respective cathodes of the one or more first electrochemical cells, abnormal lithiation level on the respective anodes of the one or more first electrochemical cells, and abnormal lithiation level on the respective cathodes of the one or more first electrochemical cells.

In another embodiment of the first aspect, the method further includes controlling a third BMS node controller of a third BMS node of the plurality of BMS nodes to at least partially compensate for the change in the state of operation of the first cell assembly, such that a power contribution of the energy storage system does not change in response to the change in the state of operation of the first cell assembly.

In another embodiment of the first aspect, the one or more first electrochemical cells consist of a single first electrochemical cell.

In another embodiment of the first aspect, the one or more first electrochemical cells comprise a plurality of first electrochemical cells electrically coupled together.

In another embodiment of the first aspect, each first electrochemical cell of the one or more first electrochemical cells is a Lithium-ion electrochemical cell, the one or more degradation mechanisms of the first cell assembly include Lithium inventory decrease in the one or more first electrochemical cells, and controlling the first BMS node controller in response to the first signal includes controlling the first BMS node controller to reduce a maximum state of charge of the one or more first electrochemical cells, to mitigate the Lithium inventory decrease in the one or more first electrochemical cells.

In another embodiment of the first aspect, each first electrochemical cell of the one or more first electrochemical cells is a Lithium-ion electrochemical cell, the one or more degradation mechanisms of the first cell assembly include Lithium inventory decrease in the one or more first electrochemical cells, and controlling the first BMS node controller in response to the first signal includes controlling the first BMS node controller to control a charge or discharge rate of the one or more first electrochemical cells, to mitigate the Lithium inventory decrease in the one or more first electrochemical cells.

In another embodiment of the first aspect, (1) each first electrochemical cell of the one or more first electrochemical cells is a Lithium-ion electrochemical cell, (2) the one or more degradation mechanisms of the first cell assembly include Lithium inventory decrease in the one or more first electrochemical cells, and (3) controlling the first BMS node controller in response to the first signal includes controlling the first BMS node controller to prevent operation of the one or more first electrochemical cells in a third intercalation stage of respective graphite anodes of the one or more first electrochemical cells, to limit lithiation level of the respective graphite anodes of the one or more first electrochemical cells and thereby mitigate the Lithium inventory decrease in the one or more first electrochemical cells.

In another embodiment of the first aspect, (1) each first electrochemical cell of the one or more first electrochemical cells is a Lithium-ion electrochemical cell, (2) the one or more degradation mechanisms of the first cell assembly include Lithium inventory decrease in the one or more first electrochemical cells, and (3) controlling the first BMS node controller in response to the first signal includes controlling the first BMS node controller to increase de-lithiation of respective cathodes of the one or more first electrochemical cells, to mitigate the Lithium inventory decrease in the one or more first electrochemical cells.

In another embodiment of the first aspect, (1) each first electrochemical cell of the one or more first electrochemical cells is a Lithium-ion electrochemical cell, (2) the one or more degradation mechanisms of the first cell assembly include impedance growth on respective anodes of the one or more first electrochemical cells, and (3) controlling the first BMS node controller in response to the first signal include controlling the first BMS node controller to limit a charge or discharge rate of the one or more first electrochemical cells in response to one or more of (a) state of charge of the one or more first electrochemical cells exceeding a first threshold value and (b) temperature of the one or more first electrochemical cells being below a second threshold value, to mitigate the impedance growth on respective anodes of the one or more first electrochemical cells.

In another embodiment of the first aspect, the first threshold value is a state of charge of 70 percent, and the second threshold value is a temperature of 25 degrees Celsius.

In another embodiment of the first aspect, (1) each first electrochemical cell of the one or more first electrochemical cells is a Lithium-ion electrochemical cell, (2) the one or more degradation mechanisms of the first cell assembly include impedance growth on respective anodes of the one or more first electrochemical cells, and (3) controlling the first BMS node controller in response to the first signal includes controlling the first BMS node controller to limit a maximum state of charge of the one or more first electrochemical cells in response to an anticipated resting or idle period of the one or more first electrochemical cells exceeding a threshold value, to mitigate the impedance growth on respective anodes of the one or more first electrochemical cells.

In another embodiment of the first aspect, (1) each first electrochemical cell of the one or more first electrochemical cells is a Lithium-ion electrochemical cell, (2) the one or more degradation mechanisms of the first cell assembly include impedance growth on respective anodes of the one or more first electrochemical cells, and (3) controlling the first BMS node controller in response to the first signal includes controlling the first BMS node controller to limit a maximum state of charge of the one or more first electrochemical cells in response to a temperature of the one or more first electrochemical cells exceeding a threshold value, to mitigate the impedance growth on the respective anodes of the one or more first electrochemical cells.

In another embodiment of the first aspect, (1) each first electrochemical cell of the one or more first electrochemical cells is a Lithium-ion electrochemical cell, (2) the one or more degradation mechanisms of the first cell assembly include impedance growth on respective graphite anodes of the one or more first electrochemical cells, and (3) controlling the first BMS node controller in response to the first signal includes controlling the first BMS node controller to prevent operation of the one or more first electrochemical cells in a third intercalation stage of the respective graphite anodes of the one or more first electrochemical cells, to mitigate the impedance growth on respective graphite anodes of the one or more first electrochemical cells.

In another embodiment of the first aspect, (1) each first electrochemical cell of the one or more first electrochemical cells is a Lithium-ion electrochemical cell, (2) the one or more degradation mechanisms of the first cell assembly include impedance growth on respective anodes of the one or more first electrochemical cells, and (3) controlling the respective first BMS node controller in response to the first signal includes controlling the first BMS node controller to limit a rate of charge or discharge of the one or more first electrochemical cells to a value that is a function of impedance of the respective anodes of the one or more first electrochemical cells when the one or more first electrochemical cells operate in an anode third intercalation stage, to mitigate the impedance growth on the respective anodes of the one or more first electrochemical cells.

In another embodiment of the first aspect, (1) each first electrochemical cell of the one or more first electrochemical cells is a Lithium-ion electrochemical cell, (2) the one or more degradation mechanisms of the first cell assembly include impedance growth on respective cathodes of the one or more first electrochemical cells, and (3) controlling the first BMS node controller in response to the first signal includes controlling the first BMS node controller to limit a rate of charge or discharge of the one or more first electrochemical cells in response to (a) a state of charge of the one or more first electrochemical cells exceeding a first threshold value and (b) a temperature of the one or more first electrochemical cells being below a second threshold value, to mitigate the impedance growth on the respective cathodes of the one or more first electrochemical cells.

In another embodiment of the first aspect, (1) each first electrochemical cell of the one or more first electrochemical cells is a Lithium-ion electrochemical cell, (2) the one or more degradation mechanisms of the first cell assembly include impedance growth on respective cathodes of the one or more first electrochemical cells, and (3) controlling the first BMS node controller in response to the first signal includes controlling the first BMS node controller to limit a maximum state of charge of the one or more first electrochemical cells in response to an anticipated resting or idle period duration of the one or more first electrochemical cells exceeding a threshold value, to mitigate the impedance growth on the respective cathodes of the one or more first electrochemical cells.

In another embodiment of the first aspect, (1) each first electrochemical cell of the one or more first electrochemical cells is a Lithium-ion electrochemical cell, (2) the one or more degradation mechanisms of the first cell assembly include impedance growth on respective cathodes of the one or more first electrochemical cells, and (3) controlling the first BMS node controller in response to the first signal includes controlling the first BMS node controller to limit a maximum state of charge of the one or more first electrochemical cells in response to a temperature of the one or more first electrochemical cells exceeding a threshold value, to mitigate the impedance growth on the respective cathodes of the one or more first electrochemical cells.

In another embodiment of the first aspect, (1) each first electrochemical cell of the one or more first electrochemical cells is a Lithium-ion electrochemical cell, (2) the one or more degradation mechanisms of the first cell assembly include impedance growth on respective cathodes of the one or more first electrochemical cells, and (3) controlling the first BMS node controller in response to the first signal includes controlling the first BMS node controller to limit de-lithiation of the respective cathodes of the one or more first electrochemical cells, to mitigate the impedance growth on the respective cathodes of the one or more first electrochemical cells.

In another embodiment of the first aspect, (1) each first electrochemical cell of the one or more first electrochemical cells is a Lithium-ion electrochemical cell, (2) the one or more degradation mechanisms of the first cell assembly include impedance growth on respective cathodes of the one or more first electrochemical cells, and (3) controlling the first BMS node controller in response to the first signal includes controlling the first BMS node controller to limit a rate of charge or discharge of the one or more first electrochemical cells to a value that is a function of impedance of the respective cathodes of the one or more first electrochemical cells, in response to a Lithium concentration at the respective cathodes of the one or more first electrochemical cells being below a threshold value, to mitigate the impedance growth on the respective cathodes of the one or more first electrochemical cells.

In another embodiment of the first aspect, (1) each first electrochemical cell of the one or more first electrochemical cells is a Lithium-ion electrochemical cell, (2) the one or more degradation mechanisms of the first cell assembly include impedance growth on respective cathodes of the one or more first electrochemical cells, and (3) controlling the first BMS node controller in response to the first signal includes controlling the first BMS node controller to limit a rate of charge or discharge of the one or more first electrochemical cells to a value that is a function of impedance of the respective cathodes of the one or more first electrochemical cells, in response to respective cathode potentials of the one or more first electrochemical cells being above a threshold value, to the mitigate impedance growth on the respective cathodes of the one or more first electrochemical cells.

In another embodiment of the first aspect, (1) each first electrochemical cell of the one or more first electrochemical cells is a Lithium-ion electrochemical cell, (2) the one or more degradation mechanisms of the first cell assembly include loss of active material on respective anodes of the one or more first electrochemical cells, and (3) controlling the first BMS node controller in response to the first signal includes controlling the first BMS node controller to control a rate of charge or discharge of the one or more first electrochemical cells as a function of the loss of active material on the respective anodes of the one or more first electrochemical cells, to mitigate the loss of active material on the respective anodes of the one or more first electrochemical cells.

In another embodiment of the first aspect, (1) each first electrochemical cell of the one or more first electrochemical cells is a Lithium-ion electrochemical cell, (2) the one or more degradation mechanisms of the first cell assembly include loss of active material on respective graphite anodes of the one or more first electrochemical cells, and (3) controlling the first BMS node controller in response to the first signal includes controlling the first BMS node controller to limit a rate of charge or discharge of the one or more first electrochemical cells to a predetermined value in response to the one or more first electrochemical cells transitioning between intercalation stages of their respective graphite anodes, to mitigate the loss of active material on the respective graphite anodes of the one or more first electrochemical cells.

In another embodiment of the first aspect, (1) each first electrochemical cell of the one or more first electrochemical cells is a Lithium-ion electrochemical cell, (2) the one or more degradation mechanisms of the first cell assembly include loss of active material on respective graphite anodes of the one or more first electrochemical cells, and (3) controlling the first BMS node controller in response to the first signal includes controlling the first BMS node controller to limit loss of Lithium on the respective graphite anodes of the one or more first electrochemical cells when the one or more first electrochemical cells transition between intercalation stages of their respective graphite anodes, to mitigate the loss of active material on the respective graphite anodes of the one or more first electrochemical cells.

In another embodiment of the first aspect, (1) each first electrochemical cell of the one or more first electrochemical cells is a Lithium-ion electrochemical cell, (2) the one or more degradation mechanisms of the first cell assembly include loss of active material on respective Silicon anodes of the one or more first electrochemical cells, and (3) controlling the first BMS node controller in response to the first signal includes controlling the first BMS node controller to limit a loss of Lithium on the respective Silicon anodes of the one or more first electrochemical cells to one or more predetermined values during a first intercalation stage and a third intercalation stage of the respective Silicon anodes of the one or more first electrochemical cells, to mitigate the loss of active material on the respective Silicon anodes of the one or more first electrochemical cells.

In another embodiment of the first aspect, (1) each first electrochemical cell of the one or more first electrochemical cells is a Lithium-ion electrochemical cell, (2) the one or more degradation mechanisms of the first cell assembly include loss of active material on respective anodes of the one or more first electrochemical cells, (3) controlling the first BMS node controller in response to the first signal includes controlling the first BMS node controller to limit a charge rate of the one or more first electrochemical cells during a first intercalation stage of the respective anodes of the one or more first electrochemical cells, to mitigate the loss of active material on the respective anodes of the one or more first electrochemical cells.

In another embodiment of the first aspect, (1) each first electrochemical cell of the one or more first electrochemical cells is a Lithium-ion electrochemical cell, (2) the one or more degradation mechanisms of the first cell assembly include loss of active material on respective cathodes of the one or more first electrochemical cells, and (3) controlling the first BMS node controller in response to the first signal includes controlling the first BMS node controller to control a rate of charge or discharge of the one or more first electrochemical cells as a function of the loss of active material on the respective cathodes of the one or more first electrochemical cells, to mitigate the loss of active material on the respective cathodes of the one or more first electrochemical cells.

In another embodiment of the first aspect, (1) each first electrochemical cell of the one or more first electrochemical cells is a Lithium-ion electrochemical cell, (2) the one or more degradation mechanisms of the first cell assembly include loss of active material on respective cathodes of the one or more first electrochemical cells, and (3) controlling the first BMS node controller in response to the first signal includes controlling the first BMS node controller to limit a rate of charge or discharge of the one or more first electrochemical cells in response to lithiation levels on surfaces of the respective cathodes of the one or more first electrochemical cells being below a threshold value, to mitigate the loss of active material on the respective cathodes of the one or more first electrochemical cells.

In another embodiment of the first aspect, (1) each first electrochemical cell of the one or more first electrochemical cells is a Lithium-ion electrochemical cell, (2) the one or more degradation mechanisms of the first cell assembly include loss of active material on respective cathodes of the one or more first electrochemical cells, and (3) controlling the first BMS node controller in response to the first signal includes controlling the first BMS node controller to limit a lithiation level of the respective cathodes of the one or more first electrochemical cells during a first intercalation stage and a third intercalation stage of the respective cathodes of the one or more first electrochemical cells, to mitigate the loss of active material on the respective cathodes of the one or more first electrochemical cells.

In another embodiment of the first aspect, (1) each first electrochemical cell of the one or more first electrochemical cells is a Lithium-ion electrochemical cell, (2) the one or more degradation mechanisms of the first cell assembly include loss of active material on respective cathodes of the one or more first electrochemical cells, and (3) controlling the first BMS node controller in response to the first signal includes controlling the first BMS node controller to reduce a charge or discharge rate of the one or more first electrochemical cells during a first intercalation stage and a third intercalation stage of the respective cathodes of the one or more first electrochemical cells, to mitigate the loss of active material on the respective cathodes of the one or more first electrochemical cells.

In a second aspect, a method for adaptive electrochemical cell management in an energy storage system including a plurality of battery management system (BMS) nodes includes the following steps: (1) obtaining a first signal identifying one or more hazardous failure mechanisms of a first cell assembly of a first BMS node of the plurality of BMS nodes, the first cell assembly including one or more first electrochemical cells, and (2) controlling a first BMS node controller of the first BMS node in response to the first signal, to change a state of operation of the first cell assembly to mitigate the one or more hazardous failure mechanisms of the first cell assembly, independently of operation of a second BMS node of the plurality of BMS nodes.

In an embodiment of the second aspect, controlling the first BMS node controller in response to the first signal includes (1) determining a desired change in state of operation of the first cell assembly to mitigate the one or more hazardous failure mechanisms of the first cell assembly and (2) controlling the first BMS node controller to achieve the desired change in state of operation of the first cell assembly.

In another embodiment of the second aspect, the one or more hazardous failure mechanisms of the first cell assembly include one or more of metallic plating on respective electrodes of the one or more first electrochemical cells, mechanical shorting in the one or more first electrochemical cells, and gas evolution in the one or more first electrochemical cells.

In another embodiment of the second aspect, the method further includes controlling a third BMS node controller of a third BMS node of the plurality of BMS nodes to at least partially compensate for the change in the state of operation of the first cell assembly, such that a power contribution of the energy storage system does not change in response to the change in the state of operation of the first cell assembly.

In another embodiment of the second aspect, the one or more first electrochemical cells consist of a single first electrochemical cell.

In another embodiment of the second aspect, the one or more first electrochemical cells include a plurality of first electrochemical cells electrically coupled together.

In another embodiment of the second aspect, (1) each first electrochemical cell of the one or more first electrochemical cells is a Lithium-ion electrochemical cell, (2) the one or more hazardous failure mechanisms of the first cell assembly include metallic plating on respective electrodes of the one or more first electrochemical cells, and (3) controlling the first BMS node controller in response to the first signal includes controlling the first BMS node controller to decrease a charge or discharge rate of the one or more first electrochemical cells in response to a state of charge of the one or more first electrochemical cells exceeding a threshold value, to mitigate the metallic plating on the respective electrodes of the one or more first electrochemical cells.

In another embodiment of the second aspect, (1) each first electrochemical cell of the one or more first electrochemical cells is a Lithium-ion electrochemical cell, (2) the one or more hazardous failure mechanisms of the first cell assembly include metallic plating on respective electrodes of the one or more first electrochemical cells, and (3) controlling the first BMS node controller in response to the first signal includes controlling the first BMS node controller to decrease a maximum permissible state of charge of the one or more first electrochemical cells so that the one or more first electrochemical cells do not operate in a third intercalation stage of respective graphite anodes of the one or more first electrochemical cells, to mitigate the metallic plating on the respective electrodes of the one or more first electrochemical cells.

In another embodiment of the second aspect, (1) each first electrochemical cell of the one or more first electrochemical cells is a Lithium-ion electrochemical cell, (2) the one or more hazardous failure mechanisms of the first cell assembly include metallic plating on respective electrodes of the one or more first electrochemical cells, and (3) controlling the first BMS node controller in response to the first signal includes controlling the first BMS node controller to regulate a charge or discharge rate of the one or more first electrochemical cells based at least in part on a graphite anode-level impedance of the one or more first electrochemical cells, to mitigate the metallic plating on the respective electrodes of the one or more first electrochemical cells.

In another embodiment of the second aspect, (1) each first electrochemical cell of the one or more first electrochemical cells is a Lithium-ion electrochemical cell, (2) the one or more hazardous failure mechanisms of the first cell assembly include metallic plating on respective electrodes of the one or more first electrochemical cells, and (3) controlling the first BMS node controller in response to the first signal includes controlling the first BMS node controller to increase a discharge rate of the one or more first electrochemical cells to strip the metallic plating on the respective electrodes of the one or more first electrochemical cells.

In another embodiment of the second aspect, (1) each first electrochemical cell of the one or more first electrochemical cells is a Lithium-ion electrochemical cell, (2) the one or more hazardous failure mechanisms of the first cell assembly include mechanical shorting in the one or more first electrochemical cells, and (3) controlling the first BMS node controller in response to the first signal includes controlling the first BMS node controller to modulate a charge rate or a discharge rate of the one or more first electrochemical cells as a function of state of charge of the one or more first electrochemical cells, to mitigate the mechanical shorting in the one or more first electrochemical cells.

In another embodiment of the second aspect, (1) each first electrochemical cell of the one or more first electrochemical cells is a Lithium-ion electrochemical cell including an anode with Silicon, (2) the one or more hazardous failure mechanisms of the first cell assembly include mechanical shorting in the one or more first electrochemical cells, and (3) controlling the first BMS node controller in response to the first signal includes controlling the first BMS node controller to cause a state of charge of the one or more first electrochemical cells to remain above a predetermined minimum value, to mitigate the mechanical shorting in the one or more first electrochemical cells.

In another embodiment of the second aspect, (1) each first electrochemical cell of the one or more first electrochemical cells is a Lithium-ion electrochemical cell, (2) the one or more hazardous failure mechanisms of the first cell assembly include mechanical shorting in the one or more first electrochemical cells, and (3) controlling the first BMS node controller in response to the first signal includes controlling the first BMS node controller to cause the one or more first electrochemical cells to operate solely in a third intercalation stage of respective graphite anodes of the one or more first electrochemical cells, to mitigate the mechanical shorting in the one or more first electrochemical cells.

In another embodiment of the second aspect, (1) each first electrochemical cell of the one or more first electrochemical cells is a Lithium-ion electrochemical cell, (2) the one or more hazardous failure mechanisms of the first cell assembly include gas evolution in the one or more first electrochemical cells, and (3) controlling the first BMS node controller in response to the first signal includes controlling the first BMS node controller to reduce a state of charge of the one or more first electrochemical cells, as a function of (a) gas evolution in the one or more first electrochemical cells and (b) temperature of the one or more first electrochemical cells.

In another embodiment of the second aspect, the method further includes controlling the first BMS node controller to reduce a maximum permissible state of charge of the one or more first electrochemical cells in response to a temperature of the one or more first electrochemical cells exceeding a threshold value.

In a third aspect, a method for adaptive electrochemical cell management in an energy storage system including a plurality of battery management system (BMS) nodes includes the following steps: (1) obtaining a first signal identifying metallic plating on respective electrodes of one or more Lithium-ion electrochemical cells included in a first BMS node of the plurality of BMS nodes, (2) controlling a first BMS node controller of the first BMS node in response to the first signal to increase rate of discharge of the one or more Lithium-ion electrochemical cells, independently of operation of a second BMS node of the plurality of BMS nodes, to strip the metallic plating on the respective electrodes of the one or more Lithium-ion electrochemical cells, and (3) controlling the first BMS node controller to decrease rate of discharge of the one or more Lithium-ion electrochemical cells, in response to a temperature of the one or more Lithium-ion electrochemical cells exceeding a threshold value.

In an embodiment of the third aspect, the one or more Lithium-ion electrochemical cells consist of a single Lithium-ion electrochemical cell.

In another embodiment of the third aspect, the one or more Lithium-ion electrochemical cells include a plurality of Lithium-ion electrochemical cells electrically coupled together.

In a fourth aspect, a method for adaptive electrochemical cell management in an energy storage system including a plurality of battery management system (BMS) nodes includes the following steps: (1) obtaining a first signal identifying mechanical shorting in one or more Lithium-ion electrochemical cells included in a first BMS node of the plurality of BMS nodes, (2) controlling a first BMS node controller of the first BMS node in response to the first signal to increase rate of discharge of the one or more Lithium-ion electrochemical cells, independently of operation of a second BMS node of the plurality of BMS nodes, to discharge the one or more Lithium-ion electrochemical cells, and (3) in response to a state of charge of the one or more Lithium-ion electrochemical cells falling below a predetermined value, bypassing the one or more Lithium-ion electrochemical cells such that electric current flows through the energy storage system without flowing through the one or more Lithium-ion electrochemical cells.

In an embodiment of the fourth aspect, the predetermined value ranges from 75 percent to 85 percent state of charge of the one or more Lithium-ion electrochemical cells.

In another embodiment of the fourth aspect, the one or more Lithium-ion electrochemical cells consist of a single Lithium-ion electrochemical cell.

In another embodiment of the fourth aspect, the one or more Lithium-ion electrochemical cells include a plurality of Lithium-ion electrochemical cells electrically coupled together.

In a fifth aspect, a method for adaptive electrochemical cell management in an energy storage system including a plurality of battery management system (BMS) nodes includes (1) obtaining a first signal identifying gas evolution in one or more Lithium-ion electrochemical cells included in a first BMS node of the plurality of BMS nodes, (2) controlling a first BMS node controller of the first BMS node in response to the first signal to increase rate of discharge of the first BMS node, independently of operation of a second BMS node of the plurality of BMS nodes, to discharge the one or more Lithium-ion electrochemical cells, and (3) in response to a state of charge of the one or more Lithium-ion electrochemical cells falling below a predetermined value, controlling the first BMS node controller to decrease a rate of discharge of the one or more Lithium-ion electrochemical cells.

In an embodiment of the fifth aspect, the method further includes bypassing the one or more Lithium-ion electrochemical cells such that electric current flows through the energy storage system without flowing through the one or more Lithium-ion electrochemical cells, in response to the one or more Lithium-ion electrochemical cells being discharged.

In another embodiment of the fifth aspect, the predetermined value ranges from 75 percent to 85 percent state of charge of the one or more Lithium-ion electrochemical cells.

In another embodiment of the fifth aspect, the one or more Lithium-ion electrochemical cells consist of a single Lithium-ion electrochemical cell.

In another embodiment of the fifth aspect, the one or more Lithium-ion electrochemical cells include a plurality of Lithium-ion electrochemical cells electrically coupled together.

In a sixth aspect, a method for adaptive electrochemical cell management in an energy storage system including a plurality of cell assemblies, where each cell assembly includes one or more electrochemical cells, includes the following steps: (1) determining a respective desired power contribution of each cell assembly at least partially to maximize collective energy throughput of the energy storage system, (2) controlling a respective battery management system (BMS) node controller for each cell assembly, to achieve the desired power contribution of the cell assembly, and (3) controlling the respective BMS node controller for each cell assembly to achieve a predetermined characteristic of the plurality of cell assemblies.

In an embodiment of the sixth aspect, the predetermined characteristic of the plurality of cell assemblies includes a common state of degradation for the plurality of cell assemblies.

In another embodiment of the sixth aspect, the common state of degradation for the plurality of cell assemblies is defined by a degradation mechanism vector.

In another embodiment of the sixth aspect, the predetermined characteristic of the plurality of cell assemblies includes a common state of health for the plurality of cell assemblies.

In another embodiment of the sixth aspect, the common state of health for the plurality of cell assemblies includes a common capacity loss for the plurality of cell assemblies and a common impedance growth for the plurality of cell assemblies.

In a seventh aspect, a method for mitigating degradation in an energy storage system including a plurality of cell assemblies, where each cell assembly includes one or more electrochemical cells, includes the following steps: (1) selecting a first cell assembly of the plurality of cell assemblies for preventative discharge, (2) in response to the first cell assembly being selected for preventative discharge, (a) increasing a respective power contribution of the first cell assembly, and (b) decreasing respective power contributions of at least one cell assembly of the plurality of cell assemblies, other than the first cell assembly.

In an embodiment of the seventh aspect, the method further includes (1) returning the first cell assembly to normal operation, (2) selecting a second cell assembly of the plurality of cell assemblies for preventative discharge, and (3) in response to the second cell assembly being selected for preventative discharge: (a) increasing a respective power contribution of the second cell assembly, and (b) decreasing respective power contributions of at least one cell assembly of the plurality of cell assemblies other than the second cell assembly.

In another embodiment of the seventh aspect, the method further includes periodically selecting the first cell assembly for preventative discharge.

In another embodiment of the seventh aspect, the method further includes selecting the first cell assembly for preventative discharge in response to beginning of discharge of the plurality of cell assemblies.

In another embodiment of the seventh aspect, the method further includes selecting the first cell assembly for preventative discharge in response to a signal indicating an anomaly in the first cell assembly.

In another embodiment of the seventh aspect, the anomaly in the first cell assembly includes metallic plating on respective electrodes of the one or more electrochemical cells of the first cell assembly crossing a threshold value.

In another embodiment of the seventh aspect, the method further includes setting respective power contributions of the plurality of cell assemblies such that a bus voltage collectively generated by the plurality of cell assemblies does not substantially change in response to the first cell assembly being selected for preventative discharge.

In another embodiment of the seventh aspect, the method further includes controlling a respective battery management system (BMS) node controller for each cell assembly to achieve the respective power contribution of each cell assembly.

In another embodiment of the seventh aspect, each cell assembly includes solely a single electrochemical cell.

In another embodiment of the seventh aspect, each cell assembly includes a plurality of electrochemical cells electrically coupled together.

In an eighth aspect, method for mitigating degradation in a plurality of cell assemblies, where each cell assembly including one or more electrochemical cells, includes the following steps (1) determining a respective operating characteristic of each cell assembly, (2) determining a duration of a respective rest period for each cell assembly at least partially based on the respective operating characteristic of the cell assembly, and (3) controlling a respective battery management system (BMS) node controller for each cell assembly according to the duration of the respective rest period for the cell assembly, such that current does not flow through the cell assembly during its respective rest period.

In an embodiment of the eighth aspect, the respective operating characteristic for each cell assembly includes a state of degradation of the cell assembly.

In another embodiment of the eighth aspect, the method further includes (1) determining a respective desired state of charge for resting each cell assembly and (2) controlling the respective BMS node controller for each cell assembly such that the cell assembly enters its rest period with a state of charge corresponding to its respective desired state of charge.

In another embodiment of the eighth aspect, determining the respective desired state of charge for resting each cell assembly includes determining the respective desired state of charge at least partially based on temperature of the cell assembly.

In another embodiment of the eighth aspect, each cell assembly includes solely a single electrochemical cell.

In another embodiment of the eighth aspect, each cell assembly includes a plurality of electrochemical cells that are electrically coupled together.

In a ninth aspect, a method for adaptive electrochemical cell management in an energy storage system including at least a first battery management system (BMS) node, where the first BMS node including a first BMS node controller and a first cell assembly, includes the following steps: (1) controlling the first BMS node controller to reduce one of a charge rate of the first cell assembly and a discharge rate of the first cell assembly, in response to the first cell assembly transitioning between two anode intercalation stages, and (2) controlling the first BMS node controller to increase one of the charge rate of the first cell assembly and the discharge rate of the first cell assembly, in response to the first cell assembly completing the transition between the two anode intercalation stages.

In an embodiment of the ninth aspect, the first cell assembly includes one or more Lithium-ion electrochemical cells.

In another embodiment of the ninth aspect, the two anode intercalation stages include an intercalation stage 1 and an intercalation stage 2.

In another embodiment of the ninth aspect, the energy storage system further includes a second BMS node, the second BMS node includes a second BMS node controller and a second cell assembly, and the method further includes controlling at least the second BMS node controller to cause the second cell assembly to transition between the two anode intercalation stages at a different time than the first cell assembly.

In another embodiment of the ninth aspect, the method further includes controlling the second BMS node controller to reduce one of a charge rate of the second cell assembly and a discharge rate of the second cell assembly, in response to the second cell assembly transitioning between the two anode intercalation stages.

In another embodiment of the ninth aspect, the method further includes reducing one of the charge rate of the first cell assembly and the discharge rate of the first cell assembly, in response to the first cell assembly transitioning between the two anode intercalation stages, without affecting operation of a second cell assembly included in a second BMS node of the energy storage system.

In another embodiment of the ninth aspect, the energy storage system further includes a second BMS node, the second BMS node includes a second BMS node controller and a second cell assembly, and the method further includes controlling the second BMS node controller to change one of a charge rate of the second cell assembly and a discharge rate of the second cell assembly, to compensate for reducing the one of the charge rate of the first cell assembly and the discharge rate of the first cell assembly, in response to the first cell assembly transitioning between the two anode intercalation stages.

BRIEF DESCRIPTION OF THE DRAWINGS

FIG. 19 is a flow chart of a method for adaptive electrochemical cell management in an energy storage system including a plurality of BMS nodes for mitigating one or more electrochemical cell hazardous failure mechanisms, according to an embodiment.

FIG. 21 is a flow chart of a method for adaptively managing an energy storage system of a plurality of battery management nodes that are electrically coupled together for mitigating one or more electrochemical cell hazardous failure mechanisms, according to an embodiment.

DETAILED DESCRIPTION OF THE EMBODIMENTS

Disclosed herein are systems and methods for adaptive electrochemical cell management which significantly advance the state of the start. Certain embodiments of the new systems and methods advantageously help achieve greater electrochemical cell throughput, greater electrochemical cell lifetime, and/or greater electrochemical cell safety, than what is feasible when using conventional electrochemical cell management practices. For example, some embodiments are configured to identify one or more electrochemical cell degradation or failure mechanisms and manage electrochemical cell operation to minimize the degradation or failure mechanisms. In this document, the term "substantially" means within ten percent. For example, X is considered substantially equal to Y if X is greater than or equal to 90 percent of Y and less than or equal to 110 percent of Y.

Figure 1:
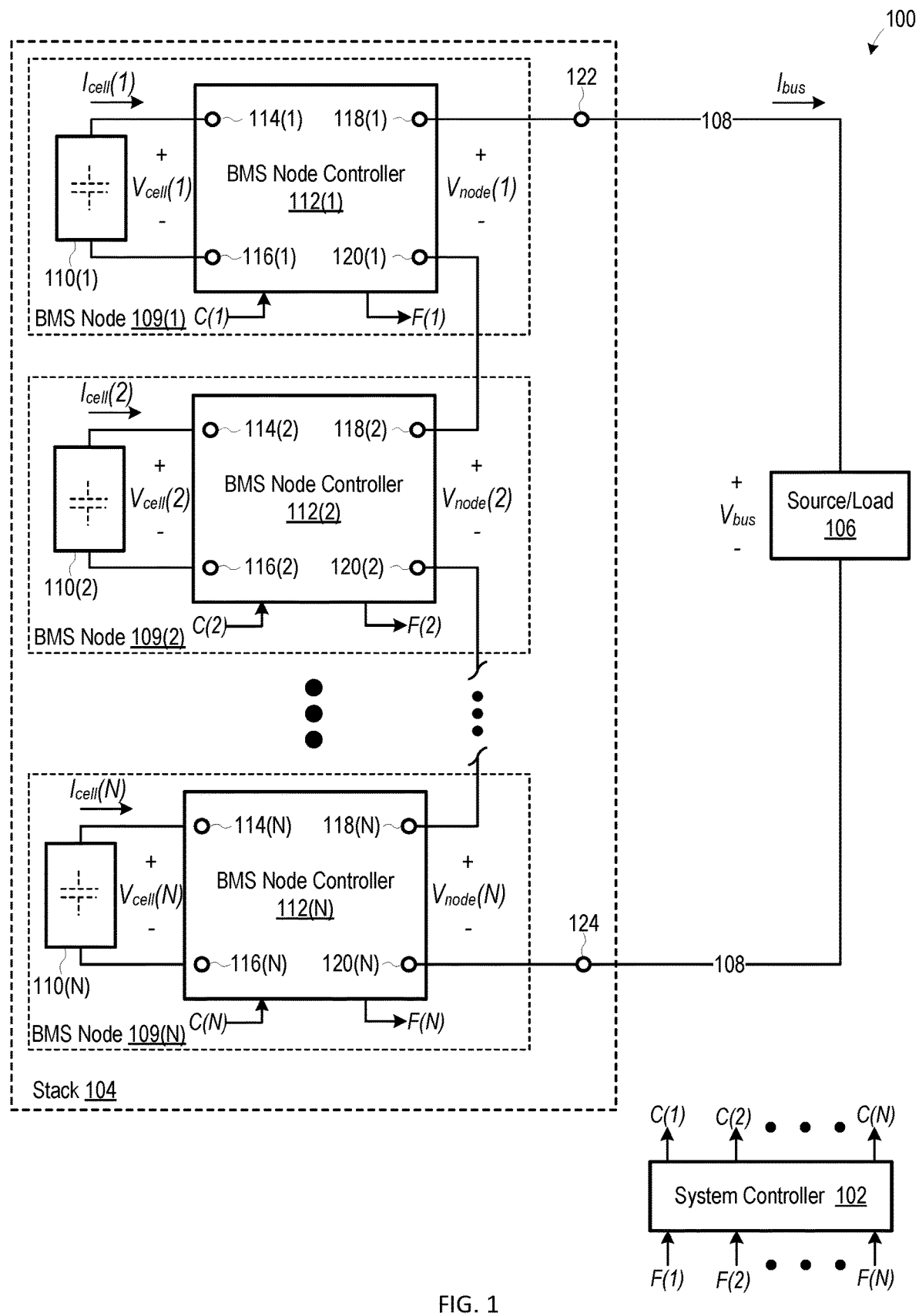
FIG. 1 is a schematic diagram of an energy storage system including a stack of battery management system (BMS) nodes, according to an embodiment.

FIG. 1 is a schematic diagram of an energy storage system 100, which is one embodiment of the new systems for adaptive electrochemical cell management. Energy storage system 100 includes a system controller 102, a stack 104, a source/load 106, and an electric power bus 108. Source/load 106 can operate as either an electric power source or as a load. Source/load 106 provides electric power to stack 104 when source/load 106 operates as an electric power source, and source/load 106 consumes electric power from stack 104 when source/load 106 operates as a load. In some embodiments, source/load 106 is an inverter which interfaces energy storage system 100 with an alternating current (AC) electric power system (not shown). In some other embodiments, source/load 106 is a direct current-to-direct current (DC-to-DC) converter which interfaces energy storage system 100 with a direct current (DC) electric power system (not shown). In certain additional embodiments, source/load 106 is an electromechanical device, e.g. a combination motor and generator, that can generate electric power as well as consume electric power. In yet some other embodiments, source/load 106 is a critical load, and energy storage system 100 is configured as an uninterruptable power supply (UPS) to power the critical load in case of failure of a primary power source for the critical load. In certain additional embodiments, source/load 106 is another system capable of supplying and/or consuming electric power from energy storage system 100. However, source/load 106 can take other forms without departing from the scope hereof.

Stack 104 includes N battery management system (BMS) nodes 109, where N is an integer that is greater than or equal to one. In this document, specific instances of an item may be referred to by use of a numeral in parentheses (e.g. BMS node 109(1)) while numerals without parentheses refer to any such item (e.g. BMS nodes 109). Each BMS node 109 includes a respective cell assembly 110 and a respective BMS node controller 112. Each cell assembly 110 is electrically coupled to input ports 114 and 116 of a respective BMS node controller 112. Output ports 118 and 120 of BMS node controllers 112 are electrically coupled in series between stack ports 122 and 124. Specifically, output port 120(1) of BMS node controller 112(1) is electrically coupled to output port 118(2) of BMS node controller 112(2), output port 120(2) of BMS node controller 112(2) is electrically coupled to output port 118(3) of BMS node controller 112(3) (not explicitly shown in FIG. 1), and so on. Output port 118(1) of BMS node controller 112(1) is electrically coupled to stack port 122, and output port 120(N) of BMS node controller 112(N) is electrically coupled to stack port 124. Electric power bus 108 electrically couples stack ports 122 and 124 to source/load 106.

Figure 2:
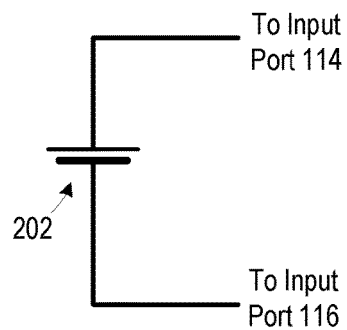
FIG. 2 is a schematic diagram of a cell assembly including a single electrochemical cell.
Figure 3:
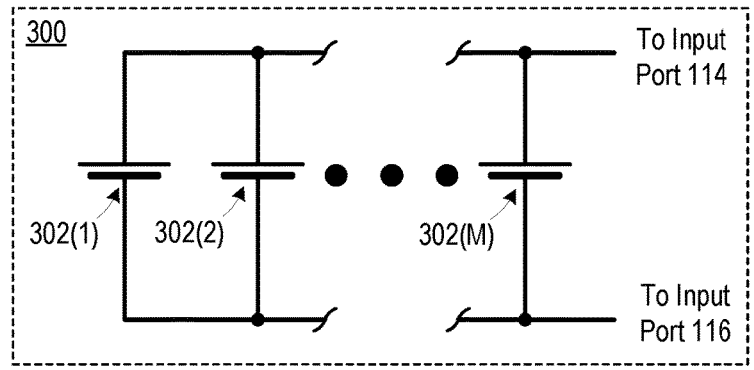
FIG. 3 is a schematic diagram of a cell assembly including a plurality of electrochemical cells electrically coupled in parallel.
Figure 4:
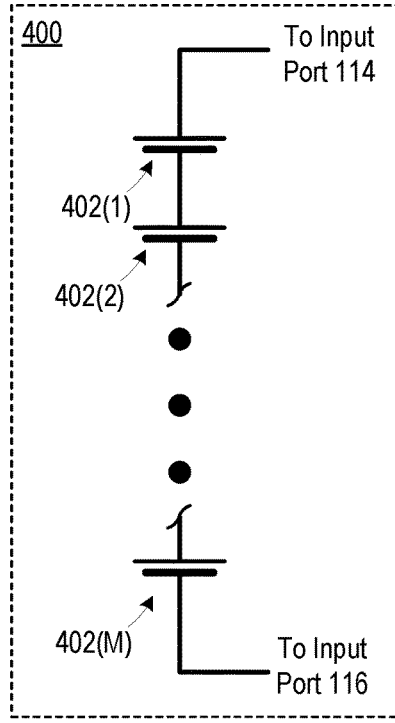
FIG. 4 is a schematic diagram of a cell assembly including a plurality of electrochemical cells electrically coupled in series.
Figure 5:
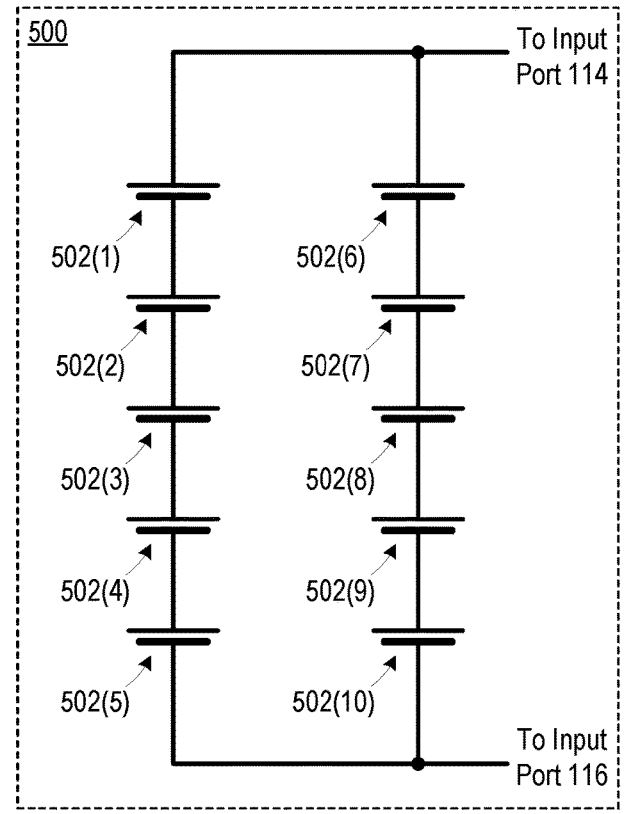
FIG. 5 is a schematic diagram of a cell assembly including a plurality of electrochemical cells electrically coupled in a series/parallel combination.

Each cell assembly 110 includes one or more electrochemical cells electrically coupled in series and/or parallel between input ports 114 and 116 of a respective BMS node controller 112. For example, FIGS. 2-5 are schematic diagrams of possible embodiments of a cell assembly 110, although cell assemblies 110 are not limited to these embodiments. FIG. 2 is a schematic diagram of an electrochemical cell 202, which is an embodiment of a cell assembly 110 where the cell assembly 110 includes solely a single electrochemical cell, which is electrically coupled across input ports 114 and 116. FIGS. 3-5, in contrast, are schematic diagrams of embodiments of a cell assembly 110 where the cell assembly includes a plurality of electrochemical cells that are electrically coupled across input ports 114 and 116. Specifically, FIG. 3 is a schematic diagram of a cell assembly 300 including M electrochemical cells 302 electrically coupled in parallel across input ports 114 and 116, and FIG. 4 is a schematic diagram of a cell assembly 400 including M electrochemical cells 402 electrically coupled in series across input ports 114 and 116, where M is an integer greater than one. FIG. 5 is a schematic diagram of a cell assembly 500 including a plurality of electrochemical cells 502 electrically coupled in a series/parallel combination across input ports 114 and 116. In some embodiments, electrochemical cells 202, 302, 402, and 502 are Lithium-ion (Li-ion) electrochemical cells, e.g. LCO electrochemical cells, LMO electrochemical cells, NMC electrochemical cells, LFP electrochemical cells, NCA electrochemical cells, or LTO electrochemical cells. However, electrochemical cells 202, 302, 402, and 502 can be other types of electrochemical cells, including future-developed electrochemical cells, without departing from the scope hereof. The electrochemical cells of cell assemblies 110 may collectively form one or more batteries of energy storage system 100.

Referring again to FIG. 1, system controller 102 is configured to generate a respective control signal C for each BMS node controller 112, to enable system controller 102 to control operation of BMS node controllers 112. Additionally, system controller 102 is optionally configured to receive a respective feedback signal F from each BMS node controller 112. In some embodiments, each feedback signal F specifies, for its respective BMS node controller 112 and associated cell assembly 110, one or more of (a) voltage $V_{cell}$ across cell assembly 110, (b) current $I_{cell}$ flowing through cell assembly 110 between input ports 114 and 116, (c) voltage $V_{node}$ across the BMS node controller 112's output ports 118 and 120, (d) current $I_{bus}$ flowing through the BMS node controller 112's output ports 118 and 120, (e) temperature of cell assembly 110, and (f) state-of-charge of cell assembly 110.

Signals C and F are communicated between system controller 102 and BMS node controllers 112, for example, via one or more electrical conductors (not shown), one or more optical conductors (not shown), and/or one or more wireless transceivers (not shown). Although system controller 102 is illustrated as being a discrete element, system controller 102 could be at least partially incorporated in one or more cell assemblies 110 and/or one or more BMS node controllers 112. Additionally, system controller 102 could be formed of multiple constituent elements which need not be co-packaged or even disposed at a common location. For example, in certain embodiments, at least some elements of system controller 102 are embodied by a distributed computing system, e.g. a "cloud" computing system, such as discussed below with respect to FIG. 7. As another example, in some embodiments, elements of system controller 102 are distributed among one or more stack controllers (not shown) and a central host controller (not shown), of energy storage system 100.

Figure 6:
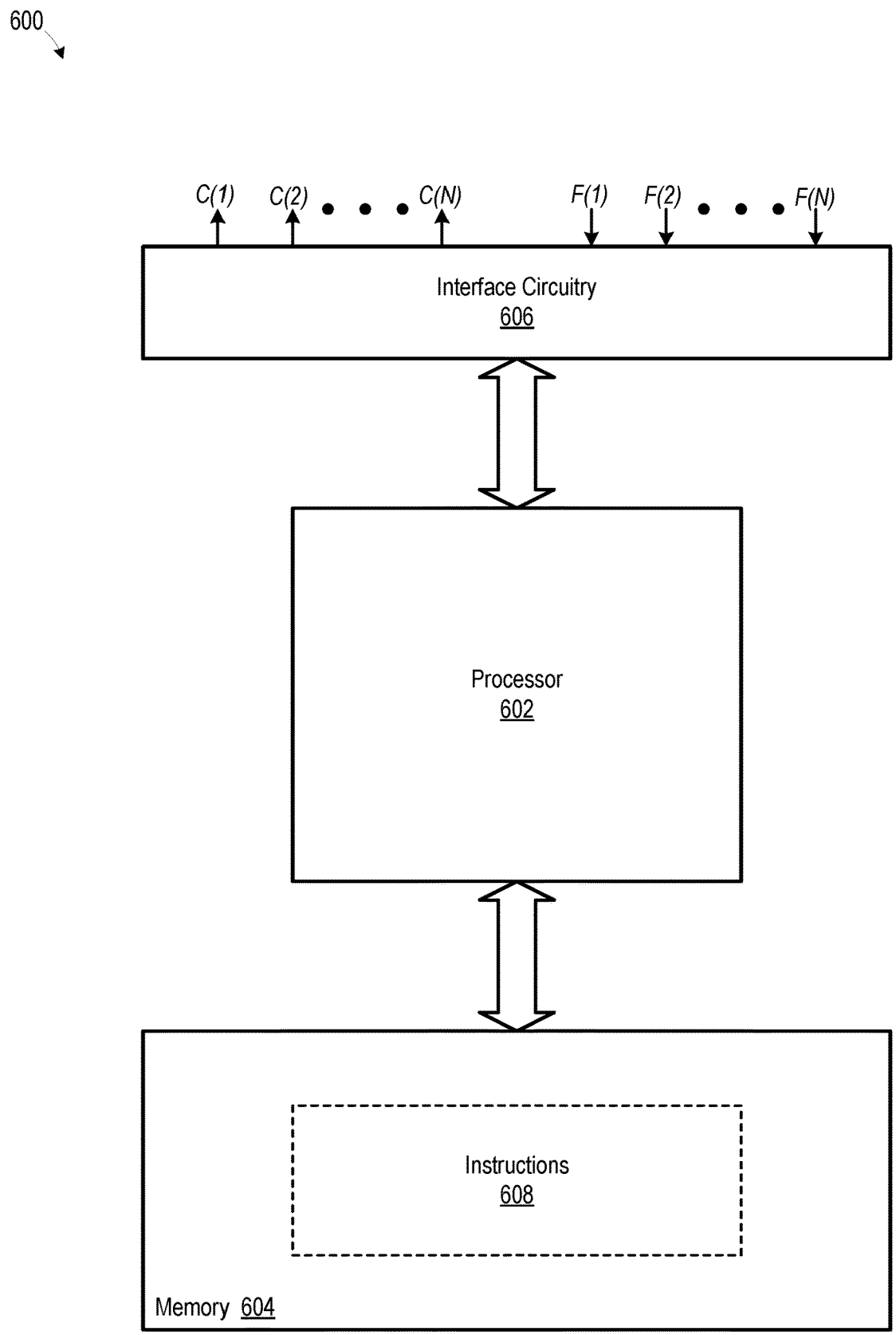
FIG. 6 is a schematic diagram of one embodiment of a system controller of the FIG. 1 energy storage system.

FIG. 6 is a schematic diagram of a system controller 600, which is one possible embodiment of system controller 102. System controller 600 includes a processor 602, a memory 604, and interface circuitry 606. Processor 602 is communicatively coupled to each of memory 604 and interface circuitry 606, and processor 602 is configured to execute instructions 608, e.g. in the form of software and/or firmware, stored in memory 604, to generate control signals C at least partially in response to feedback signals F received from BMS node controllers 112. In some embodiments, system controller 600 is further configured to receive instructions and/or data from an external source, such as a battery data processing engine (not shown) remote from energy storage system 100. The battery data processing engine, for example, provides instructions to processor 602 to control at least some aspects of energy storage system 100 based on prior experience with other energy storage systems having on or more common traits with energy storage system 100.

Interface circuitry 606 interfaces processor 602 with one or more communication mediums (not shown) for transmitting signals C and F between system controller 600 and BMS node controllers 112. In some embodiments, interface circuitry 606 includes one or more electrical transceivers, optical transceivers, and/or wireless transceivers. System controller 600 could include one or more additional processors and/or memories, and the elements of system controller 600 need not be co-packaged or even disposed at a common location. Additionally, system controller 600 could be modified to replace processor 602 and memory 604 with analog and/or digital circuitry which performs the same functions as processor 602 and memory 604.

Figure 7:
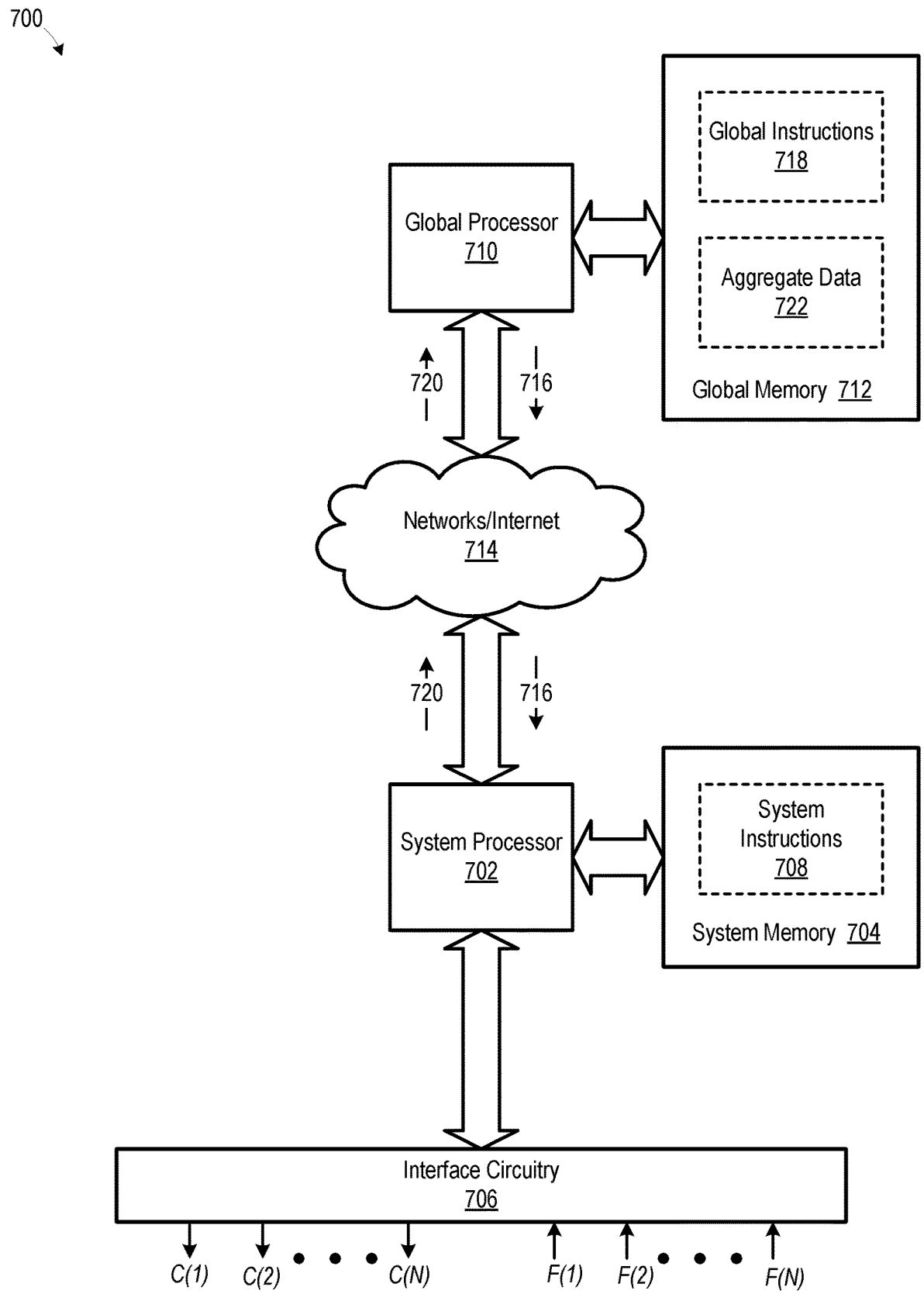
FIG. 7 is a schematic diagram of another embodiment of a system controller of the FIG. 1 energy storage system.

FIG. 7 is a schematic diagram of a system controller 700, which is another possible embodiment of system controller 102. System controller 700 includes a system processor 702, a system memory 704, and interface circuitry 706 disposed at or near stack 104. System controller 700 further includes a global processor 710 and a global memory 712 remote from stack 104. Although each of global processor 710 and global memory 712 are depicted as a single element, one or more of global processor 710 and global memory 712 may include multiple sub-elements which need not be disposed at a common location. For example, in some embodiments, global processor 710 and global memory 712 are implemented in a distributed computing environment. Networks/Internet 714 communicatively couple system processor 702 and global processor 710, and networks/Internet 714 need not be part of system controller 700. Additionally, global processor 710 and global memory 712 may be shared by one or more energy storage systems in addition to energy storage system 100, such that global processor 710 and global memory 712 are effectively part of a system controller of one or more additional energy storage systems.

System processor 702 is communicatively coupled to each of system memory 704 and interface circuitry 706, and system processor 702 is configured to execute instructions 708, e.g. in the form of software and/or firmware, stored in system memory 704, to generate control signals C at least partially in response to feedback signals F received from BMS node controllers 112 and instructions/data 716 received from global processor 710. Interface circuitry 706 is analogous to interface circuitry 606 of FIG. 6.

Global processor 710 is configured to execute instructions 718, in the form of software and/or firmware, stored in global memory 712 to perform one or more of the following functions. In some embodiments, global processor 710 is configured to receive system data 720 from system processor 702, where system data 720 represents one or more aspects of energy storage system 100. System processor 702 is configured to determine system data 720, for example, at least partially based on feedback signals F from BMS node controllers 112. By way of example and not limitation, system data 720 may include cell assembly 110 temperature, cell assembly voltage $V_{cell}$, cell assembly current $I_{cell}$, the type of electrochemical cells of cell assemblies 110 in energy storage system 100, the configuration of cell assemblies 110 in energy storage system 100, manufacturing information for cell assemblies 110 in energy storage system 100, operating history of cell assemblies 110 in energy storage system 100, maintenance history of cell assemblies 110 in energy storage system 100, etc. System data 720 is optionally encrypted, compressed, and/or preprocessed (e.g., identifying various degradation mechanisms and/or hazardous operating conditions) before being sent from system processor 702 to global processor 710.

Global processor 710 compares system data 720 to aggregate data 722 to find common traits between the two data sets. Aggregate data 722 includes data from multiple energy storage systems, e.g. from tens, hundreds, or even thousands of energy storage systems. Global processor 710 optionally adds information it receives from energy storage systems to aggregate data 722, such that aggregate data 722 grows over time. Examples of common traits between system data 720 and aggregate data 722 include, but are not limited to, cell assemblies operating under the same or similar conditions, cell assemblies with the same or similar operation duration, cell assemblies with the same or similar energy throughput, cell assemblies from a common manufacturing lot, cell assemblies with the same or similar installation, cell assemblies stored under the same or similar conditions, cell assemblies with the same or similar maintenance history, and cell assemblies with similar arc fault signatures. In some embodiments, global processor 710 uses self-learning methodologies (e.g., machine-learning, deep-learning, or even multi-modal machine learning) to identify common traits between system data 720 and aggregate data 722.

Global processor 710 subsequently identifies data that is applicable to energy storage system 100 from the common traits between system data 720 and aggregate data 722. More specifically, global processor 710 identifies data in aggregate data 722 that is associated with energy storage systems having common traits with energy storage system 100, as being applicable data. For example, global processor 710 may identify data from an energy storage system having the same type of cell assemblies as energy storage system 100 as being applicable data. As another example, global processor 710 may identify data from an energy storage system operating under similar conditions to energy storage system 100 as being applicable data. The applicable data may be either indirectly related or directly related to data associated with energy storage systems having common traits with energy storage system 100. In some embodiments, global processor 710 uses self-learning methodologies (e.g., machine-learning, deep-learning, or even multi-modal machine learning) to identify the applicable data from aggregate data 722.

Global processor 710 determines instructions/data 716 from the applicable data. Instructions/data 716 may include instructions for energy storage system 100 based on the applicable data, and/or instructions/data 716 may include the applicable data itself. Global processor 710 sends instructions/data 716 to system processor 702. Energy storage system 100 optionally uses instructions/data 716 to manage one or more aspects of energy storage system 100. For example, in particular embodiments, system controller 700 uses instructions/data 716 to build or refine models of cell assemblies 110, such as for controlling cell assembly 110 charging/discharging or for identifying and/or mitigating degradation or failure mechanisms of cell assemblies 110.

Figure 8:
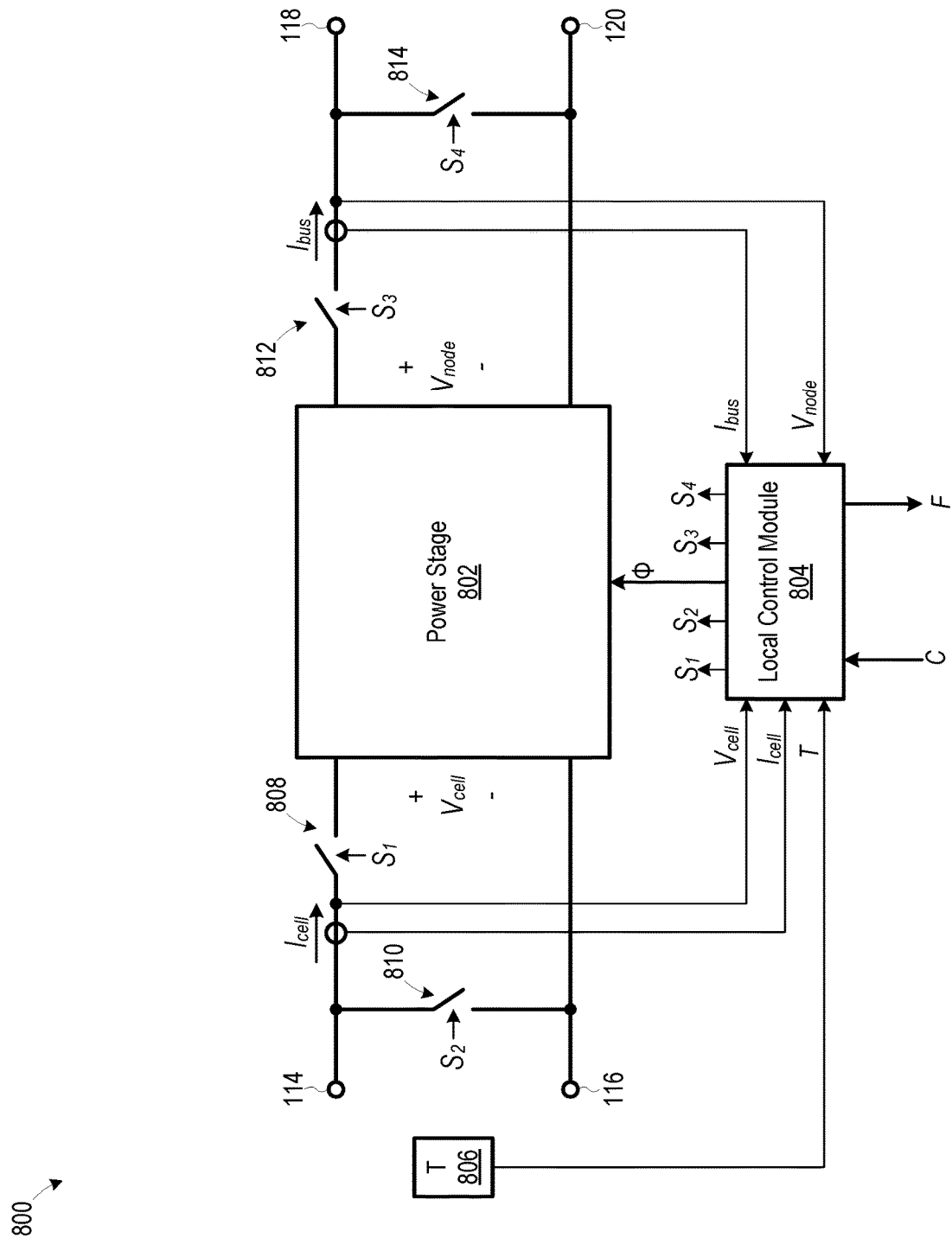
FIG. 8 is a schematic diagram of one embodiment of a BMS node controller of the FIG. 1 energy storage system, where the BMS node controller includes a power converter.

Referring again to FIG. 1, certain embodiments of BMS node controllers 112 include one or more power converters, such as for buffering their respective cell assemblies 110 from electric power bus 108 and for performing one or more of the adaptive electrochemical cell management methods discussed below. For example, FIG. 8 is a schematic diagram of a BMS node controller 800, which is one possible embodiment of a BMS node controller 112 including a power converter. BMS node controller 800 includes a power stage 802, a local control module 804, a temperature sensor 806, a first switching device 808, a second switching device 810, a third switching device 812, and a fourth switching device 814. In some alternate embodiments, temperature sensor 806 is separate from BMS node controller 800, e.g. temperature sensor 806 could be part of a cell assembly 110, instead of part of BMS node controller 800. Additionally, one or more of first switching device 808, second switching device 810, third switching device 812, and fourth switching device 814 may be omitted, such as in embodiments where the functionality realized by the switching devices is not required, or in embodiments where the functionality realized by the switching devices can be achieved by switching devices (not shown) within power stage 802. In this document, the term "switching device" includes, but is not limited to, one or more transistors, e.g. field effect transistors (FETs), bipolar junction transistors (BJTs), and/or insulated gate bipolar junction transistors (IGBTs), as well as one or more relays, contactors, or similar devices that are capable of opening and closing a circuit in response to a signal. Additionally, one or more of switching devices 808, 810, 812, and 814 can be replaced with, or supplemented by, one or more diodes, without departing from the scope hereof.

Power stage 802 is electrically coupled between (a) input ports 114 and 116 and (b) output ports 118 and 120. Power stage 802 is configured to perform one or more of the following power conversion functions, in response to switching signals ϕ generated by local control module 804: (a) transform voltage $V_{cell}$ across input ports 114 and 116 to voltage $V_{node}$ across output ports 118 and 120, (b) transform voltage $V_{node}$ across output ports 118 and 120 to voltage $V_{cell}$ across input ports 114 and 116, (c) transform current $I_{cell}$ flowing through cell assembly 110 and input ports 114 and 116 to current $I_{bus}$ flowing through output ports 118 and 120 and electric power bus 108, and (d) transform current $I_{bus}$ flowing through output ports 118 and 120 and electric power bus 108 to current $I_{cell}$ flowing through cell assembly 110 and input ports 114 and 116. In some embodiments, power stage 802 includes one or more of a non-isolated DC-to-DC switching converter, an isolated DC-to-DC switching converter, a linear regulator, and an inverter.

Figure 9:
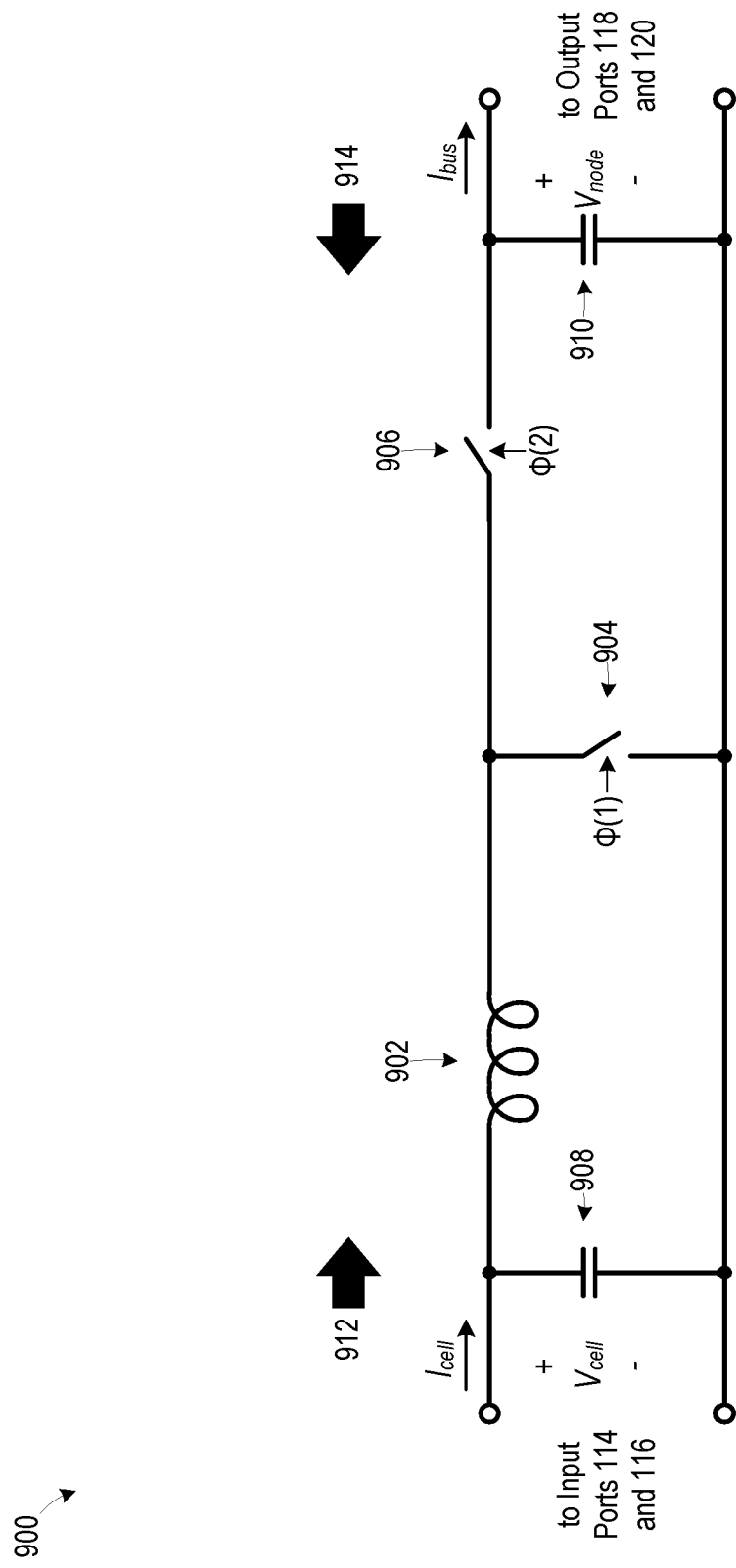
FIG. 9 is a schematic diagram of one embodiment of a power stage of the FIG. 8 BMS node controller.

For example, FIG. 9 is a schematic diagram of a power stage 900, which is one possible embodiment of power stage 802 of FIG. 8. Power stage 900 includes an inductor 902, a first switching device 904, a second switching device 906, a first capacitor 908, and a second capacitor 910. Although inductor 902 is depicted as being a discrete element, inductor 902 could be distributed inductance of a circuit including power stage 900. First switching device 904 and second switching device 906 are respectively controlled by switching signals ϕ(1) and ϕ(2) generated by local control module 804 of FIG. 8. Magnitude of voltage $V_{node}$ is greater than or equal to magnitude of voltage $V_{cell}$ in power stage 900. Consequently, power stage 900 increases voltage magnitude when electric power flows in a direction 912, e.g. when a cell assembly 110 electrically coupled to power stage 900 is discharging into source/load 106, and power stage 900 decreases voltage magnitude when electric power flows in a direction 914, e.g. when source/load 106 is charging a cell assembly 110 electrically coupled to power stage 900.

It is understood, however, that power stage 802 of FIG. 8 is not limited to the embodiment of FIG. 9. For example, while power stage 900 of FIG. 9 has a boost topology, power stage 802 could instead by embodied by a power stage having a buck topology, a buck-boost topology, a buck and boost topology, a flyback topology, a Cuk topology, a forward topology, a half-bridge topology, a full-bridge topology, a resonant topology, a switched capacitor topology, etc.

Referring again to FIG. 8, local control module 804 is configured to generate switching signals φ in response to control signals C received from system 102. Additionally, local control module 804 is optionally configured to monitor one or more of the following parameters and generate feedback signals F to convey these monitored parameters to system controller 102: (a) temperature (T) of a cell assembly 110 electrically coupled to BMS node controller 800, (b) voltage $V_{cell}$, (c) current $I_{cell}$, (d) voltage $V_{node}$, and (e) current $I_{bus}$. Local control module 804 is optionally further configured to include additional information in feedback signals F, such as information on a respective cell assembly 110 (e.g., cell assembly 110 type, manufacturing information for cell assembly 110, operating history for cell assembly 110, and/or maintenance history for cell assembly 110). Furthermore, local control module 804 is configured to generate signals $S_1$, $S_2$, $S_3$, and $S_4$, for respectively controlling switching devices 808, 810, 812, and 814, in response to control signals C from system controller 102. Local control module 804 causes switching device 808 to open, for example, to isolate power stage 802 from its respective cell assembly 110. Local control module 804 may cause switching device 810 to close to discharge a cell assembly 110 electrically coupled to power stage 802, such as in an emergency, in response to determining that cell assembly 110 is unsafe, or in preparation for energy storage system 100 maintenance. In some embodiments, a resistor (not shown) is electrically coupled in series with switching device 810 to facilitate controlled discharge of the cell assembly, or switching device 810 is replaced with a current source configured to perform a controlled discharge of the cell assembly. Local control module 804 causes switching device 812 to open, for example, to isolate power stage 802 from electric power bus 108. Additionally, local control module 804 may cause switching device 814 to close to enable current $I_{bus}$ to bypass power stage 802.

Figure 10:
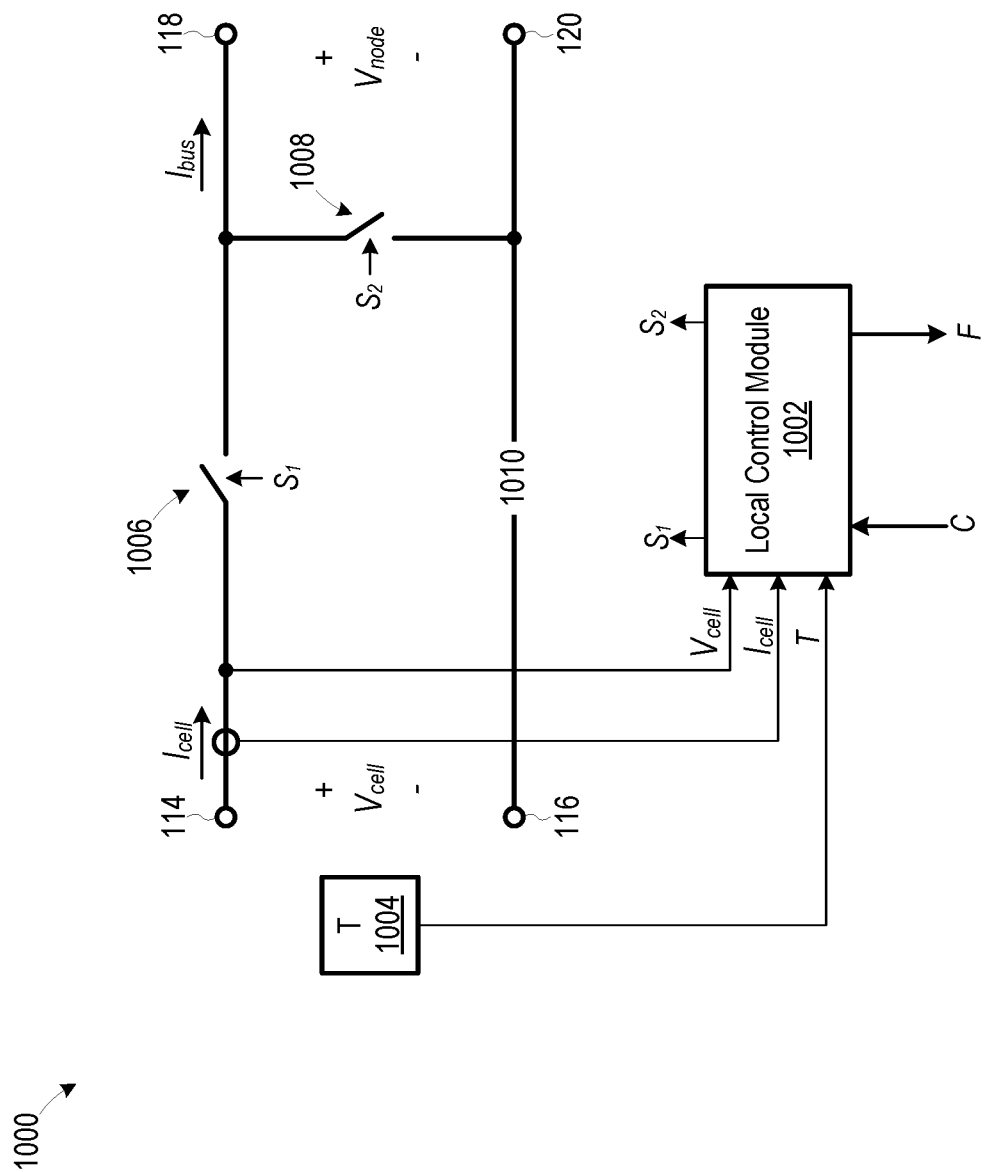
FIG. 10 is a schematic diagram of an embodiment of a BMS node controller of the FIG. 1 energy storage system, where the BMS node controller does not regulate node voltage or stack voltage.

Referring again to FIG. 1, certain embodiments of BMS node controllers 112 do not regulate node voltage or stack voltage but are capable of selectively connecting and disconnecting their respective cell assemblies 110 from electric power bus 108, such as to control charging and discharging of cell assemblies 110. For example, FIG. 10 is a schematic diagram of a BMS node controller 1000, which is one possible embodiment of BMS node controller 112 where the BMS node controller is not capable of regulating node voltage or stack voltage. BMS node controller 1000 includes a local control module 1002, a temperature sensor 1004, a first switching device 1006, and a second switching device 1008. In some alternate embodiments, temperature sensor 1004 is separate from BMS node controller 1000, e.g. temperature sensor 1004 could be part of a cell assembly 110, instead of part of BMS node controller 1000.

First switching device 1006 is electrically coupled between input port 114 and output port 118, and second switching device 1008 is electrically coupled between output ports 118 and 120. Input port 116 and output port 120 are part of a common electrical node 1010 in BMS node controller 1000. Local control module 1002 is optionally configured to monitor one or more of the following parameters and generate feedback signals F to convey these monitored parameters to system controller 102: (a) temperature (T) of a cell assembly 110 electrically coupled to input ports 114 and 116, (b) voltage $V_{cell}$, and (c) current Irell. Current $I_{bus}$ is the same as current $I_{cell}$, and voltage $V_{node}$ is the same as voltage $V_{cell}$, when first switching device 1006 is closed and second switching device 1008 is open. As such, local control module 1002 is not configured to monitor current $I_{bus}$ or voltage $V_{node}$. Local control module 1002 is optionally further configured to include additional information in feedback signals F, such as information on a respective cell assembly 110 (e.g., cell assembly 110 type, manufacturing information for cell assembly 110, operating history for cell assembly 110, and/or maintenance history for cell assembly 110).

Local control module 1002 is further configured to generate signals $S_1$ and $S_2$ for respectively controlling first switching device 1006 and second switching device 1008 in response to control signals C from system controller 102. Local control module 1002 causes first switching device 1006 to open, for example, to isolate a cell assembly 110 electrically coupled to input ports 114 and 116, such as to pause charging or discharging of the cell assembly 110 when performing one or more of the methods for adaptive electrochemical cell management discussed below. Local control module 1002 causes second switching device 1008 to close to enable current $I_{bus}$ to bypass a cell assembly 110 electrically coupled to input ports 114 and 116, such as when performing adaptive management of the cell assembly 110 and/or other cell assemblies of stack 104.

Referring again to FIG. 1, some embodiments of BMS node controllers 112 are configured to handle differential power, i.e., a difference in power between BMS nodes 109 or a difference in power between respective cell assemblies 110 of BMS nodes 109, instead of full BMS node power 109 or full power of a respective cell assembly 110. For instance, certain embodiments of BMS node controllers 112 are configured to transfer differential power between (a) adjacent BMS nodes 109, (b) a BMS node 109 and a bus (not shown in FIG. 1), or (c) a BMS node 109 and a load or a power source, including but not limited to, between a BMS node 109 and source/load 106.

Figure 11:
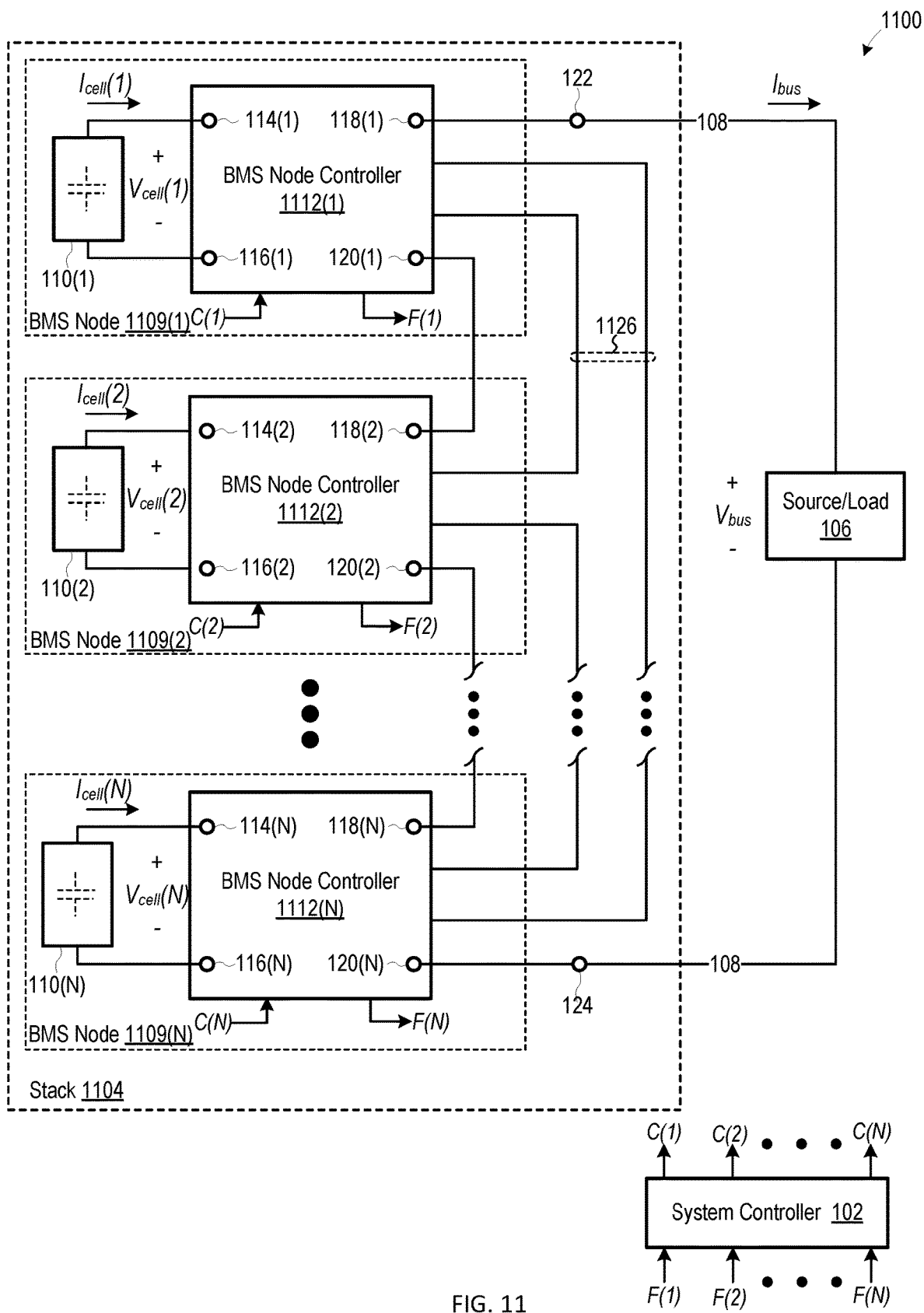
FIG. 11 is a schematic diagram of an embodiment of the FIG. 1 energy storage system that is configured to transfer differential power between adjacent BMS nodes.

For example, FIG. 11 is a schematic diagram of an energy storage system 1100, which is an embodiment of energy storage system 100 of FIG. 1 that configured to transfer differential power between adjacent BMS nodes. Stack 104 of energy storage system 100 is embodied by a stack 1104 in energy storage system 1100. BMS nodes 109 of stack 104 are embodied by BMS nodes 1109 in stack 1104. BMS node controllers 112 of stack 104 are embodied by BMS nodes controllers 1112 in stack 1104, and stack 1104 further includes an energy transfer bus 1126 electrically coupled to BMS node controllers 1112 in a daisy chain fashion. BMS node controllers 1112 are configured to transfer power between adjacent BMS nodes 1109 via energy transfer bus 1126, such as to perform one or more of the methods for adaptive electrochemical cell management discussed below.

Figure 12:
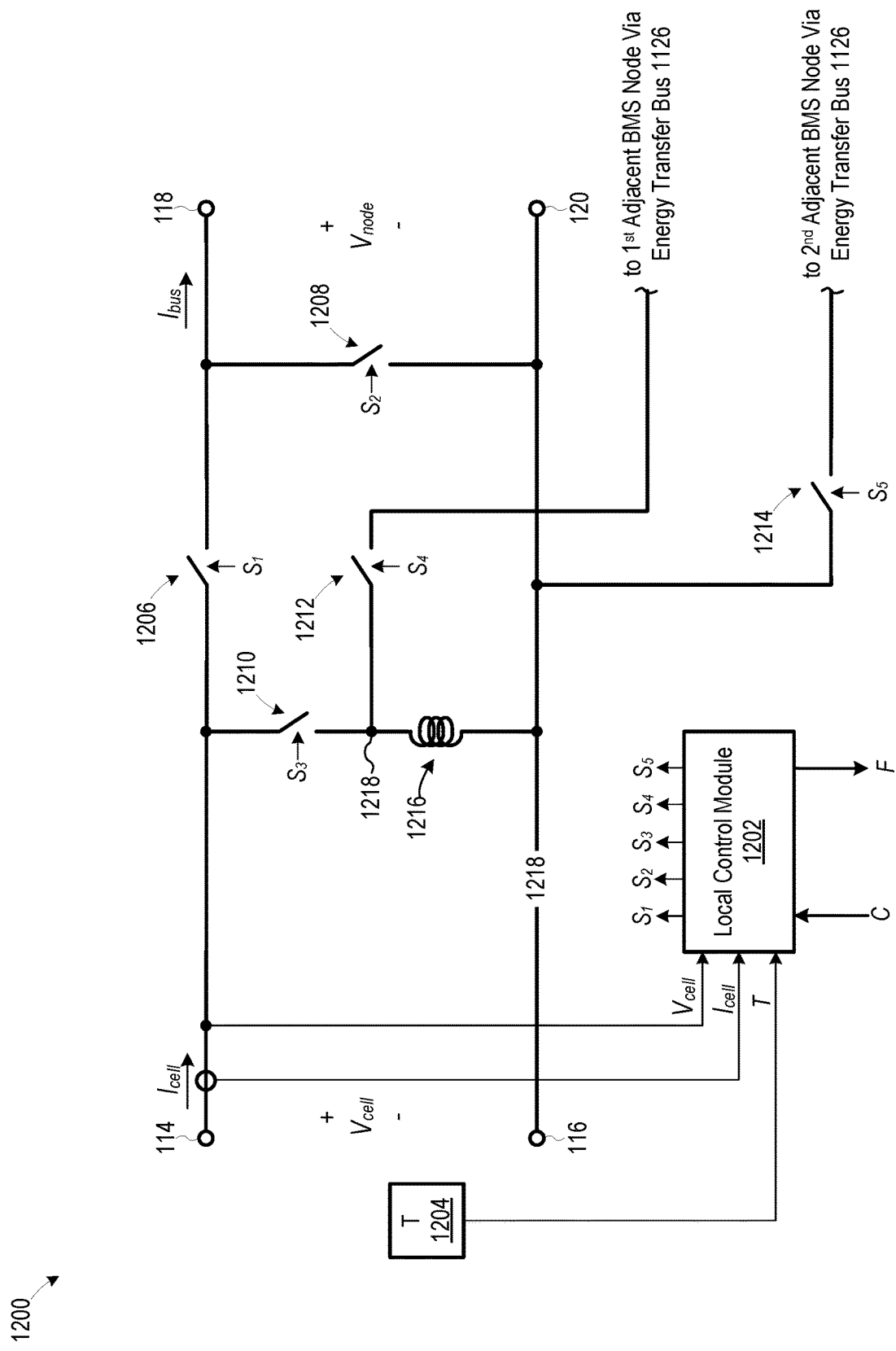
FIG. 12 is a schematic diagram of one possible embodiment of a BMS node controller of the FIG. 11 energy storage system.

FIG. 12 is a schematic diagram of a BMS node controller 1200, which is one possible embodiment of a BMS node controller 1112 of FIG. 11. BMS node controller 1200 includes a local control module 1202, a temperature sensor 1204, a first switching device 1206, a second switching device 1208, a third switching device 1210, a fourth switching device 1212, a fifth switching device 1214, and an inductor 1216. In some alternate embodiments, temperature sensor 1204 is separate from BMS node controller 1200, e.g. temperature sensor 1204 could be part of a cell assembly 110, instead of part of BMS node controller 1200.

First switching device 1206 is electrically coupled between input port 114 and output port 118, and second switching device 1208 is electrically coupled between output ports 118 and 120. Third switching device 1210 is electrically coupled between input port 114 and an internal electrical node 1218, and inductor 1216 is electrically coupled between internal electrical node 1218 and input port 116. Fourth switching device 1212 is electrically coupled between internal electrical node 1218 and a first adjacent BMS node via energy transfer bus 1126, and fifth switching device 1214 is electrically coupled between input port 116 and a second adjacent BMS node via energy transfer bus 1126. Input port 116 and output port 120 are part of a common electrical node 1218 in BMS node controller 1200.

Local control module 1202 is optionally configured to monitor one or more of the following parameters and generate feedback signals F to convey these monitored parameters to system controller 102: (a) temperature (T) of a cell assembly 110 electrically coupled to input ports 114 and 116, (b) voltage $V_{cell}$, and (c) current $I_{cell}$. Current $I_{bus}$ is the same as current $I_{cell}$, and voltage $V_{node}$ is the same as voltage $V_{cell}$, when first switching device 1206 is closed, second switching device 1208 is open, third switching device 1210 is open, fourth switching device 1212 is open, and fifth switching device 1214 is open. As such, local control module 1202 is not configured to monitor current $I_{bus}$ or voltage $V_{node}$. Local control module 1202 is optionally further configured to include additional information in feedback signals F, such as information on a respective cell assembly 110 (e.g., cell assembly 110 type, manufacturing information for cell assembly 110, operating history for cell assembly 110, and/or maintenance history for cell assembly 110).

Local control module 1202 is further configured to generate signals $S_1$ and $S_2$ for respectively controlling first switching device 1206 and second switching device 1208 in response to control signals C from system controller 102. Local control module 1202 causes first switching device 1206 to open, for example, to isolate a cell assembly 110 electrically coupled to input ports 114 and 116, e.g., to pause charging or discharging of the cell assembly 110 when performing one or more of the methods for adaptive electrochemical cell management discussed below. Local control module 1202 causes second switching device 1208 to close to enable current $I_{bus}$ to bypass a cell assembly 110 electrically coupled to input ports 114 and 116, such as when performing adaptive management of the cell assembly 110 and/or other cell assemblies of stack 1104.

Local control module 1202 is additionally configured to generate signals $S_3$, $S_4$, and $S_5$ for respectively controlling third switching device 1210, fourth switching device 1212, and fifth switching device 1214, in response to control signals C from system controller 102 to transfer charge from a cell assembly 110 electrically coupled to input ports 114 and 116 to a cell assembly of an adjacent BMS node. For example, local control module 1202 may (a) cause third switching device 1210 to be closed and fourth and fifth switching device 1212 and 1214 to be open, to charge inductor 1216 from the cell assembly 110 electrically coupled to input ports 114 and 116, and (b) subsequently cause third switching device 1210 to be open and fourth and fifth switching device 1212 and 1214 to be closed, to transfer energy stored in inductor 1216 to a cell assembly of an adjacent BMS node. Fourth switching device 1212 or fifth switching device 1214 may be omitted in alternate embodiments BMS node controller 1200 located at an end of stack 1104. Additionally, in some alternate embodiments of BMS node controller 1200, inductor 1216 is replaced with a capacitor configured to temporarily store charge from a cell assembly electrically coupled to input ports 114 and 116 for transfer to another BMS node, with appropriate changes to the topology of the BMS node controller.

Figure 13:
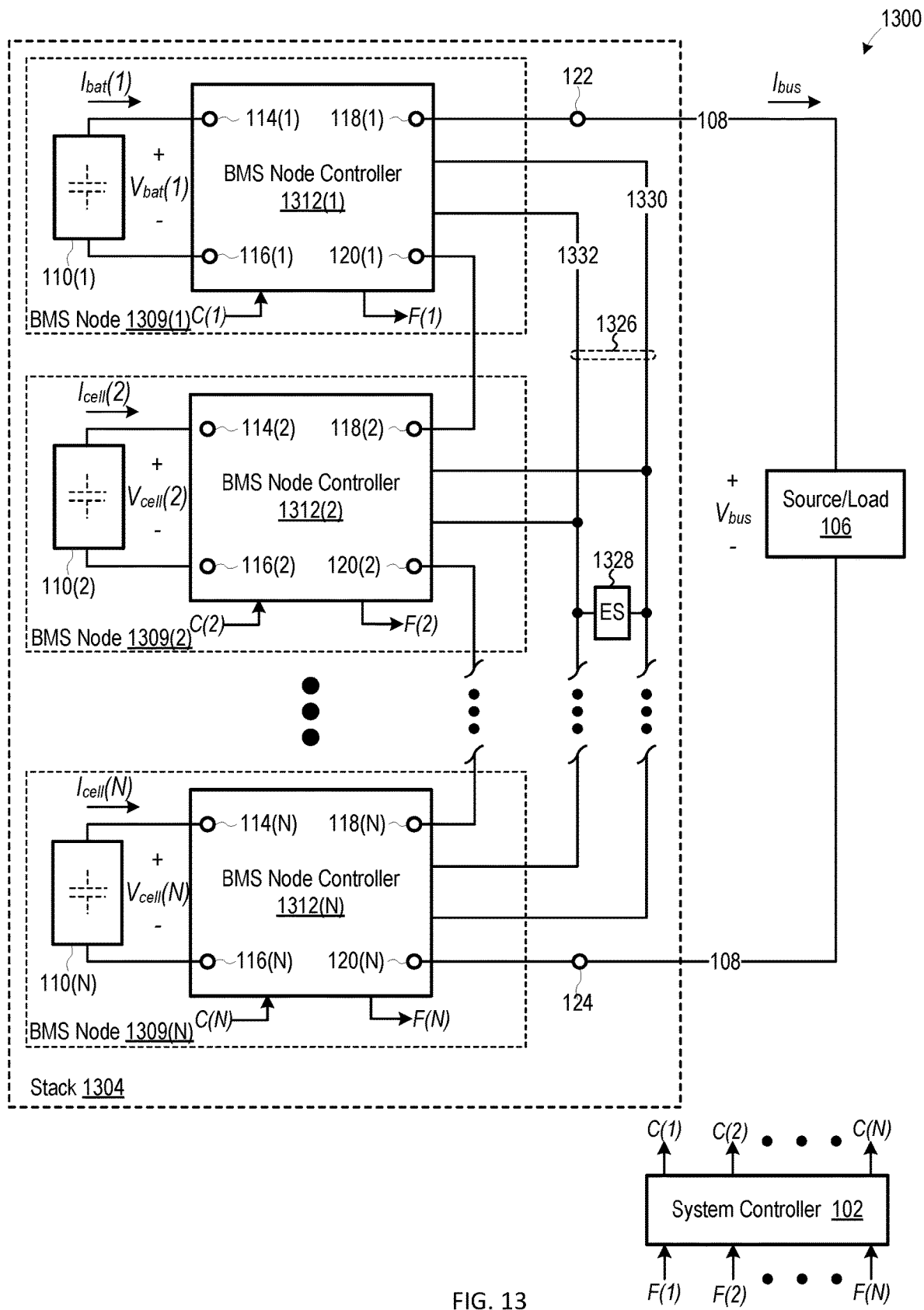
FIG. 13 is a schematic diagram of an embodiment of the FIG. 1 energy storage system that is configured to transfer differential power between BMS nodes.

FIG. 13 is a schematic diagram of an energy storage system 1300, which is an embodiment of energy storage system 100 of FIG. 1 that configured to transfer differential power between BMS nodes. Stack 104 of energy storage system 100 is embodied by a stack 1304 in energy storage system 1300. BMS nodes 109 of energy storage system 100 are embodied by BMS nodes 1309 in stack 1304. BMS node controllers 112 of stack 104 are embodied by BMS node controllers 1312 in stack 1304, and stack 1304 further includes an energy transfer bus 1326 and an energy store 1328. Energy transfer bus 1326 includes a positive electrical node 1330 and a negative electrical node 1332, and BMS node controllers 1312 are electrically coupled to energy transfer bus 1326 in a parallel fashion.

BMS node controllers 1312 are configured to transfer power between BMS nodes 1309 via energy transfer bus 1326, such as to perform one or more the methods for adaptive electrochemical cell management discussed below. Energy store 1328 is configured to temporarily store energy from one cell assembly 110 of stack 1304 for subsequent transfer to another cell assembly 110 of stack 1304. Accordingly, stack 1304 is not limited to transferring power between adjacent BMS nodes 1309—instead, power can be transferred between any two BMS nodes 1309 of stack 1304. In certain embodiments, energy store 1328 includes one or more passive energy storage elements, such as an inductor and/or a capacitor. In certain other embodiments, energy store 1328 is embodied by an additional power bus or even by another energy storage system.

Figure 14:
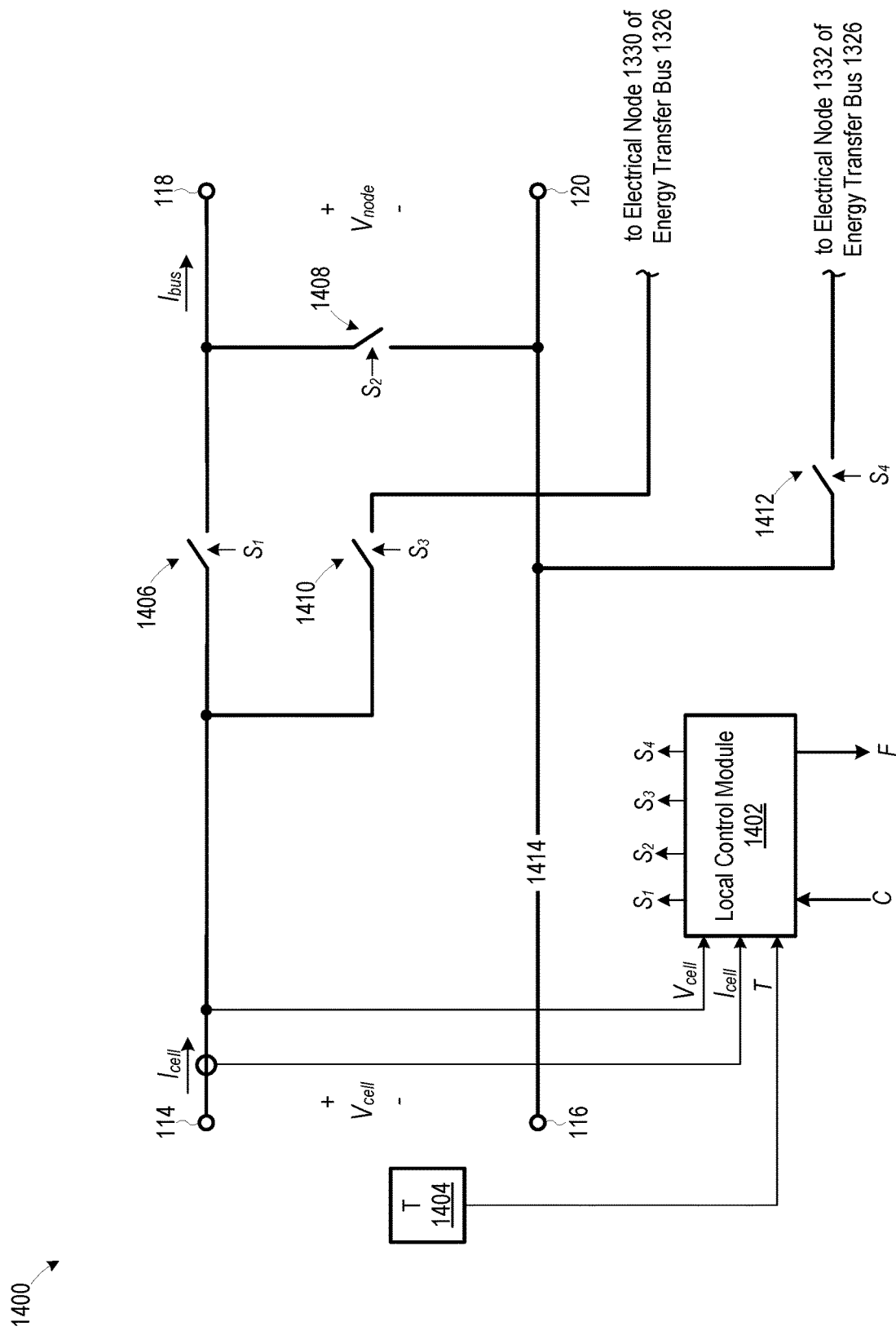
FIG. 14 is a schematic diagram of one possible embodiment of a BMS node controller of the FIG. 13 energy storage system.

FIG. 14 is a schematic diagram of a BMS node controller 1400, which is one possible embodiment of a BMS node controller 1312 of FIG. 13. BMS node controller 1400 includes a local control module 1402, a temperature sensor 1404, a first switching device 1406, a second switching device 1408, a third switching device 1410, and a fourth switching device 1412. In some alternate embodiments, temperature sensor 1404 is separate from BMS node controller 1400, e.g. temperature sensor 1404 could be part of a cell assembly 110, instead of part of BMS node controller 1400.

First switching device 1406 is electrically coupled between input port 114 and output port 118, and second switching device 1408 is electrically coupled between output ports 118 and 120. Third switching device 1410 is electrically coupled between input port 114 and positive electrical node 1330 of energy transfer bus 1326, and fourth switching device 1412 is electrically coupled between input port 116 and negative electrical node 1332 of energy transfer bus 1326. Input port 116 and output port 120 are part of a common electrical node 1414 in BMS node controller 1400.

Local control module 1402 is optionally configured to monitor one or more of the following parameters and generate feedback signals F to convey these monitored parameters to system controller 102: (a) temperature (T) of a cell assembly 110 electrically coupled to input ports 114 and 116, (b) voltage $V_{cell}$, and (c) current $I_{cell}$. Current $I_{bus}$ is the same as current $I_{cell}$, and voltage $V_{node}$ is the same as voltage $V_{cell}$, when first switching device 1406 is closed, second switching device 1408 is open, third switching device 1410 is open, and fourth switching device 1412 is open. As such, local control module 1402 is not configured to monitor current $I_{bus}$ or voltage $V_{node}$. Local control module 1402 is optionally further configured to include additional information in feedback signals F, such as information on a respective cell assembly 110 (e.g., cell assembly 110 type, manufacturing information for cell assembly 110, operating history for cell assembly 110, and/or maintenance history for cell assembly 110).

Local control module 1402 is further configured to generate signals $S_1$ and $S_2$ for respectively controlling first switching device 1406 and second switching device 1408 in response to control signals C from system controller 102. Local control module 1402 causes first switching device 1406 to open, for example, to isolate a cell assembly 110 electrically coupled to input ports 114 and 116, e.g., to pause charging or discharging of the cell assembly 110 while performing one or more of the methods for adaptive electrochemical cell management discussed below. Local control module 1402 causes second switching device 1408 to close to enable current $I_{bus}$ to bypass a cell assembly 110 electrically coupled to input ports 114 and 116, such as while performing adaptive management of the cell assembly 110 and/or other cell assemblies of stack 1304.

Local control module 1402 is additionally configured to generate signals $S_3$ and $S_4$ for respectively controlling third switching device 1410 and fourth switching device 1412 in response to control signals C from system controller 102 to transfer charge from a cell assembly 110 electrically coupled to input ports 114 and 116 to a cell assembly of another adjacent BMS node, or vice versa. For example, local control module 1402 may cause each of third switching device 1410 and fourth switching device 1412 to be closed, to transfer charge from a cell assembly 110 electrically coupled to input ports 114 and 116 to energy store 1328, for subsequent transfer to a cell assembly of another BMS node 1304. As another example, local control module 1402 may cause each of third switching device 1410 and fourth switching device 1412 to be closed, to transfer charge from energy store 1328 to a cell assembly 110 electrically coupled to input ports 114 and 116, where the charge transferred from energy store 1328 was previously transferred to energy store 1328 from another BMS node of stack 1304.

Figure 15:
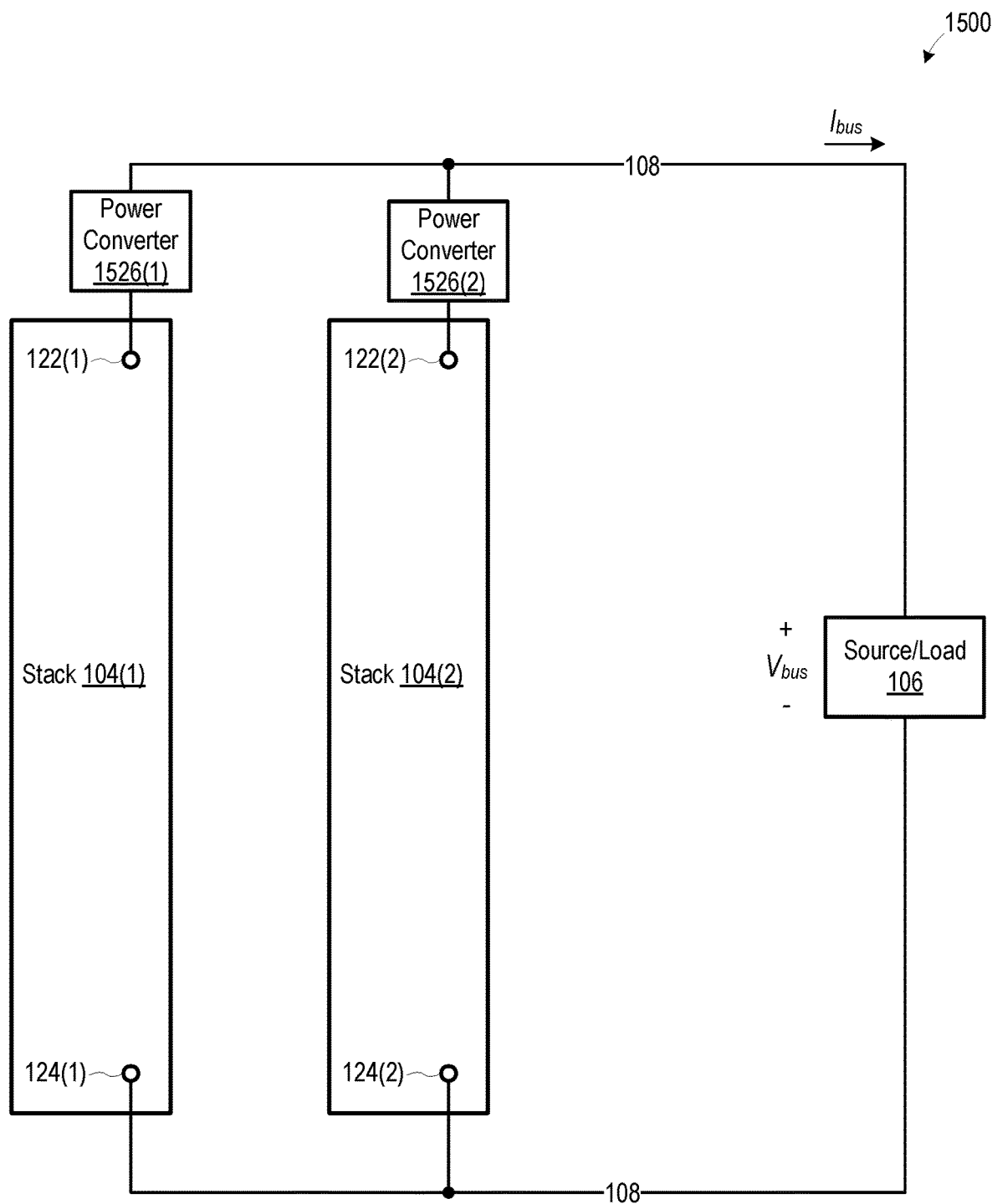
FIG. 15 is a schematic diagram of an alternate embodiment of the FIG. 1 energy storage system including two stacks.

Referring again to FIG. 1, energy storage system 100 could be modified to include additional stacks 104 and/or to have a different configuration of stacks 104. For example, FIG. 15 is a schematic diagram of an energy storage system 1500, which is an alternate embodiment of energy storage system 100 which includes two instances of stack 104, i.e. stacks 104(1) and 104(2). System controller 102, as well as details of stacks 104(1) and 104(2), are not shown in FIG. 15 for illustrative clarity. FIG. 15 illustrates each stack 104 being electrically coupled to electric power bus 108 via a respective power converter 1526, where each power converter 1526 is, for example, a DC-to-DC converter or an inverter. However, power converters 1526 may be omitted such that stacks 104 are directly electrically coupled to power bus 108.

Figure 16:
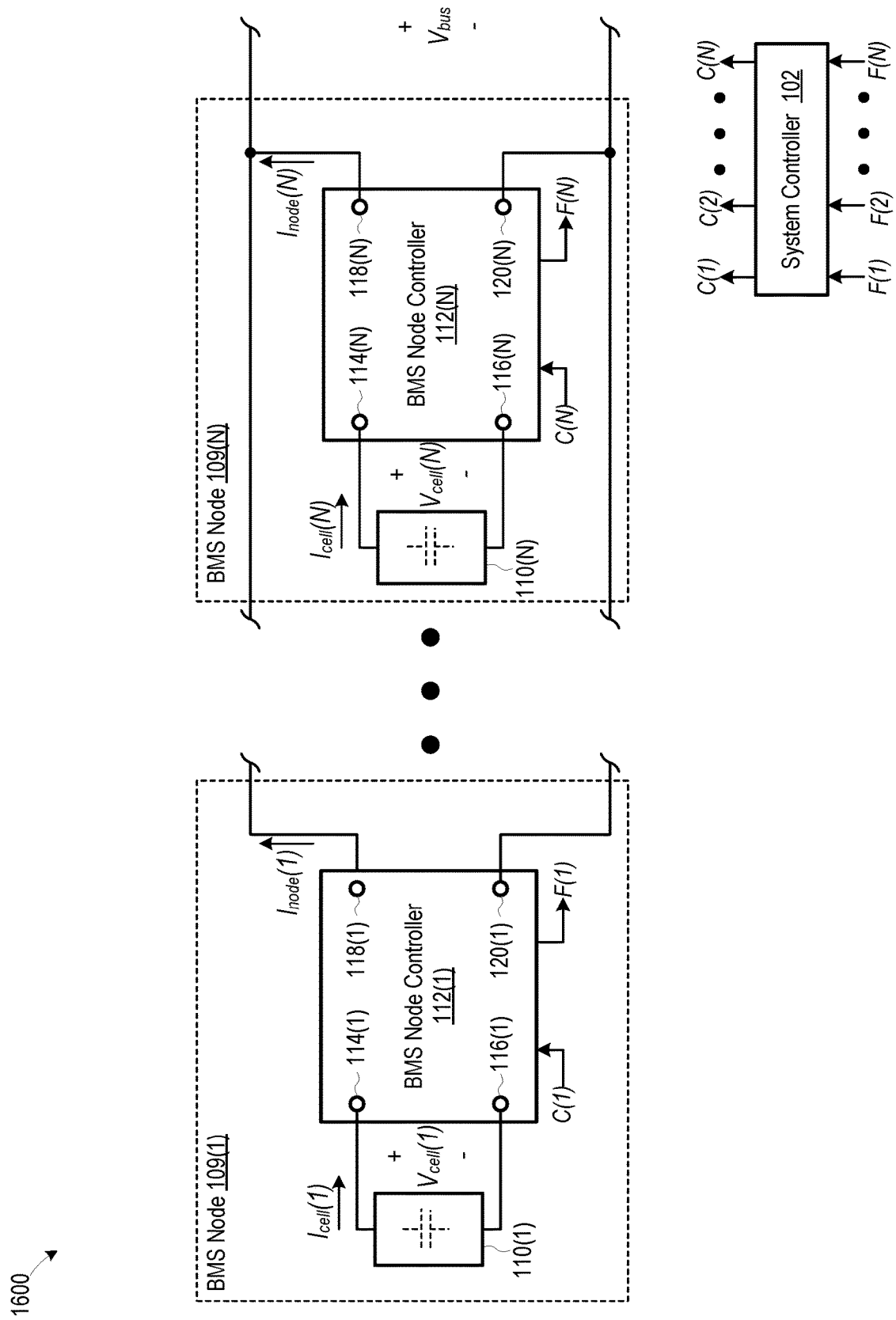
FIG. 16 is a schematic diagram of an alternate embodiment of the FIG. 1 energy storage system where BMS nodes are electrically coupled in parallel.

Additionally, two or more BMS nodes may be electrically coupled together in parallel or in a series/parallel combination. For example, FIG. 16 is a schematic diagram of an energy storage system 1600, which is an alternate embodiment of energy storage system 100 where stack 104 is replaced with a plurality of BMS nodes 109 that are electrically coupled in parallel. Source/load 106 and electric power bus 108 are not shown in FIG. 16 for illustrative clarity. Voltage $V_{node}$ across each BMS node controller 112's output ports 118 and 120 is equal to voltage $V_{bus}$ in energy storage system 1600, due to the parallel connection of BMS nodes 109. However, each BMS node controller 112 has a respective current Inode flowing through its output ports 118 and 120 to electric power bus 108.

Figure 17:
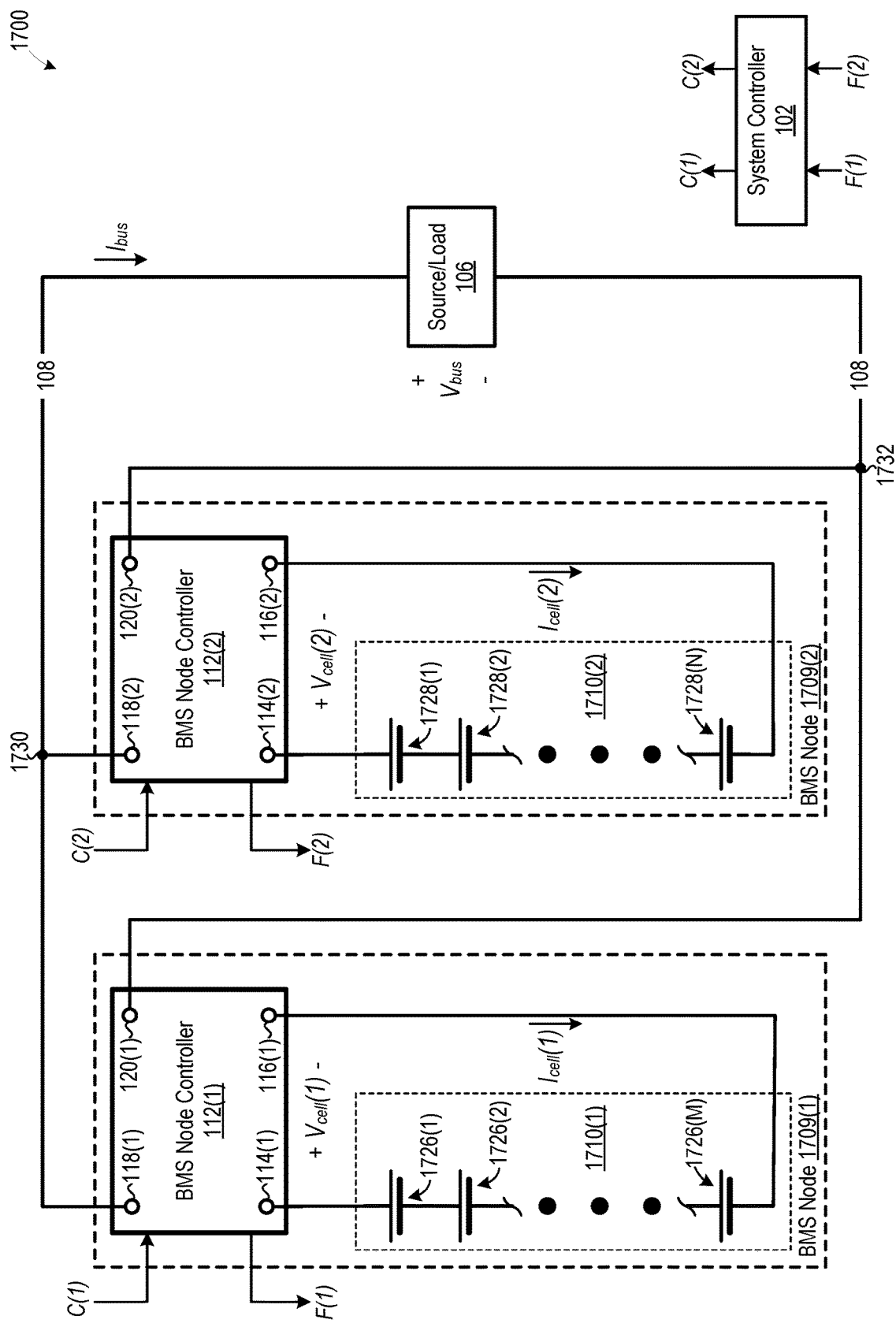
FIG. 17 is a schematic diagram of another alternate embodiment of the FIG. 1 energy storage system where BMS nodes are electrically coupled in parallel.

As another example, FIG. 17 is a schematic diagram of an energy storage system 1700, which is an alternate embodiment of energy storage system 100 where stack 104 is replaced with a plurality of BMS nodes 1709 electrically coupled in parallel with source/load 106 via electric power bus 108. Although FIG. 17 illustrates energy storage system 1700 as including two BMS nodes 1709, it is understood that energy storage system 1700 could include additional BMS nodes 1709 electrically coupled in parallel with source/load 106. BMS nodes 1709 are embodiments of BMS nodes 109 (FIG. 1), and each BMS node 1709 includes a respective BMS node controller 112 and a respective cell assembly 1710. Cell assemblies 1710 are embodiments of cell assemblies 110 (FIG. 1). Cell assembly 1710(1) includes M electrochemical cells 1726 electrically coupled in series between input port 114(1) and input port 116(1) of BMS node controller 112(1), where M is an integer greater than one. Cell assembly 1710(2) includes N electrochemical cells 1728 electrically coupled in series between input port 114(2) and input port 116(2) of BMS node controller 112(2), where N is an integer greater than one, and where N need not be equal to M. In some embodiments, electrochemical cells 1726 and 1728 are Li-ion electrochemical cells.

Output ports 118 of BMS node controllers 112 are electrically coupled to a positive node 1730 of electric power bus 108, and output ports 120 of BMS node controllers 112 are electrically coupled to a negative node 1732 of electric power bus 108, in energy storage system 1700. Source/load 106 is electrically coupled between positive node 1730 and negative node 1732. Consequently, a voltage across output port 118 and output port 120 of each BMS node controller 112 is equal to voltage $V_{bus}$, in energy storage system 1700. Voltage $V_{bus}$ may be either a DC voltage or an AC voltage, depending on the configuration of BMS node controllers 112 in energy storage system 1700. For example, voltage $V_{bus}$ may be a DC voltage if each BMS node controller 112 includes a respective DC-to-DC converter. As another example, voltage $V_{bus}$ may be an AC voltage if each BMS node controller 112 includes an inverter configured to convert a respective DC voltage $V_{cell}$ to an AC voltage $V_{bus}$ (or vice versa). In some alternate embodiments of energy storage system 1700, input ports 116 and output ports 120 are part of a common electrical node. Furthermore, in certain alternate embodiments of energy storage system 1700, BMS node 1709(1) and/or BMS node 1709(2) further includes one or more additional power converters (not shown), e.g., for electrically buffering electrochemical cells 1726 from each other within cell assembly 1710(1), and/or for electrically buffering electrochemical cells 1728 from each other within cell assembly 1710(2).

Figure 18:
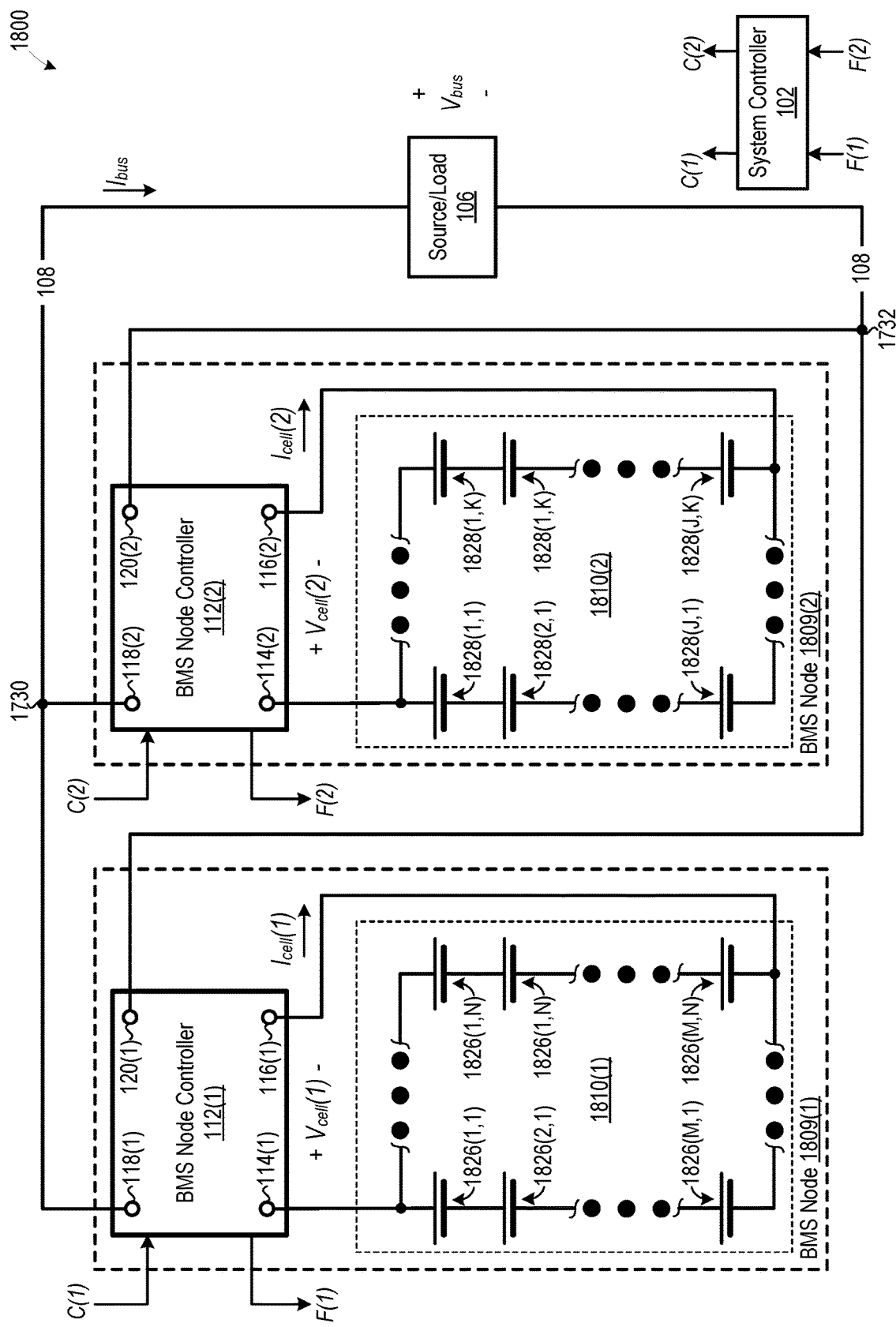
FIG. 18 is a schematic diagram of an alternate embodiment of the FIG. 17 energy storage system where each BMS node includes an array of electrochemical cells.

As another example, FIG. 18 is a schematic diagram of an energy storage system 1800, which is an alternate embodiment of energy storage system 1700 (FIG. 17) where BMS nodes 1709 are replaced with BMS nodes 1809. BMS nodes 1809 differ from BMS nodes 1709 in that BMS nodes 1809 include cell assemblies 1810 in place of cell assemblies 1710. Each cell assembly 1810 includes an array of electrochemical cells, e.g., an array of electrochemical cells housed in one or more containers.

Cell assembly 1810(1) includes an array of M rows and N columns of electrochemical cells 1826, where each of M and N is an integer greater than one, and N need not be equal to M. Electrochemical cells 1826 are denoted in FIG. 18 by 1826(x, y), where x refers to the row of the electrochemical cell in cell assembly 1810(1), and y refers to the column of the electrochemical cell in cell assembly 1810(1). Electrochemical cells 1826 within a given column are electrically coupled in series, and each column of electrochemical cells 1826 is electrically coupled in parallel with other column of electrochemical cells 1826, in cell assembly 1810(1).

Similarly, cell assembly 1810(2) includes an array of J rows and K columns of electrochemical cells 1828, where each of J and K is an integer greater than or equal to one, and K need not be equal to J. Electrochemical cells 1828 are denoted in FIG. 18 by 1828(x, y), where x refers to the row of the electrochemical cell in cell assembly 1810(2), and y refers to the column of the electrochemical cell in cell assembly 1810(2). Electrochemical cells 1828 within a given column are electrically coupled in series, and each column of electrochemical cells 1828 is electrically coupled in parallel with other column of electrochemical cells 1828, in cell assembly 1810(2). In some embodiments, electrochemical cells 1826 and 1828 are Li-ion electrochemical cells.

Referring again to FIG. 1, the new energy storage systems disclosed herein are configured to adaptively manage cell assemblies 110 in response to degradation or failure mechanisms of the cell assemblies, to mitigate the degradation or failure mechanisms. System controller 102 is configured to adaptively manage a cell assembly 110, for example, by causing the respective BMS node controller 112 electrically coupled to the cell assembly 110 to change an operating state of the cell assembly 110 in a manner which mitigates a degradation or failure mechanism of the cell assembly, independently of operation of other BMS nodes 109 in stack 104. Thus, the new energy storage systems disclosed herein advantageously help achieve long cell assembly 110 lifetime and/or help prevent imminent cell assembly 110 failure by mitigating cell assembly 110 degradation and/or failure mechanisms. In some embodiments, system controller 102 is configured to obtain degradation or failure mechanisms of cell assemblies 110 from an external source, while in some other embodiments, system controller 102 is configured to internally obtain degradation or failure mechanisms of cell assemblies 110, such as by processing feedback signals F and/or aggregated data 722 in accordance with global instructions 718 and/or system instructions 708 (FIG. 7).

Discussed below with respect to FIGS. 19-28 are several examples of how certain embodiments of the new energy storage systems disclosed herein may be configured to adaptively manage cell assemblies 110 in response to degradation or failure mechanisms of the cell assemblies 110, to mitigate the degradation or failure mechanisms. However, the new energy storage systems disclosed herein could be configured to adaptively manage cell assemblies 110 in other manners without departing from the scope hereof. Furthermore, the example methods for adaptive electrochemical cell management discussed below could be implemented in energy storage systems other than the energy storage systems discussed above. As discussed below, particular embodiments of the new energy storage systems are configured to purposefully cause electrochemical cells assemblies 110 to temporarily operate in an unbalanced state, such as to mitigate degradation and/or failure mechanisms, and subsequently return cell assemblies 110 to a balanced state.

FIG. 19 is a flow chart of a method 1900 for adaptive electrochemical cell management in an energy storage system including a plurality of BMS nodes, to mitigate cell assembly degradation. In a block 1902 of method 1900, a first signal is obtained, where the first signal identifies one or more degradation mechanisms of a first cell assembly of the energy storage system. In one example of block 1902, system controller 102 obtains a signal identifying one or more degradation mechanisms of cell assembly 110(1) of energy storage system 100. The degradations mechanisms of cell assembly 110(1) may be unique to cell assembly 110(1), or they may be common to a plurality of cell assemblies 110 in an energy storage system, such as a plurality of cell assemblies 110 having common characteristics.

In certain embodiments, system controller 102 obtains the signal identifying cell assembly degradation mechanisms from an external source. However, in certain other embodiments, system controller 102 internally obtains the signal identifying cell assembly degradation mechanisms. For example, in a particular embodiment where system controller 102 is embodied as illustrated in FIG. 7, global processor 710 is configured to identify cell assembly degradation mechanisms at least partially by identifying common traits between system data 720 and aggregate data 722, as discussed above with respect to FIG. 7. For instance, aggregate data 722 may associate certain degradation mechanisms with particular cell assembly data, and global processor 710 may identify these degradation mechanisms as being applicable to cell assembly 110(1) in response to system data 720 having common traits with the particular cell assembly data. Global processor 710 optionally uses self-learning methodologies (e.g., machine-learning, deep-learning, or even multi-modal machine learning) to identify degradation mechanisms of cell assemblies 110 from system data 720 and aggregate data 722.

Examples of possible cell assembly 110 degradation mechanisms include, but are not limited to, one or more of loss of Lithium inventory in one or more electrochemical cells of a cell assembly 110, impedance growth on an anode of one or more electrochemical cells of a cell assembly 110, impedance growth on a cathode of one or more electrochemical cells of a cell assembly 110, loss of active material in an anode of one or more electrochemical cells of a cell assembly 110, loss of active material in a cathode of one or more electrochemical cells of a cell assembly 110, abnormal Lithiation level on an anode of one or more electrochemical cells of a cell assembly 110, and abnormal Lithiation level on a cathode of one or more electrochemical cells of a cell assembly 110. In some embodiments, the degradation mechanisms for a particular cell assembly 110, or a particular group of cell assemblies 110, are expressed as a vector of a plurality of degradation mechanisms. For example, in certain embodiments where a cell assembly 110 includes a Lithium-ion electrochemical cell, degradation mechanisms for the cell assembly may be expressed as a vector D=[Li loss, RA, RC, LA, LC], where (a) Li loss is loss of Lithium inventory in the electrochemical cell, (b) RA is impedance growth on an anode of the electrochemical cell, (c) RC is impedance growth on a cathode of the electrochemical cell, (d) LA is loss of active material in an anode of the electrochemical cell, and (e) LC is loss of active material in a cathode of the electrochemical cell.

Referring again to FIG. 19, in a block 1904 of method 1900, a respective BMS node controller electrically coupled to the first cell assembly is controlled in response to the first signal obtained in block 1902, to change a state of operation of the first cell assembly to mitigate the one or more degradation mechanisms of the first cell assembly, independently of operation of other BMS nodes of the energy storage system. In one example of block 1904, system controller 102 generates control signal C(1) to control BMS node controller 112(1) to change a state of operation of cell assembly 110(1) in response to the signal identifying one or more degradation mechanisms of cell assembly 110(1), to mitigate the degradation mechanisms independently of operation other BMS nodes 109 and associated cell assemblies 110. For example, BMS node controller 112(1) may directly or indirectly change one or more cell voltage $V_{cell}$, cell current $I_{cell}$, cell assembly temperature $T_{cell}$, cell assembly power $P_{cell}$, cell assembly charge or discharge rate $C_{rate}$, cell assembly depth of discharge DOD, cell assembly anode lithiation level LiLA, and cell assembly cathode lithiation level LiLC, to mitigate the one or more degradation mechanism of cell assembly 110(1). In some embodiments, state of operation of cell assembly 110(1) is a single operating characteristic of the cell assembly, e.g. representing $V_{cell}$, $I_{cell}$, $T_{cell}$, $P_{cell}$, $C_{rate}$, DOD, SOC, LiLA, or LiLC. In some other embodiments, state of operation of cell assembly 110(1) is a vector representing a plurality of operating characteristics of the cell assembly, such as two or more of $V_{cell}$, $I_{cell}$, $T_{cell}$, $P_{cell}$, $C_{rate}$, DOD, LILA, or LiLC of cell assembly 110(1).

Block 1904 of method 1900 optionally includes sub-blocks 1906 and 1908. In sub-block 1906, a desired change in state of operation of the first cell assembly is determined to mitigate the one or more degradation mechanisms of the first cell assembly. In one example of sub-block 1906, system controller 102 determines a desired change in state of operation of cell assembly 110(1), to mitigate the degradation mechanisms of cell assembly 110(1). For example, in an embodiment where system controller 102 is embodied as depicted in FIG. 6, processor 602 may execute instructions 608 stored in memory 604 to determine the desired change in cell assembly 110(1) operating state based on the degradation mechanisms. For instance, instructions 608 may include a lookup table of degradation mechanisms and corresponding desired changes in cell assembly operating state for mitigating the degradation mechanisms, and processor 602 may select a change in cell assembly operating state corresponding to the degradation mechanisms for cell assembly 110(1). As another example, in an embodiment where system controller 102 is embodied as depicted in FIG. 7, global processor 710 may determine a desired change in operating state of cell assembly 110(1) by comparing system data 720 to aggregate data 722, optionally using self-learning methodologies.

In embodiments where a plurality of degradation mechanisms are identified for cell assembly 110(1), there might not be a single change in cell assembly 110(1) operating state which is capable of mitigating all of the degradation mechanisms. Additionally, two or more degradation mechanism may require conflicting respective changes in cell assembly 110(1) operating state for mitigation. For example, one degradation mechanism may be mitigated by increasing cell assembly 110 discharge rate while another degradation mechanism may be mitigated by decreasing cell assembly 110 discharge rate. Therefore, some embodiments of system controller 102 are configured to execute one or more methods for selecting among two or more possible changes in cell assembly 110(1) operating state, to mitigate cell assembly degradation mechanisms. For example, in some embodiments, all degradation mechanisms are equally weighed, and system controller 102 selects one of a plurality of possible changes in cell assembly 110(1) operating state that mitigates the most degradation mechanisms of the cell assembly. In some other embodiments, at least two or more degradation mechanisms are unequally weighed, such that one or more degradation mechanisms may be given more weight than others when determining a desired change in cell assembly 110(1) operating state.

For example, in one embodiment, degradation mechanisms of cell assembly 110(1) are expressed as a vector $D=[d_1, d_2, \ldots d_n]$ including n degradation mechanisms d, where n is an integer greater than one. Degradation vector D may be weighed by a state of degradation weighing vector $W_d=[wd_1, wd_2, \ldots wd_n]$ including a respective weight wd for each degradation mechanism d, when determining a desired change in cell assembly 110(1) operating state to the mitigate degradation mechanisms. For example, degradation mechanisms d that are higher priority for mitigation may be assigned larger weights wd than degradation mechanisms d that are lower priority for mitigation. The degradation vector D and the weighing vector $W_d$ may be multiplied together, as shown in EQN. 1 below, to determine a state of degradation vector SOD having state of degradation values sd. A degradation mechanism d having a largest corresponding state of degradation value sd, which corresponds to a degradation mechanism having a largest weighted value, may then be selected for mitigation, and a required change in cell assembly 110(1) operating state may be determined to mitigate the degradation mechanism.

$$SOD=[d_1, d_2, \ldots d_n]*[wd_1, wd_2, \ldots wd_n]=[sd_1, sd_2, \ldots sd_n] \quad \text{(EQN. 1)}$$

As another example, degradation vector D may be weighed by a state of health weighing vector $Wh=[wh_1, wh_2, \ldots wh_n]$ including a respective weight wh for each degradation mechanism d, when determining a desired change in cell assembly 110(1) operating state to mitigate degradation mechanisms. For example, degradation mechanisms d that are lower priority for mitigation may be assigned larger weights wh than degradation mechanisms d that are higher priority for mitigation. The degradation vector D and the weighing vector Wh may be multiplied together, as shown in EQN. 2 below, to determine a state of health vector SOH having state of health values sh. A degradation mechanism d having a smallest corresponding state of health value sd, which corresponds to a degradation mechanism having a largest weighted negative impact on cell assembly 110(1) state of health, may then be selected for mitigation, and a required change in cell assembly 110(1) operating state may be determined to mitigate this degradation mechanism.

$$SOH=[d_1, d_2, \ldots d_n]*[wh_1, wh_2, \ldots wh_n]=[sh_1, sh_2, \ldots sh_n] \quad \text{(EQN. 2)}$$

Additionally, in some embodiments of sub-block 1706, a desired change in cell assembly 110(1) operating state is determined, at least partially by evaluating how a proposed change in cell assembly operating state affects cell assembly degradation mechanisms. For example, some embodiments of system controller 102 are configured to evaluate EQN. 3 below at a plurality of different possible operating states, where each operating state is defined by a vector $O=[op_1, oc_2, \ldots oc_n]$, where each value of oc is an operating characteristic of cell assembly 110(1), such as $V_{cell}$, $I_{cell}$, $T_{cell}$, $P_{cell}$, $C_{rate}$, DOD, SOC, LILA, or LiLC. $D_n$ is a vector representing current degradation mechanisms of cell assembly 110(1), and $D_{n+1}$ is a vector representing new degradation mechanisms of cell assembly 110(1) under the possible operating state defined by vector O. $f_{cost-D}$ is a cost function associating vectors $D_n$ and O with vector $D_{n+1}$. $f_{cost-D}$ is determined, for example, by empirically testing cell assembly 110(1). In some embodiments, system controller 102 evaluates EQN. 3 at a plurality of different operating states, i.e. at a plurality of different vectors O, and selects as a desired operating state one that minimizes at least some elements of vector $D_{n+1}$. In these embodiments, system controller 102 then determines a desired change in cell assembly operating state as a difference between the selected operating state and a current operating state of cell assembly 110(1).

$$D_{n+1}=f_{cost-D}(D_n,O) \quad \text{(EQN.3)}$$

As another example, some embodiments of system controller 102 are configured to evaluate EQN. 4 below at a plurality of different possible operating states, where each operating state is defined by a vector $O=[op_1, op_2, \ldots op_n]$, as discussed above with respect to EQN. 3. $SOD_n$ is a vector representing current state of degradation of cell assembly 110(1), and $SOD_{n+1}$ is a vector representing a new state of degradation of cell assembly 110(1) under the possible operating state defined by vector O. $f_{cost-SOD}$ is a cost function associating vectors $SOD_n$ and O with vector $SOD_{n+1}$. $f_{cost-SOD}$ is determined, for example, by empirically testing cell assembly 110(1). In some embodiments, system controller 102 evaluates EQN. 4 at a plurality of different operating states, i.e. at a plurality of different vectors O, and selects as a desired operating state one that minimizes at least some elements of vector $SOD_{n+1}$. In these embodiments, system controller 102 then determines a desired change in cell assembly operating state as a difference between the selected operating state and a current operating state of cell assembly 110(1).

$$SOD_{n+1} = f_{cost-SOD}(SOD_n, O) \quad \text{(EQN. 4)}$$

Furthermore, some embodiments of system controller 102 are configured to determine cell assembly life under current or proposed operation conditions by executing EQN. 5 below, such as to determine if there is significant benefit to changing cell assembly operating state. O is an operating state vector as discussed above, and L represents projected cell assembly 110 lifetime under operating state vector O. Function $f_{life}$ relates operating state vector O to projected lifetime L, and $f_{life}$ is determined, for example, by empirically testing cell assembly 110(1) and/or by modeling cell assembly 110(1).

$$L = f_{life}(O) \quad \text{(EQN. 5)}$$

EQN. 6 is one example of function $f_{life}$ where the function accounts for simple degradation effects of cell assembly 110(1), and EQN. 7 is one example of function $f_{life}$ where the function accounts for both simple and quadratic degradation effects of cell assembly 110(1). Coefficients $\alpha_1$, $\alpha_2$, $\alpha_3$, $\alpha_4$, $\alpha_{11}$, $\alpha_{22}$, $\alpha_{33}$, and $\alpha_{44}$ are determined, for example, by empirically testing cell assembly 110(1). Value $\theta$ is cell assembly 110(1) temperature rise, and $SOC_{max}$ is maximum permissible state of charge of cell assembly 110(1), in EQNS. 6 and 7. Function $f_{life}$ can take other forms than those of EQNS. 6 and 7 without departing from the scope hereof.

$$f_{life} = \alpha_1 * \theta + \alpha_2 * DOD + \alpha_3 * SOC_{max} + \alpha_4 * I_{cell} \quad \text{(EQN. 6)}$$

$$f_{life} = \alpha_1 * \theta + \alpha_2 * DOD + \alpha_3 * SOC_{max} + \alpha_4 * I_{cell} + \alpha_{11} * \theta^2 + \alpha_{22} * DOD^2 + \alpha_{33} * SOC_{max}^2 + \alpha_{44} * I_{cell}^2 \quad \text{(EQN. 7)}$$

Referring again to FIG. 19. In sub-block 1908, a respective BMS node controller electrically coupled to the first cell assembly is controlled to achieve the desired change in state of operation of the first cell assembly. In one example of sub-block 1908, system controller 102 controls BMS node controller 112(1) via control signal C(1) to achieve the desired change in operating state of first cell assembly 110(1) that was determined in sub-block 1906.

Changing an operating state of a cell assembly 110 in an energy storage system could affect operation of the energy storage system. For example, decreasing rate of discharge of cell assembly 110(1) decreases power capability of energy storage system 100, unless rate of discharge of one or more other cell assemblies 110 in energy storage system 100 is increased to compensate for the change in operating state of cell assembly 110(1). Accordingly, some embodiments of system controller 102 are configured to cause one or more BMS node controllers 112 to change operating state of respective cell assemblies 110 to at least partially compensate for a change in operation of another cell assembly 110 during its degradation mechanism mitigation. For example, system controller 102 may be configured to control a BMS node controller 112 to change a cell assembly 110's operation such that power contribution of energy storage system 100 and/or voltage $V_{bus}$ of energy storage system 100 does not change in response to change in operating state of another cell assembly 110. For example, if system controller 102 decreases a discharge rate of cell assembly 110(1) to mitigate a degradation mechanism of the cell assembly, system controller 102 may increase a discharge rate of cell assembly 110(2) to compensate for the discharge rate decrease of cell assembly 110(1).

Discussed below are several examples of how certain embodiments of system controller 102 may implement block 1904 of method 1900. System controller 102 is not limited, however, to these examples of mitigating degradation mechanisms. Additionally, while the examples below primarily refer to energy storage system 100 of FIG. 1, it is understood, that the examples are applicable to other energy storage systems, e.g., energy storage system 1100 (FIG. 11), energy storage system 1300 (FIG. 13), energy storage system 1500 (FIG. 15), energy storage system 1600 (FIG. 16), energy storage system 1700 (FIG. 17), and energy storage system 1800 (FIG. 18).

Figure 20:
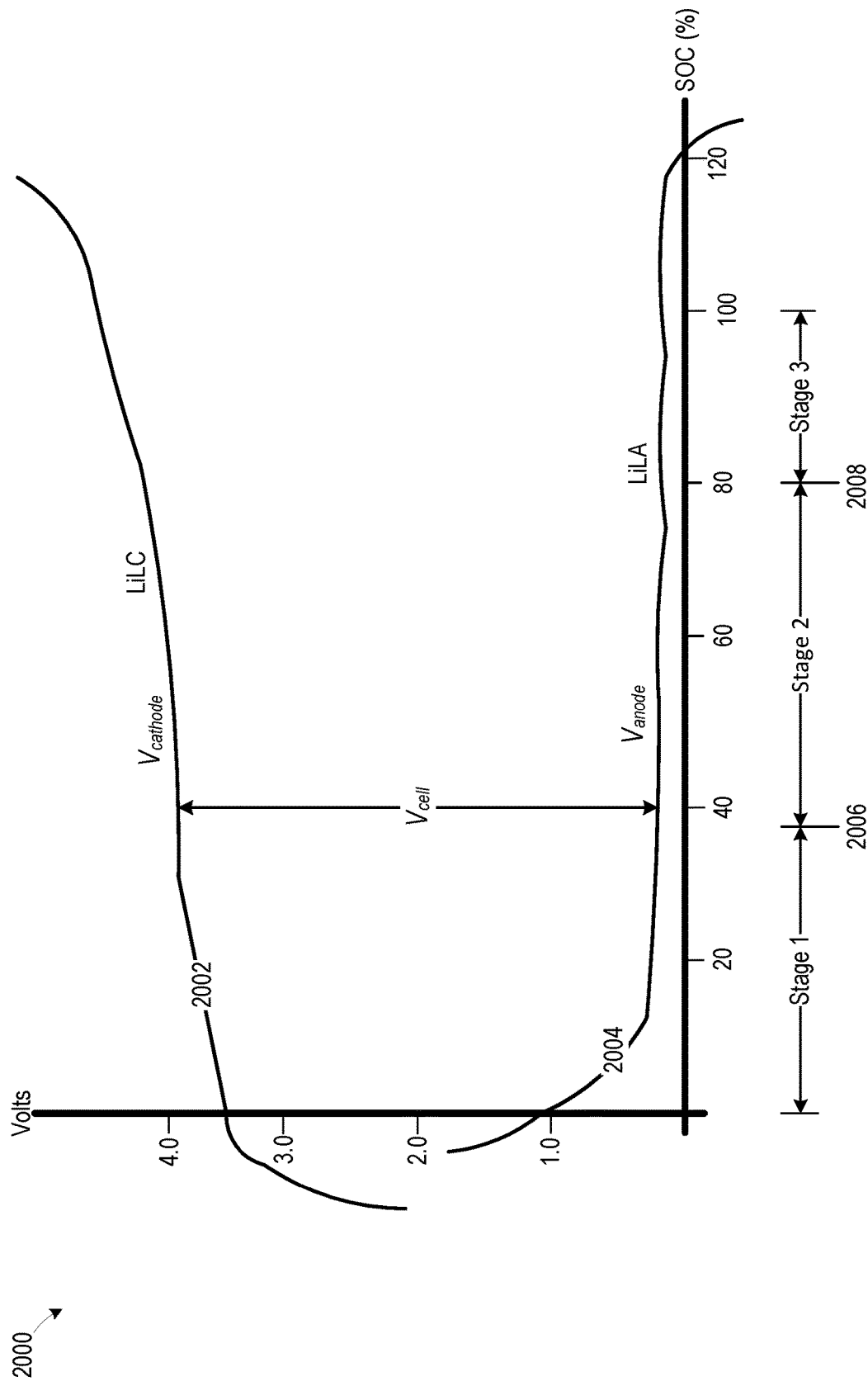
FIG. 20 is a graph of voltage versus state of charge of a single Lithium-ion electrochemical cell.

Some of the examples below refer to a battery voltage versus SOC graph. FIG. 20 shows one example of such graph. Specifically, FIG. 20 is a graph 2000 of voltage versus SOC for a battery embodied by a single Lithium-ion electrochemical cell. Curve 2002 represents cathode voltage $V_{cathode}$ versus SOC, and curve 2004 represents anode voltage $V_{anode}$ versus SOC. A difference between cathode voltage and anode voltage is equal to a voltage $V_{cell}$ across the electrochemical cell. $V_{cathode}$ is a function of cathode lithiation level, and $V_{anode}$ is a function of anode lithiation level. Graph 2000 may be divided into stages 1, 2, and 3. Stages 1 and 2 meet at a transition point 2006, and stages 2 and 3 meet at a transition point 2008.

As evident from FIG. 20, it is possible for the electrochemical cell to operate at a negative SOC, as well as at greater than one hundred percent SOC. Operation at a negative SOC may cause phase transformation at the cathode, as well as cause the anode to enter a corrosion regime characterized being by solid electrolyte interface (SEI) dissolution, anode current collector corrosion, and/or anode delamination. Operation at greater than one hundred percent SOC may cause electrolyte decomposition at the cathode, active material decomposition at the cathode, phase transformation at the cathode, increase in cathode impedance, gas evolution at the cathode, Lithium metallic plating at the anode, and/or increase in anode impedance. Furthermore, operation at transition points 2006 and 2008 may result in excessive stress on the electrochemical cell.

Lithium Inventory Decrease Mitigation

In some embodiments, cell assemblies 110 include one or more Lithium-ion electrochemical cells, and system controller 102 is configured to control a BMS node controller 112 to achieve one or more of the following changes in operating state of a cell assembly 110 electrically coupled thereto, to mitigate Lithium inventory decrease in the one or more electrochemical cells of the cell assembly. While the following changes in operating state are discussed with respect to an embodiment of a cell assembly 110 including a single Lithium-ion electrochemical cell, they are also applicable to an embodiment of a cell assembly 110 including a plurality of Lithium-ion electrochemical cells, including, but not limited to, cell assembly 300 (FIG. 3), cell assembly 400 (FIG. 4), cell assembly 500 (FIG. 5), cell assembly 1710 (FIG. 17), or cell assembly 1810 (FIG. 18).

(a) Limit maximum SOC of the electrochemical cell at elevated temperature as a function of electrochemical cell temperature, electrochemical cell Lithium inventory, and charge or discharge rate of the electrochemical cell, to mitigate Lithium inventory decrease in the electrochemical cell. Lithium-ion loss due to parasitic reactions non-linearly increases with temperature and/or charge/discharge rate, along with SOC. As such, limiting maximum SOC of an electrochemical cell helps counter effects of elevated temperature or high charge rate. If a substantial increase of Lithium loss in the electrochemical cell is detected compared to other electrochemical cells, the electrochemical cell may be operated at a lower charge or discharge rate to reduce electrochemical cell temperature. Charge or discharge rate of other electrochemical cells may be changed to compensate for the reduction in charge or discharge rate of the electrochemical cell experiencing Lithium loss, to deliver required power to the load. Also, the upper SOC of the electrochemical cell may be maintained at a substantially lower value over a certain temperature threshold compared to other electrochemical cells. Even more, the upper SOC level of the electrochemical cell may be controlled as a function of electrochemical cell temperature. Furthermore, power regulation may be combined with SOC regulation. Such operating strategies as described above will enable reduction in kinetics of side reactions and therefore reduce loss or irreversible consumption of Lithium.

(b) Control charge or discharge rate as a function of electrochemical cell temperature, electrochemical cell Lithium inventory, electrochemical cell SOC, and electrochemical cell anode impedance, to mitigate Lithium inventory decrease in the electrochemical cell. Controlling charge or discharge rate enables control of voltage in an electrochemical cell and therefore allows control of kinetics and rate of side reactions. At low SOC, a higher charge or discharge rate may be selected due to electrochemical cell voltage being substantially below a cut off voltage. As another example, charge or discharge rate may be reduced when operating an electrochemical cell in SOC ranges with higher impedances. At the same time, charge or discharge rates of other electrochemical cells which are in a SOC with lower cell impedances may be increased to match load power requirements.

(c) Control a lithiation level on a graphite anode of the electrochemical cell as a function of electrochemical cell temperature, electrochemical cell Lithium inventory, electrochemical cell anode impedance, and electrochemical cell charge or discharge rate, to prevent operation of the electrochemical cell in a third intercalation stage of the anode, thereby mitigating Lithium inventory decrease in the electrochemical cell. In this document, a "graphite anode" is an anode that contains graphite, but a "graphite anode" need not be exclusively formed of graphite.

(d) Increase de-lithiation of a cathode of an electrochemical cell, to increase Lithium inventory and thereby mitigate Lithium inventory decrease in the electrochemical cell. It should be noted that this mitigation technique is limited by cathode stability, electrolyte stability, loss of active material on the anode, and loss of active material on the cathode. Consequently, this mitigation technique will not work in all cases of decreased Lithium inventory.

Anode Impedance Growth Mitigation

In some embodiments, cell assemblies 110 include one or more Lithium-ion electrochemical cells, and system controller 102 is configured to control a BMS node controller 112 to achieve one or more of the following changes in operating state of a cell assembly 110 electrically coupled thereto, to mitigate anode impedance growth in the one or more electrochemical cells of the cell assembly. While the following changes in operating state are discussed with respect to an embodiment of a cell assembly 110 including a single Lithium-ion electrochemical cell, they are also applicable to an embodiment of a cell assembly 110 including a plurality of Lithium-ion electrochemical cells, including, but not limited to, cell assembly 300 (FIG. 3), cell assembly 400 (FIG. 4), cell assembly 500 (FIG. 5), cell assembly 1710 (FIG. 17), or cell assembly 1810 (FIG. 18).

(a) Limit charge or discharge rate of the electrochemical cell at high SOC and low temperature as a function of electrochemical cell temperature, SOC, and anode impedance, to mitigate impedance growth on the anode of the electrochemical cell. For example, in some embodiments, system controller 102 may control a BMS node controller 112 to limit a charge or discharge rate of an electrochemical cell electrically coupled thereto in response to one or more of (1) SOC of the electrochemical cell exceeding a first threshold value and (b) temperature of the electrochemical cell being below a second threshold value. In certain embodiments, the first threshold value is 70 percent SOC and the second threshold value is 25 degrees Celsius, although the first and second threshold values may vary, such as depending on the type of electrolyte of the electrochemical cell.

(b) Limit a maximum SOC of the electrochemical cell during long resting or idle periods, to mitigate impedance growth on an anode of the electrochemical cell. For example, in some embodiments, system controller 102 may control a BMS node controller 112 to limit a maximum SOC of an electrochemical cell electrically coupled thereto, in response to an anticipated resting or idle period of the electrochemical cell exceeding a threshold value.

(c) Limit SOC at high temperature to mitigate impedance growth on the anode of the electrochemical cell. For example, in some embodiments, system controller 102 may control a BMS node controller 112 to limit a maximum SOC of an electrochemical cell electrically coupled thereto, in response to a temperature of the electrochemical cell exceeding a threshold value.

(d) Avoid deep lithiation of an anode intercalation stage 3 of an electrochemical cell including a graphite anode, to mitigate impedance growth on the anode of the electrochemical cell. For example, in some embodiments, system controller 102 may control a BMS node controller 112 to prevent an electrochemical cell electrically coupled thereto from operating in a third intercalation stage of an anode of the electrochemical cell.

(e) Limit charge or discharge rate of an electrochemical cell in an anode intercalation stage 3 of the electrochemical cell, to avoid a side reaction on the anode and thereby mitigate impedance growth on the anode of the electrochemical cell. Charge or discharge rate may be limited in stage 3, for instance, by limiting electrochemical cell current to no more than $I_{bat\_max}$, as specified by EQN. 8 below, where $R_{anode}$ is anode impedance and $V_{a\_max}$ is a maximum permissible voltage across the anode in stage 3. In some embodiments, $V_{a\_max}$ is 80 millivolts.

$$I_{bat\_max} = \frac{V_{a\_max}}{R_{anode}} \quad \text{(EQN. 8)}$$

Cathode Impedance Growth Mitigation

In some embodiments, cell assemblies 110 include one or more Lithium-ion electrochemical cells, and system controller 102 is configured to control a BMS node controller 112 to achieve one or more of the following changes in operating state of a cell assembly 110 electrically coupled thereto, to mitigate cathode impedance growth in the one or more electrochemical cells of the cell assembly. While the following changes in operating state are discussed with respect to an embodiment of a cell assembly 110 including a single Lithium-ion electrochemical cell, they are also applicable to an embodiment of a cell assembly 110 including a plurality of Lithium-ion electrochemical cells, including, but not limited to, cell assembly 300 (FIG. 3), cell assembly 400 (FIG. 4), cell assembly 500 (FIG. 5), cell assembly 1710 (FIG. 17), or cell assembly 1810 (FIG. 18).

(a) Limit charge or discharge rate of an electrochemical cell at high SOC and low temperature as a function of an electrochemical cell temperature, SOC, and cathode impedance, to mitigate impedance growth on the cathode of the an electrochemical cell. For example, in some embodiments, system controller 102 may control a BMS node controller 112 to limit rate of charge or discharge of an electrochemical cell electrically coupled thereto in response to (1) SOC of the an electrochemical cell exceeding a first threshold value and (b) temperature of the electrochemical cell being below a second threshold value.

(b) Limit a maximum SOC of an electrochemical cell during long resting or idle periods, to mitigate impedance growth on the cathode of the electrochemical cell. For example, in some embodiments, system controller 102 may control a BMS node controller 112 to limit a maximum SOC of an electrochemical cell electrically coupled thereto, in response to an anticipated resting or idle period of the electrochemical cell exceeding a threshold value.

(c) Limit a maximum SOC of an electrochemical cell at high temperature, to mitigate impedance growth on the cathode of the electrochemical cell. For example, in some embodiments, system controller 102 may control a BMS node controller 112 to limit a maximum SOC of an electrochemical cell electrically coupled thereto in response to a temperature of the electrochemical cell exceeding a threshold value.

(d) Control active material loss on a cathode of an electrochemical cell to avoid deep de-lithiation of the cathode and thereby mitigate impedance growth on the cathode of the electrochemical cell. When loss of cathode material is detected, charge or discharge rates may be reduced at high SOC, and an upper cut off voltage for the cell may also be reduced. In response to detection of a high temperature gradient, charge or discharge rates of one or more other cells may be reduced.

(e) Limit charge or discharge rate of an electrochemical cell when a cathode of the electrochemical cell is operated at a low Lithium concentration level, to avoid material instabilities on cathode particle surfaces and thereby mitigate impedance growth on the cathode of the electrochemical cell. For example, in some embodiments, system controller 102 may control a BMS node controller 112 to limit a charge or discharge rate of an electrochemical cell electrically coupled thereto, to a value that is a function of impedance of a cathode of the electrochemical cell, in response to a Lithium concentration at the cathode of the electrochemical cell being below a threshold value. Charge or discharge rate may be limited when the cathode is operated at a low Lithium concentration level, for instance, by limiting electrochemical cell current to no more than $I_{cell\_max}$, as specified by EQN. 9 below, where $R_{anode}$ is anode impedance and f(LA) is function of anode lithiation level.

$$I_{cell\_max} = \frac{f(LA)}{R_{anode}} \quad \text{(EQN. 9)}$$

(f) Limit charge or discharge rate of an electrochemical cell when a cathode of the electrochemical cell is operated at high cathode potentials to avoid electrolyte decomposition in the electrochemical cell and thereby mitigate impedance growth on the cathode of the electrochemical cell. For example, in some embodiments, system controller 102 may control a BMS node controller 112 to limit a rate charge or discharge of an electrochemical cell electrically coupled thereto to a value that is a function of impedance of the cathode of the electrochemical cell, in response to a cathode potential of the electrochemical cell being above a threshold value. Charge or discharge rate may be limited when the cathode is operated at high cathode potentials, for instance, using EQN. 9 above.

Mitigation of Loss of Active Material on Anode

In some embodiments, cell assemblies 110 include one or more Lithium-ion electrochemical cells, and system controller 102 is configured to control a BMS node controller 112 to achieve one or more of the following changes in operating state of a cell assembly 110 electrically coupled thereto, to mitigate loss of active material on the anodes of the one or more electrochemical cells of the cell assembly. Loss of active material causes a nonlinear decrease in electrochemical cell capacity, ultimately leading to "rollover loss." Managing active material loss before it becomes a dominant degradation mechanism, such as by implementing one or more of the following operating state changes, may advantageously extend electrochemical cell useful life. While the following changes in operating state are discussed with respect to an embodiment of a cell assembly 110 including a single Lithium-ion electrochemical cell, they are also applicable to an embodiment of a cell assembly 110 including a plurality of Lithium-ion electrochemical cells, including, but not limited to, cell assembly 300 (FIG. 3), cell assembly 400 (FIG. 4), cell assembly 500 (FIG. 5), cell assembly 1710 (FIG. 17), or cell assembly 1810 (FIG. 18).

(a) Control charge or discharge rate of an electrochemical cell as a function of the loss of active material on the anode of the electrochemical cell, to mitigate loss of active material on the anode of the electrochemical cell. When an electrochemical cell experiences loss of active material at its anode, the same external current as before the active material loss translates to a higher local current density on the anode because there is less active material available to react. Higher current density can lead to increased heating and/or to increased Lithium plating. As such, reducing charge or discharge rate helps mitigate further anode degradation from loss of active material.

(b) Limit charge or discharge rate of an electrochemical cell including a graphite anode as a function of electrochemical cell temperature, anode lithiation level, and loss of active material on the anode, when transitioning from intercalation stage 1 to intercalation stage 2 and from intercalation state 2 to intercalation stage 3, to reduce stress in the electrochemical cell and thereby mitigate loss of active material on the anode of the electrochemical cell. For example, in some embodiments, system controller 102 may control a BMS node controller 112 to limit a rate of charge or discharge of an electrochemical cell electrically coupled thereto to a predetermined value in response to the electrochemical cell transitioning between intercalation stages of the electrochemical cell's anode.

(c) Limit loss of Lithium on a graphite anode of an electrochemical cell in certain ranges to intercalation stage transitions of the graphite anode, to mitigate loss of active material on the anode of the battery. For example, limiting charge to intercalation stage 2 of a graphite anode may halve anode degradation relative to charging to intercalation stage 1 of a graphite anode.

(d) Limit loss of Lithium on a Silicon anode of an electrochemical cell at low and high SOC to reduce stress in the electrochemical cell and thereby mitigate loss of active material on the anode of the electrochemical cell. For example, in some embodiments, system controller 102 may control a BMS node controller 112 to limit a loss of Lithium on the anode of an electrochemical cell electrically coupled thereto to one or more predetermined values during an intercalation first stage of the anode and an intercalation third stage of the anode. In this document, a "Silicon anode" is an anode that contains Silicon, but a "Silicon anode" need not be formed exclusively out of Silicon. For example, a "Silicon anode" may include Carbon as well as Silicon.

(e) Limit charge rate of an electrochemical cell in a low lithiation level region to lower tensile stress in electrochemical cell material and thereby mitigate loss of active material on the anode of the electrochemical cell. For example, in some embodiments, system controller 102 may control a BMS node controller 112 to limit a charge rate of an electrochemical cell electrically coupled thereto during a first intercalation stage of an anode of the electrochemical cell.

Mitigation of Loss of Active Material on Cathode

In some embodiments, cell assemblies 110 include one or more Lithium-ion electrochemical cells, and system controller 102 is configured to control a BMS node controller 112 to achieve one or more of the following changes in operating state of a cell assembly 110 electrically coupled thereto, to mitigate loss of active material on the cathodes of the one or more electrochemical cells of the cell assembly. While the following changes in operating state are discussed with respect to an embodiment of a cell assembly 110 including a single Lithium-ion electrochemical cell, they are also applicable to an embodiment of a cell assembly 110 including a plurality of Lithium-ion electrochemical cells, including, but not limited to, cell assembly 300 (FIG. 3), cell assembly 400 (FIG. 4), cell assembly 500 (FIG. 5), cell assembly 1710 (FIG. 17), or cell assembly 1810 (FIG. 18).

(a) Adjust charge or discharge rate of an electrochemical cell as a function of the loss of active material on a cathode of the electrochemical cell, to mitigate loss of active material on the cathode. When an electrochemical cell experiences loss of active material on its cathode, the same external current as before the active material loss translates to a higher local current density on the cathode because there is less active material available to react. Higher current density can lead to increased heating and/or to increased Lithium plating. As such, reducing charge or discharge rate helps mitigate further cathode degradation from loss of active material. Reducing charge or discharge rate according to loss of the active material maintains local current density at values that don't cause further degradation from delamination of the active cathode material. The reduced charge or discharge rate may be compensated for by increased charge or discharge of one or more other electrochemical cells.

(b) Limit charge or discharge rate of an electrochemical cell as a function of electrochemical cell temperature, loss of active material on an anode of the electrochemical cell, and lithiation level of a cathode of the electrochemical cell, in response to low lithiation levels on the cathode surface, to avoid high Lithium gradients (surface to bulk concentrations) and thereby mitigate loss of active material on the cathode. For example, in some embodiments, system controller 102 may control a BMS node controller 112 to limit a rate of charge or discharge of an electrochemical cell electrically coupled thereto in response to a lithiation level on a surface a cathode of the electrochemical cell being below a threshold value.

(c) Limit lithiation level of a cathode of an electrochemical cell at high and low SOC to lower electrode-level stress resulting from uneven lithiation, to mitigate loss of active material on the cathode. For example, in some embodiments, system 102 may control a BMS node controller 112 to limit a lithiation level of a cathode of an electrochemical cell electrically coupled thereto during a first intercalation stage and a third intercalation stage of the cathode.

(d) Reduce charge or discharge rate of an electrochemical cell in low and high cathode lithiation regions to lower electrode-level stress due to uneven lithiation and thereby mitigate loss of active material on the cathode.

Referring again to FIG. 19, method 1900 could be modified to mitigate hazardous failure mechanisms instead of cell assembly degradation mechanism. For example, FIG. 21 is a flow chart of a method 2100 for adaptive electrochemical cell management in an energy storage system including a plurality of BMS nodes to mitigate one or more cell assembly hazardous failure mechanisms. In a block 2102 of method 2100, a first signal is obtained, where the first signal identifies one or more hazardous failure mechanisms of a first cell assembly of the energy storage system. In one example of block 2102, system controller 102 obtains a signal identifying one or more hazardous failure mechanisms of cell assembly 110(1) of energy storage system. The hazardous failure mechanisms of cell assembly 110(1) may be unique to cell assembly 110(1), or they may be common to a plurality of cell assemblies 110 in energy storage system, such as a plurality of cell assemblies 110 having common characteristics. System controller 102 obtains the signal identifying one or more hazardous failure mechanisms of cell assembly 110(1), for example, in a manner analogous to that discussed above with respect to block 1902 method 1900.

Examples of possible cell assembly 110 hazardous failure mechanisms include, but are not limited to, one or more of Lithium plating on electrodes of one or more electrochemical cells of cell assembly 110, mechanical shorting in one or more electrochemical cells of cell assembly 110, and gas evolution in one or more electrochemical cells of cell assembly 110. In some embodiments, the hazardous failure mechanisms for a particular cell assembly 110, or for a particular group of cell assemblies 110, are expressed as a vector of a plurality of hazardous failure mechanisms.

Referring again to FIG. 21, in a block 2104 of method 2100, a respective BMS node controller electrically coupled to the first cell assembly of a first BMS node is controlled in response to the first signal obtained in block 2102, to change a state of operation of the first cell assembly to mitigate the one or more hazardous failure mechanisms of the first cell assembly, independently of operation of other BMS nodes of the energy storage system. In one example of block 2104, system controller 102 generates control signal C(1) to control BMS node controller 112(1) to change a state of operation of cell assembly 110(1) in response to the signal identifying one or more hazardous failure mechanisms of cell assembly 110(1), to mitigate the hazardous failure mechanisms independently of operation of other BMS nodes 109, and associated cell assemblies 110, in energy storage system. For example, BMS node controller 112(1) may directly or indirectly change one or more of cell assembly voltage $V_{cell}$, cell assembly current $I_{cell}$, cell assembly temperature $T_{cell}$, cell assembly power $P_{cell}$, cell assembly charge or discharge rate $C_{rate}$, cell assembly depth of discharge DOD, cell assembly anode lithiation level LiLA, and cell assembly cathode lithiation level LiLC, to mitigate the one or more hazardous failure mechanisms of cell assembly 110(1). In some embodiments, state of operation of cell assembly 110(1) is a single operating characteristic of the cell assembly, e.g. $V_{cell}$, $I_{cell}$, $T_{cell}$, $P_{cell}$, $C_{rate}$, DOD, LILA, or LiLC. In some other embodiments, state of operation of cell assembly 110(1) is a vector representing a plurality of operating characteristics of the cell assembly, such as two or more of $V_{cell}$, $I_{cell}$, $T_{cell}$, $P_{cell}$, $C_{rate}$, DOD, LILA, or LiLC of cell assembly 110(1).

Block 2104 of method 2100 optionally includes sub-blocks 2106 and 2108. In sub-block 2106, a desired change in state of operation of the first cell assembly is determined to mitigate the one or more hazardous failure mechanisms of the first cell assembly. In one example of sub-block 2106, system controller 102 determines a desired change in state of operation of cell assembly 110(1), to mitigate the hazardous failure mechanisms of cell assembly 110(1). For example, in an embodiment where system controller 102 is embodied as depicted in FIG. 6, processor 602 may execute instructions 608 stored in memory 604 to determine the desired change in cell assembly 110(1) operating state based on the hazardous failure mechanisms. For instance, instructions 608 may include a lookup table of hazardous failure mechanisms and corresponding desired changes in cell assembly operating state for mitigating the hazardous failure mechanisms, and processor 602 may select a change in cell assembly operating state corresponding to the hazardous failure mechanism for cell assembly 110(1). As another example, in an embodiment where system controller 102 is embodied as depicted in FIG. 7, global processor 710 may determine a desired change in operating state of cell assembly 110(1) by comparing system data 720 to aggregate data 722, optionally using self-learning methodologies.

In sub-block 2108, a respective BMS node controller electrically coupled to the first cell assembly is controlled to achieve the desired change in state of operation of the first cell assembly. In one example of sub-block 1908, system controller 102 controls BMS node controller 112(1) to achieve the desired change in operating state of first cell assembly 110(1) that was determined in sub-block 1906.

Changing an operating state of a cell assembly 110 in energy storage system 100 to mitigate hazardous failure mechanisms could affect operation of energy storage system 100. Accordingly, some embodiments of system controller 102 are configured to cause one or more BMS node controllers 112 to change operating state of respective cell assemblies 110 to at least partially compensate for a change in operation of another cell assembly 110 during its hazardous failure mechanism mitigation. For example, system controller 102 may be configured to control a BMS node controller 112 to change a cell assembly 110's operation such that power contribution of energy storage system 100 and/or voltage $V_{bus}$ of energy storage system 100 does not change in response to change in operating state of another cell assembly 110. For example, if system controller 102 increases a discharge rate of cell assembly 110(1) to mitigate a hazardous failure mechanism of the cell assembly, system controller 102 may decrease a discharge rate of cell assembly 110(2) to compensate for the discharge rate increase of cell assembly 110(1).

Figure 22:
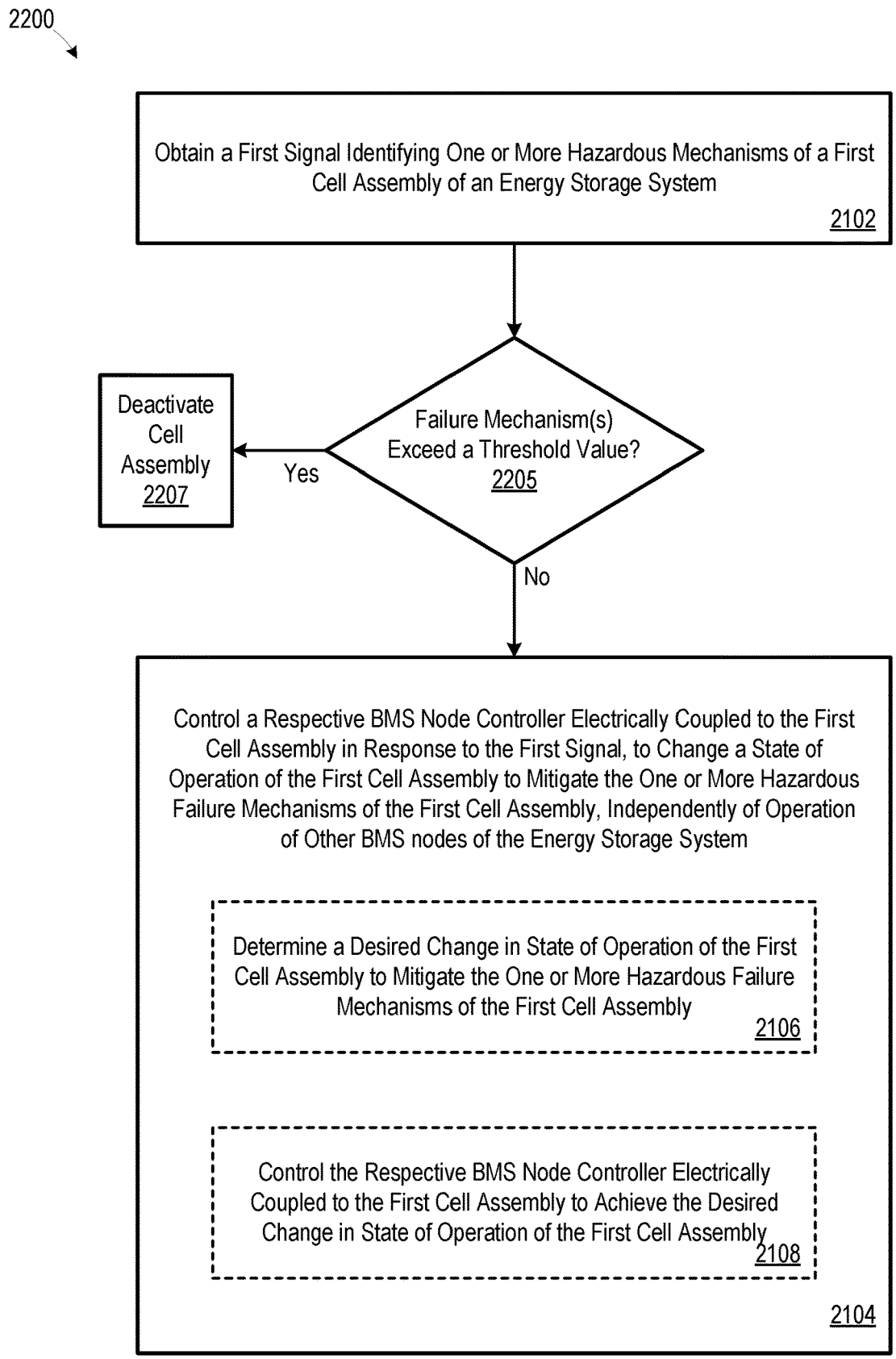
FIG. 22 is a flow chart of another method for adaptive electrochemical cell management in an energy storage system including a plurality of BMS nodes for mitigating one or more electrochemical cell hazardous failure mechanisms, according to an embodiment.

FIG. 22 is a flow chart of a method 2200 for adaptive electrochemical cell management in an energy storage system including a plurality of BMS nodes to mitigate one or more cell assembly hazardous failure mechanisms. Method 2200 is an alternate embodiment of method 2100 and includes blocks 2205 and 2207 in addition to the blocks of method 2100. Block 2205 is a decision block which determines whether the one or more hazardous failure mechanisms of the first cell assembly of the energy storage system, as identified by the first signal, exceed a threshold value. In one example of block 2205, system controller 102 determines whether a single hazardous failure mechanism, as identified by the first signal, exceeds a threshold value v. In another example of block 2205, system controller 102 evaluates EQN. 10 below to determine a composite hazardous failure value FL, which is a weighted function of n hazardous failure mechanisms fl, where w is a weighing coefficient for the failure mechanism fl. System controller 102 then determines in block 2205 whether the composite hazardous failure value FL exceeds a threshold value v.

$$FL = \sum_{1}^{n} w_i fl_i \qquad \text{(EQN. 10)}$$

If the result of decision bock 2205 is no, method 2200 proceeds to block 2104 to mitigate the one or more hazardous failure mechanisms, as discussed above with respect to FIG. 21. If the result of decision block 2205 is yes, method 2200 proceeds to block 2207 where the cell assembly is deactivated, instead of being subject to hazardous failure mechanism mitigation.

Discussed below are several examples of how certain embodiments of system controller 102 may implement block 2104 of methods 2100 and 2200, as well how certain embodiments of system controller 102 may implement block 2207 of method 2200. System controller 102 is not limited, however, to these examples of mitigating hazardous failure mechanisms or deactivating cell assemblies in response to identified hazardous failure mechanisms.

Mitigation of Metallic Plating on an Electrochemical Cell Electrode

In some embodiments, cell assemblies 110 include one or more Lithium-ion electrochemical cells, and system controller 102 is configured to control a BMS node controller 112 to achieve one or more of the following changes in operating state of a cell assembly 110 electrically coupled thereto, to mitigate metallic plating on electrodes of the one or more electrochemical cells of the cell assembly. While the following changes in operating state are discussed with respect to an embodiment of a cell assembly 110 including a single Lithium-ion electrochemical cell, they are also applicable to an embodiment of a cell assembly 110 including a plurality of Lithium-ion electrochemical cells, including, but not limited to, cell assembly 300 (FIG. 3), cell assembly 400 (FIG. 4), cell assembly 500 (FIG. 5), cell assembly 1710 (FIG. 17), or cell assembly 1810 (FIG. 18).

(a) Limit charge or discharge rate of an electrochemical cell at high SOC levels, to mitigate metallic plating on an electrode of the electrochemical cell. For example, in some embodiments, system controller 102 may control a BMS node controller 112 to decrease a charge or discharge rate of an electrochemical cell electrically coupled thereto, in response to a SOC of the electrochemical cell exceeding a threshold value.

(b) Reduce SOC of electrochemical cell with a graphite anode such that the electrochemical cell never operates in a third intercalation stage of the anode, to mitigate metallic plating on an electrode the electrochemical cell.

(c) Trigger an impedance assessment of an anode of an electrochemical cell.

(d) Regulate charge and discharge rates of an electrochemical cell with a graphite anode as a function of anode-level impedance of the electrochemical cell, to mitigate metallic plating on an electrode the electrochemical cell. For example, charge and discharge rates of an electrochemical cell may be controlled to control surface potential of a graphite anode of the electrochemical cell.

(e) Perform a fast discharge of an electrochemical cell to strip metallic plating from an electrode of the electrochemical cell, to mitigate metallic plating on an electrode of the electrochemical cell. For example, in some embodiments, system controller 102 may control a BMS node controller 112 to increase a discharge rate of an electrochemical cell electrically coupled thereto to strip metallic plating on an electrode of the electrochemical cell.

Mitigation of Mechanical Shorting

In some embodiments, cell assemblies 110 include one or more Lithium-ion electrochemical cells, and system controller 102 is configured to control a BMS node controller 112 to achieve one or more of the following changes in operating state of a cell assembly 110 electrically coupled thereto, to mitigate mechanical shorting in the one or more electrochemical cells of the cell assembly. While the following changes in operating state are discussed with respect to an embodiment of a cell assembly 110 including a single Lithium-ion electrochemical cell, they are also applicable to an embodiment of a cell assembly 110 including a plurality of Lithium-ion electrochemical cells, including, but not limited to, cell assembly 300 (FIG. 3), cell assembly 400 (FIG. 4), cell assembly 500 (FIG. 5), cell assembly 1710 (FIG. 17), or cell assembly 1810 (FIG. 18).

(a) Modulate charge or discharge rate of an electrochemical cell as function of SOC of the electrochemical cell, to mitigate mechanical shorting in the electrochemical cell.

(b) Adjust an allowable SOC range of an electrochemical cell including a Silicon anode as a function of leakage current, so that SOC remains above a predetermined minimum value, to mitigate mechanical shorting in the electrochemical cell.

(c) Adjust an allowable SOC range of an electrochemical cell including a Graphite anode as a function of leakage current, so that SOC remains below a predetermined maximum value, to mitigate mechanical shorting in the electrochemical cell. For example, in some embodiments, system controller 102 may control a BMS node controller 112 to cause an electrochemical cell electrically coupled thereto to operate solely in a third intercalation stage of an anode of the electrochemical cell.

Mitigation of Gas Evolution

In some embodiments, cell assemblies 110 include one or more Lithium-ion electrochemical cells, and system controller 102 is configured to control a BMS node controller 112 to achieve one or more of the following changes in operating state of a cell assembly 110 electrically coupled thereto, to mitigate gas evolution in the one or more electrochemical cells of the cell assembly. While the following changes in operating state are discussed with respect to an embodiment of a cell assembly 110 including a single Lithium-ion electrochemical cell, they are also applicable to an embodiment of a cell assembly 110 including a plurality of Lithium-ion electrochemical cells, including, but not limited to, cell assembly 300 (FIG. 3), cell assembly 400 (FIG. 4), cell assembly 500 (FIG. 5), cell assembly 1710 (FIG. 17), or cell assembly 1810 (FIG. 18).

(a) Reduce SOC of an electrochemical cell as function of gas evolution in the electrochemical cell and temperature of the electrochemical cell, to mitigate gas evolution in the electrochemical cell. SOC can be higher in cases where the electrochemical cell temperature is low.

(b) In response to an increase in a temperature of an electrochemical cell, reduce SOC of the electrochemical cell by discharging the electrochemical cell or by not charging the electrochemical cell as high, to mitigate gas evolution in the electrochemical cell. For example, in some embodiments, system controller 102 may control a BMS node controller 112 to reduce a maximum permissible SOC of an electrochemical cell electrically coupled thereto, in response to a temperature of the electrochemical cell exceeding a threshold value.

Safely Deactivate Cell Assembly in Response to Detection of Metallic Plating

In some embodiments, cell assemblies 110 include one or more Lithium-ion electrochemical cells, and system controller 102 is configured to control a BMS node controller 112 to perform the following operations on a cell assembly 110 electrically coupled thereto, to safely deactivate the cell assembly in response to identification of metallic plating on an electrode of the one or more electrochemical cells of the cell assembly.

(a) Increase rate of discharge of the cell assembly, independently of operation of other cell assemblies 110, and associated BMS nodes 109, of energy storage system 100, to strip the metallic plating on respective electrodes of the one or more electrochemical cells of the cell assembly, when the cell assembly is at a high SOC; and (b) Decrease rate of discharge of the cell assembly, in response to a temperature of the cell assembly exceeding a threshold value, when approaching a low SOC of the cell assembly.

Safely Deactivate Cell Assembly in Response to Detection of Mechanical Shorting in the Cell Assembly In some embodiments, cell assemblies 110 include one or more Lithium-ion electrochemical cells, and system controller 102 is configured to control a BMS node controller 112 to perform the following operations on a cell assembly 110 electrically coupled thereto, to safely deactivate the cell assembly in response to identification of mechanical shorting in the cell assembly:

(a) Perform a fast discharge of the cell assembly when SOC is within a high range, e.g. 80% to 100% SOC; and (b) Bypass the cell assembly, such as by opening a switching device 808 and closing a switching device 814 (FIG. 8) of a respective BMS node controller electrically coupled thereto.

For example, in some embodiments, system controller 102 is configured to (1) control a respective BMS node controller 112 electrically coupled to a cell assembly 110 in response to a signal identifying a mechanical short in the cell assembly (or its constituent one or more electrochemical cells), to increase rate of discharge of the cell assembly independently of operation of other cell assemblies 110, and associated BMS nodes 109, of energy storage system 100 to discharge the cell assembly; and (2) in response to a SOC of the cell assembly falling below a predetermined value, bypassing the assembly such that electric current flows through energy storage system 100 without flowing through the cell assembly.

Safely Deactivate Cell Assembly in Response to Detection of Gas Evolution in an Electrochemical Cell of the Cell Assembly In some embodiments, cell assemblies 110 include one or more Lithium-ion electrochemical cells, and system controller 102 is configured to control a BMS node controller 112 to perform the following operations on a cell assembly 110 electrically coupled thereto, to safely deactivate the cell assembly in response to identification of gas evolution in an electrochemical cell of the cell assembly:

(a) Perform a fast discharge of the cell assembly when SOC is within a high range, e.g. within 80% to 100% SOC;

(b) Once SOC falls to threshold value, e.g. 75% to 85% SOC, resume discharging at a normal rate; and (c) Bypass the cell assembly, such as by opening a switching device 808 and closing a switching device 814 (FIG. 8) of a respective BMS node controller electrically coupled thereto, once the SOC to falls to approximately zero.

For example, in some embodiments, system controller 102 is configured to (1) control a respective BMS node controller 112 electrically coupled to a cell assembly 110 in response to a signal identifying gas evolution in an electrochemical cell of the cell assembly to increase rate of discharge of the cell assembly, independently of operation of other cell assemblies 110, and associated BMS nodes 109, of energy storage system 100, to discharge the cell assembly, and (2) in response to a SOC of the cell assembly falling below a predetermined value, controlling the respective BMS node controller electrically coupled to the cell assembly to decrease a rate of discharge of the cell assembly.

Multiple Control Loops

Some embodiments of system controller 102 are configured to implement multiple control loops, such as a first control loop for balancing cell assembly 110 SOC and a second control loop for mitigating cell assembly degradation and/or failure mechanisms. In some embodiments, the first control loop has a higher bandwidth and/or gain than the second control loop, to maximize cell assembly energy throughput on each charge/discharge cycle, while achieving a predetermined lifetime characteristic of the plurality of cell assemblies 110 of energy storage system 100. Examples of the predetermined lifetime characteristic include, but are not limited to (1) a maximum collective lifetime of the plurality of cell assemblies 110 of energy storage system 100, (2) a common lifetime for each cell assembly 110 of energy storage system 100, (3) a common state of degradation for each cell assembly 110 of energy storage system 100, e.g. as defined by a degradation mechanism vector, (4) a common state of health for each cell assembly 110 of energy storage system 100, where state of health includes, for example, cell assembly capacity loss and/or cell assembly impedance growth.

Figure 23:
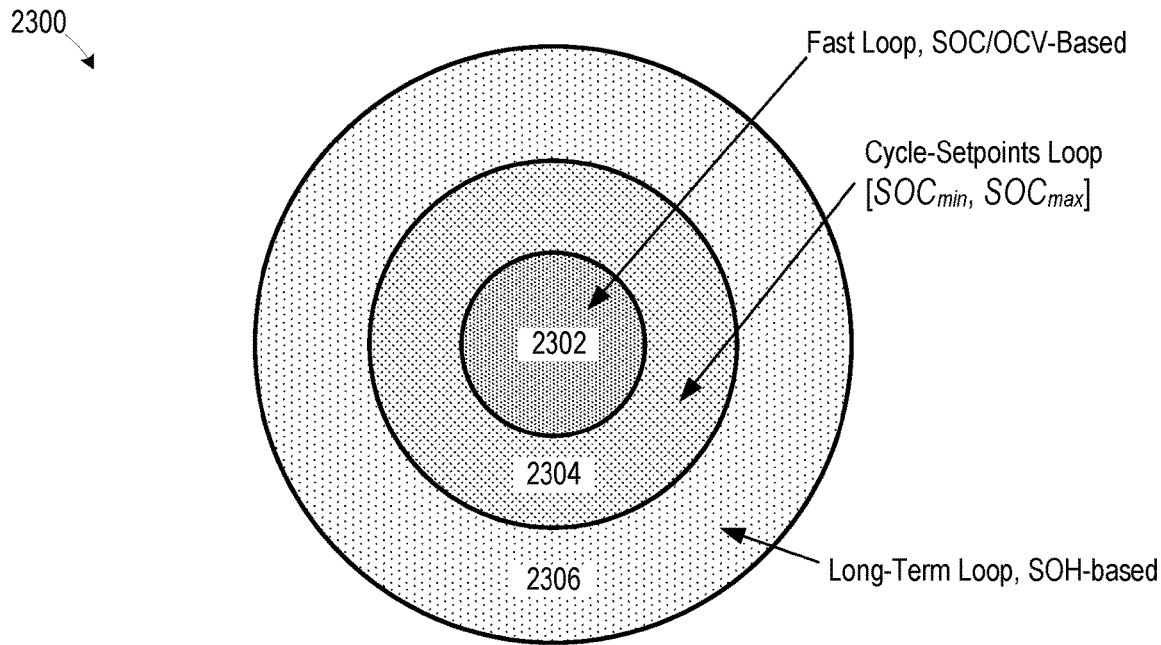
FIG. 23 is a diagram illustrating relationships among control loops in one embodiment of a system controller implementing three control loops, according to an embodiment.

FIG. 23 is a diagram illustrating relationships among control loops in one embodiment of system controller 102 implementing an inner control loop 2302, a middle control loop 2304, and an outer control loop 2306. Inner control loop 2302 is a fast control loop which balances cell assemblies 110 in energy storage system 100, such as by balancing cell assembly 110 OCV or by directly balancing cell assembly 110 SOC. Middle control loop 2304 sets SOC boundaries for each cell assembly 110, i.e. a minimum permissible state of charge $SOC_{min}$ and a maximum permissible state of charge $SOC_{max}$ for each cell assembly 110. Outer control loop 2106 is a slow (long-term), SOH-based control loop which achieves a predetermined lifetime characteristic of cell assemblies 110 in energy storage system 100, such as one of the predetermined lifetime characteristics discussed above, at least partially by controlling middle control loop 2304 to adjust $SOC_{min}$ and $SOC_{max}$.

Figure 24:
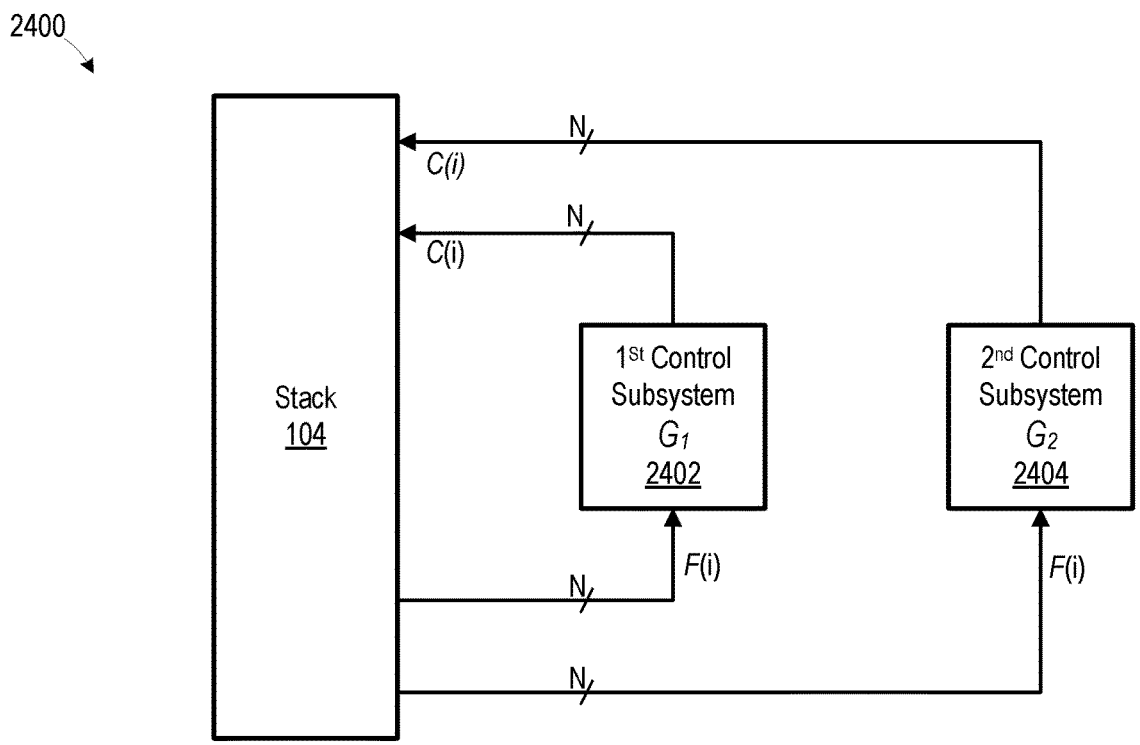
FIG. 24 is a block diagram of an energy storage system implementing a plurality of a control loops, according to an embodiment.

FIG. 24 is a block diagram of an energy storage system 2400 implementing a plurality of a control loops. Energy storage system 2400 is an embodiment of energy storage system 100, and energy storage system 2400 includes a first control subsystem 2402 and a second control subsystem 2404. First and second control subsystems 2402 and 2404 are implemented by an embodiment of system controller 102 (not shown in FIG. 21). Although first and second control subsystems 2402 and 2404 are illustrated as being logically separate subsystems, these two control subsystems may share common elements. Details of stack 104 are not shown for illustrative clarity. Stack 104 could be replaced with another configuration of BMS nodes, e.g., with BMS nodes being electrically coupled in parallel, such as illustrated in FIG. 16, FIG. 17, or FIG. 18.

First control subsystem 2402 is configured to, at least in part, (1) determine a respective desired power contribution of each cell assembly 110 of stack 104 at least partially to maximize collective energy throughput of stack 104, and (2) control a respective BMS node controller 112 electrically coupled to each cell assembly 110, to achieve the desired power contribution of the cell assembly.

Second control subsystem 2404 is configured to control the respective BMS node controller 112 electrically coupled to each cell assembly 110 to achieve a predetermined lifetime characteristic of the plurality of cell assemblies 110 in stack 104, such as one of the predetermined lifetime characteristics discussed above. First and second control subsystems 2402 and 2404 have respective first and second bandwidths, where the second bandwidth is less than the first bandwidth. Additionally, in some embodiments, first and second control subsystems 2402 and 2404 have respective first and second maximum gains, where the second maximum gain is less than the first maximum gain.

Figure 25:
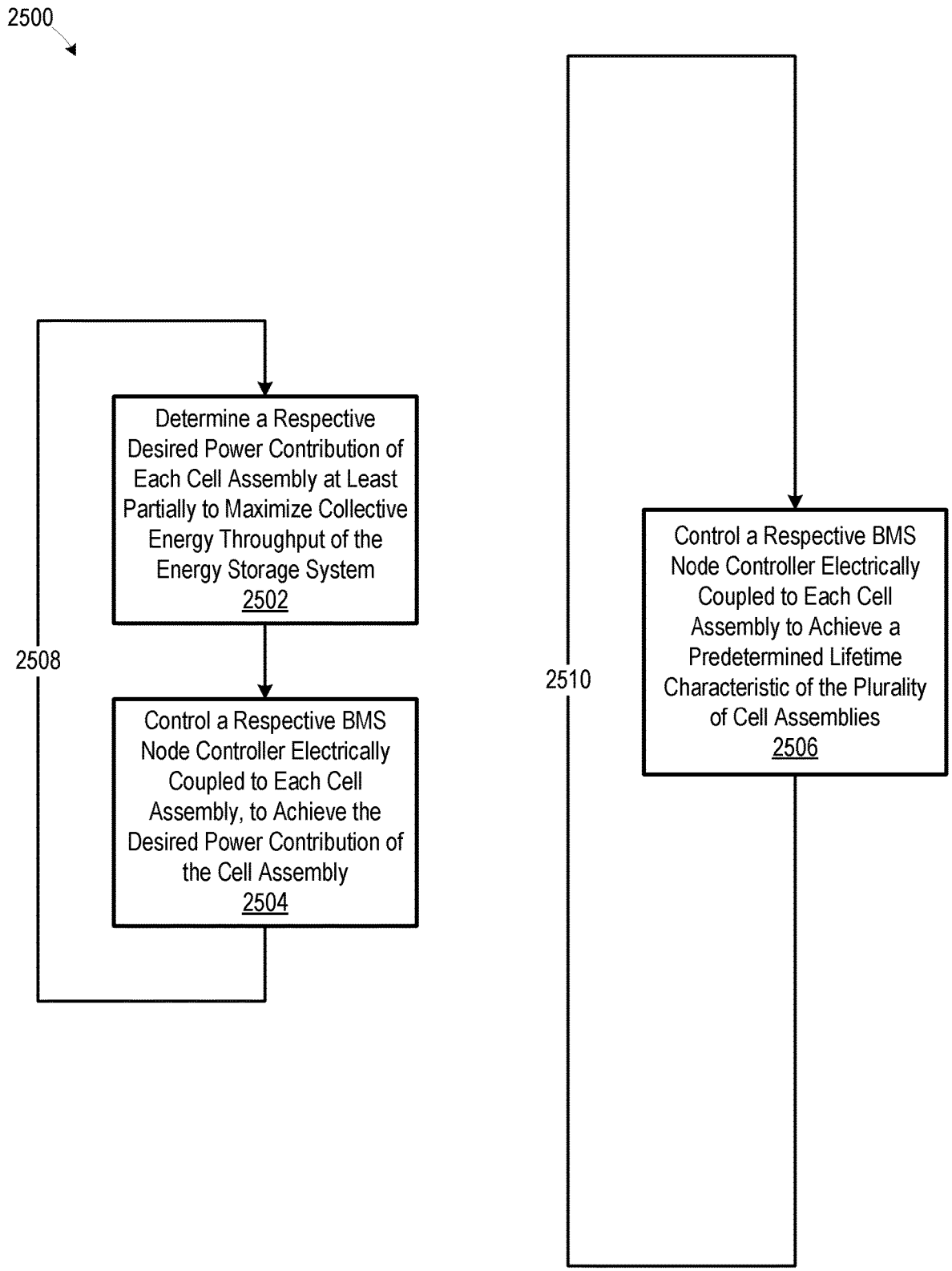
FIG. 25 is a flowchart of another method for adaptive electrochemical cell management in an energy storage system including a plurality of cell assemblies, according to an embodiment.

FIG. 25 is a flowchart of a method 2500 for adaptive electrochemical cell management in an energy storage system including a plurality of cell assemblies. In a block 2502, a respective desired power contribution of each cell assembly of the energy storage system is determined to at least partially to maximize collective energy throughput of the energy storage system, using a first control subsystem having a first bandwidth. In one example of block 2502, first control subsystem 2402 determines a respective desired power contribution of each cell assembly 110 of stack 104 to balance voltage of each cell assembly 110 or SOC of each cell assembly 110. In a block 2504, a respective BMS node controller electrically coupled to each cell assembly is controlled to achieve the desired power contribution of the cell assembly, using the first control subsystem. In one example of block 2504, first control subsystem 2402 controls a respective BMS node controller 112 electrically coupled to each cell assembly 110 to achieve the desired power contribution of the cell assembly. The first control subsystem of method 2500 has a relatively high bandwidth, and blocks 2502 and 2504 accordingly repeat at a high rate, as symbolically shown by the relatively short return loop arrow 2508.

In a block 2506 of method 2500, a respective BMS node controller electrically coupled to each cell assembly is controlled to achieve a predetermined lifetime characteristic of the plurality of cell assemblies, using a second control subsystem having a second bandwidth that is less than the first bandwidth. In one example of block 2506, second control subsystem 2404 controls the respective BMS node controller 112 electrically coupled to each cell assembly 110 to achieve a predetermined lifetime characteristic of the plurality of cell assemblies 110, such as one of the predetermined lifetime characteristics discussed above. The second control subsystem of method 2500 has a relatively low bandwidth, and block 2506 accordingly repeat at a low rate, as symbolically shown by the relatively long return loop arrow 2510.

Figure 26:
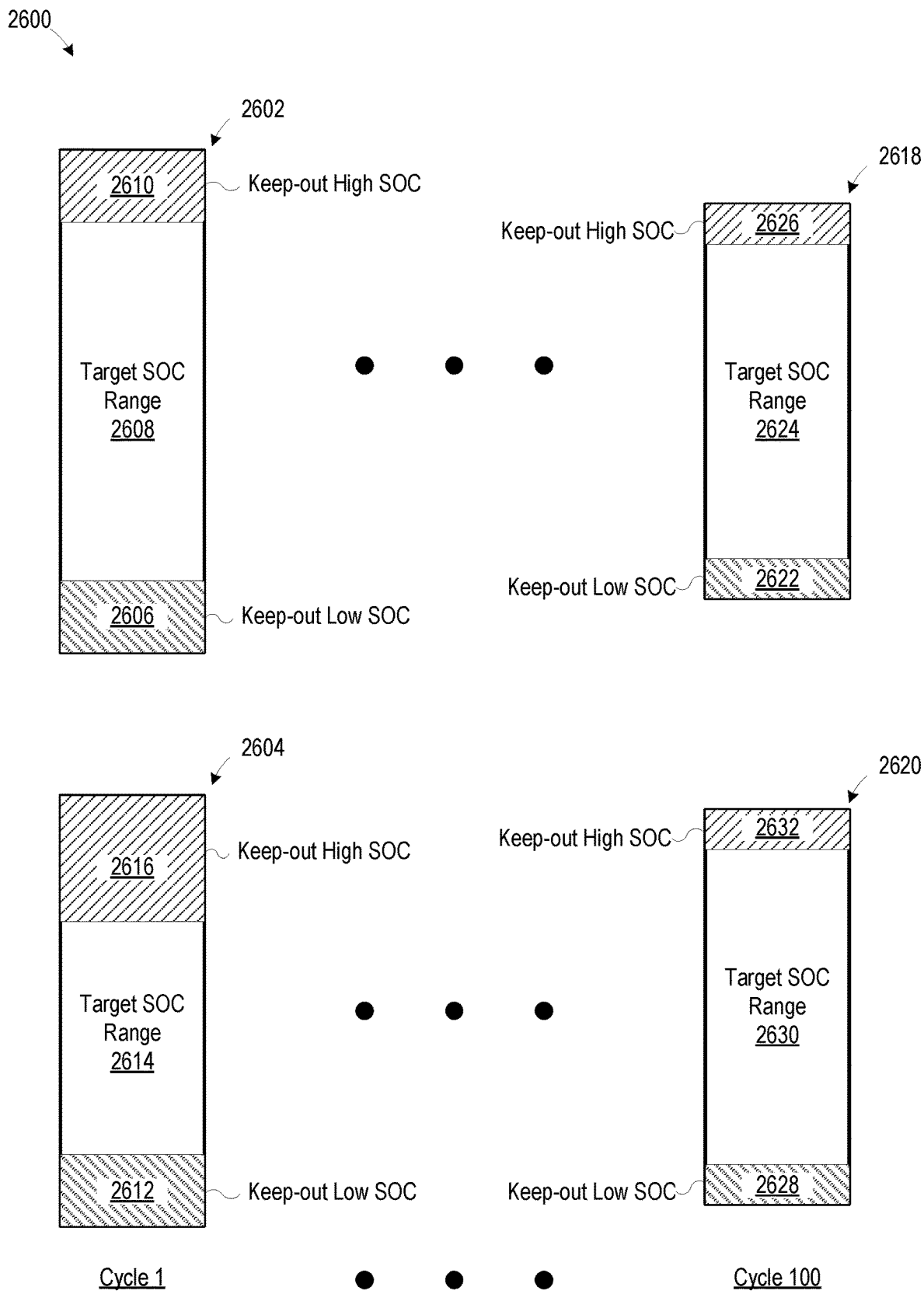
FIG. 26 illustrates one example of operation of an energy storage system implementing two control loops, according to an embodiment.

FIG. 26 illustrates one example of operation an energy storage system where an embodiment of system controller 102 implements the three control loops of FIG. 23 to achieve common SOH of cell assemblies 110 in energy storage system 100. Chart 2602 depicts operating range of a first cell assembly 110 of energy storage system 100 during a first cycle (charge or discharge cycle), and chart 2604 depicts operating range of a second cell assembly 110 of energy storage system 100 during the first cycle. The first cell assembly 110 has a keep-out low SOC region 2606, a target SOC range 2608, and a keep-out high SOC region 2610, during the first cycle. The second cell assembly 110 has a keep-out low SOC region 2612, a target SOC range 2614, and a keep-out high SOC region 2616, during the first cycle. Inner control loop 2302 balances cell assemblies 110 in energy storage system 100 during the first cycle, such as by balancing cell assembly 110 OCV or by directly balancing cell assembly 110 SOC.

As evident when comparing charts 2602 and 2604, the two cell assemblies 110 have significantly different SOH during the first cycle. For example, the first cell assembly 110 has a significantly larger target SOC range 2608 than the target SOC range 2614 of the second cell assembly 110. However, in this example, outer loop 2306 controls charge and discharge of the cell assemblies to achieve a common SOH over multiple cycles. For example, chart 2618 depicts operating range of the first cell assembly 110 during a one hundredth cycle (charge or discharge), and chart 2620 depicts operating range of the second cell assembly 110 of energy storage system 100 during the one hundredth cycle. The first cell assembly 110 has a keep-out low SOC region 2622, a target SOC range 2624, and a keep-out high SOC region 2626, during the one hundredth cycle. The second cell assembly 110 has a keep-out low SOC region 2628, a target SOC range 2630, and a keep-out high SOC region 2632, during the one hundredth cycle. As evident when comparing charts 2618 and 2620, the two cell assemblies have a substantially common SOH at the one hundredth cycle, showing that outer control loop 2306 has caused SOH of the first and second cell assemblies to converge over 100 cycles. Although FIG. 26 depicts operation of only two cell assemblies 110, the operating principles illustrated in FIG. 26 could be extended to additional cell assemblies 110.

Preventative Discharge

Applicant has determined that metallic plating on an electrochemical cell electrode, e.g. Lithium plating at the surface of a Lithium-ion electrochemical cell electrode, can be prevented or mitigated by applying a large discharge current to the electrochemical cell at the beginning of discharge, even if a load does not demand a large current. The large discharge current, for example, strips metallic plating on one or more electrodes of the electrochemical cell. Accordingly, some embodiments of system controller 102 are configured to control BMS node controllers 112 to perform preventative discharge on cell assemblies 110, to prevent build up of plated metal, such as Lithium, on an electrochemical cell electrode. For example, some embodiments of system controller 102 are configured to control BMS node controllers 112 to apply a preventative discharge current to cell assemblies 110 at the beginning of a discharge cycle, where the preventative discharge current is larger than the cell assembly's normal discharge current. The preventative discharge current is applied, for example, to one cell assembly 110 at a time. In some embodiments, a preventative discharge current is applied to cell assemblies 110 in a predetermined sequence.

For example, at the beginning of a discharge cycle, cell assembly 110(1) may be selected for preventing discharge, and in response, power contribution of cell assembly 110(1) may be increased beyond its normal value, to apply a preventative (large) discharge current to cell assembly 110(1). Respective power contributions of one or more other cell assemblies 110 in energy storage system 100 may simultaneously be reduced to compensate for the increase in power contribution of cell assembly 110(1), such that bus voltage $V_{bus}$ does not substantially change during preventative discharge of cell assembly 110(1). After applying a preventative discharge current to cell assembly 110(1), cell assembly 110(1) may be returned to normal operation by reducing its respective power contribution to a normal level, e.g. to a level which achieves balanced voltage or balanced SOC among cell assemblies 110. Cell assembly 110(2) may then be selected for preventative discharge, and in response, power contribution of cell assembly 110(2) may be increased beyond its normal value, to apply a preventative discharge current to cell assembly 110(2). Respective power contributions of one or more other cell assemblies 110 in energy storage system 100 may simultaneously be reduced to compensate for the increase in power contribution of cell assembly 110(2), such that bus voltage $V_{bus}$ does not substantially charge during preventative discharge of cell assembly 110(2). After applying a preventative discharge current to cell assembly 110(2), cell assembly 110(2) may be returned to normal operation by reducing its respective power contribution to a normal level, e.g. to achieve balanced voltage or balanced SOC of cell assemblies 110. Additionally, cell assemblies 110 may subsequently be selected for preventative discharge until all cell assemblies 110 in energy storage system 100 have been selected for preventative discharge at least once.

In some embodiments, system controller 102 is configured to perform preventative discharge at the beginning of each discharge cycle of cell assemblies 110. In some other embodiments, system controller 102 is configured to perform preventative discharge on a periodic basis, such as after a predetermined number of charge and/or discharge cycles of cell assemblies 110, or after a predetermined amount of time has elapsed. Additionally, certain embodiments of system controller 102 are configured to perform preventative discharge on a cell assembly 110 in response to a signal indicated an anomaly or safety issue in the cell assembly, e.g. metallic plating on an electrode in electrochemical cell of the cell assembly crossing a threshold value, such as discussed above with respect to hazardous failure mitigation.

Figure 27:
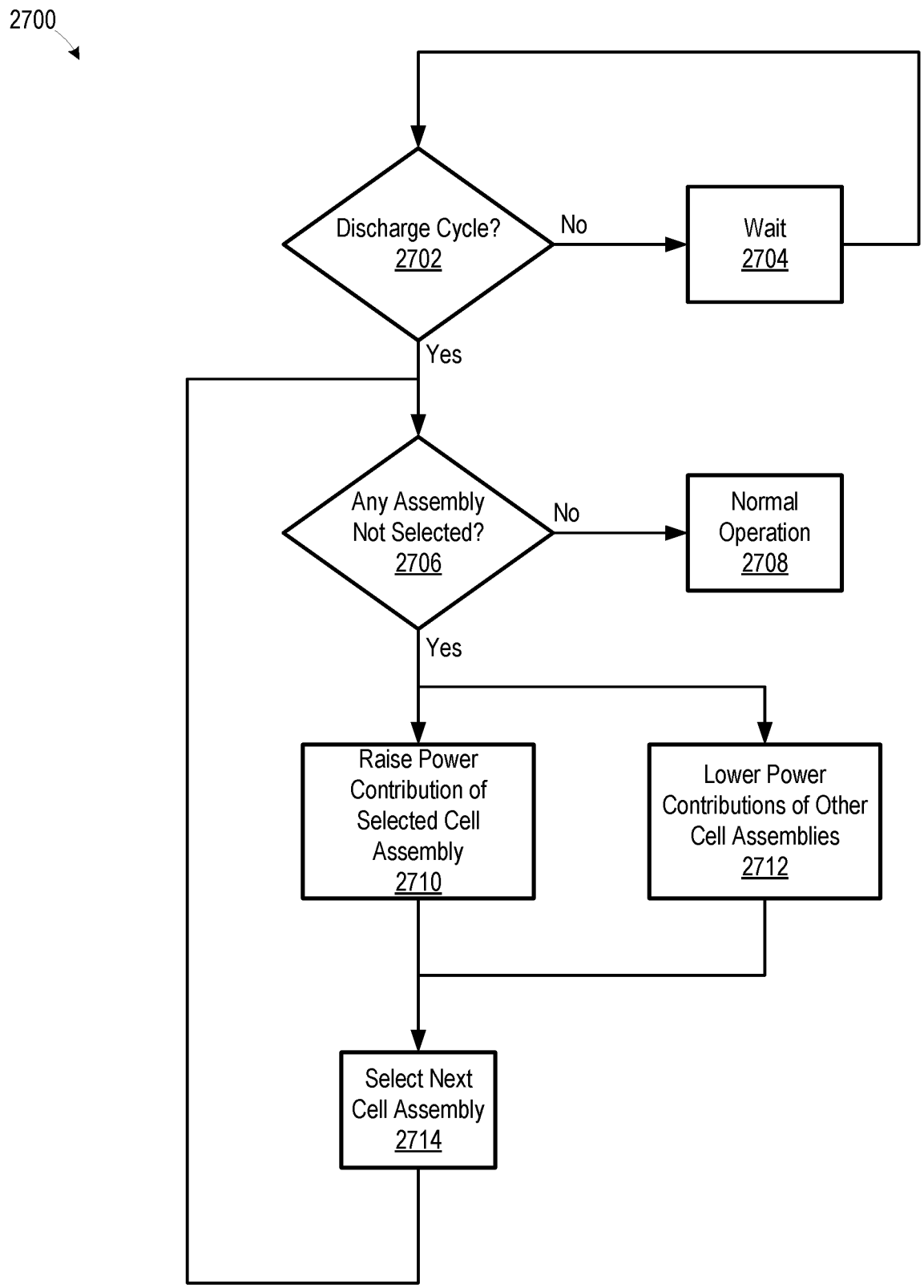
FIG. 27 is a flow chart of a method for performing preventative discharge in an energy storage system including a plurality of BMS nodes, according to an embodiment.

FIG. 27 is a flow chart of a method 2700 for performing preventative discharge in an energy storage system including a plurality of cell assemblies. In a decision block 2702, it is determined whether the cell assemblies are operating in a discharge cycle. In one example of decision block 2702, system controller 102 determines whether cell assemblies 110 of energy storage system 100 are operating in a discharge cycle. In another example of decision block 2702, system controller 102 determines whether cell assemblies 1710 of energy storage system 1700 are operating in a discharge cycle. If no, method 2700 proceeds to block 2704 to wait a predetermined amount of time, and method 2700 then returns to decision block 2702. If the result of decision step 2702 is yes, method 2700 proceeds to decision block 2706. Decision block 2706 determines whether any cell assembly of the energy storage system has not yet been selected for preventative discharge. In one example of decision block 2706, system controller 102 determines whether any cell assemblies 110 of energy storage system 100 have not yet been selected for preventative discharge. If no, method 2700 proceeds to block 2708, where the energy storage system operates normally. In one example of block 2708, system controller 102 controls BMS node controllers 112 in a manner which balances voltage or SOC of cell assemblies 110 of energy storage system 100.

If the result of decision block 2706 is yes, method 2700 proceeds to each of blocks 2710 and 2712 which are executed concurrently. In block 2710, the respective power contribution of a cell assembly selected for preventative discharge is increased. In an example of block 2710, cell assembly 110(2) is selected for preventative discharge, and system controller 102 controls BMS node controller 112(2) to increase the respective power contribution of cell assembly 110(2), thereby applying a preventative discharge current to cell assembly 110(2). In another example of block 2710, cell assembly 1710(2) is selected for preventative discharge, and system controller 102 controls BMS node controller 112(2) to increase the respective power contribution of cell assembly 1710(2), thereby applying a preventative discharge current to cell assembly 1710(2). In block 2712, respective power contributions of one or more other cell assemblies are lowered to compensate for the power contribution increase of the selected cell assembly. In one example of block 2712, system controller 102 controls BMS node controller 112(1) to reduce the power contribution of cell assembly 110(1), to compensate for the increased power contribution of cell assembly 110(2). In another example of block 2712, system controller 102 controls BMS node controller 112(1) to reduce the power contribution of cell assembly 1710(1), to compensate for the increased power contribution of cell assembly 1710(2). Method 2700 proceeds from blocks 2710 and 2712 to block 2714, where the next cell assembly in the energy storage system is selected for preventative discharge. In one example of block 2714, system controller 102 selects cell assembly 110(3) for preventative discharge. Method 2700 then returns to decision block 2706.

Rest Period Management

A cell assembly may be "rested,' i.e. neither charged nor discharged so that current does not flow through the cell assembly, to prolong life of the cell assembly. Duration of cell assembly's rest period may provide a non-linear increase of cell assembly life. Accordingly, some embodiments of system controller 102 are configured to (1) individually determined a desired rest period duration for each cell assembly 110, such as based on the cell assembly's state of health (e.g. capacity and impedance increase), and (2) control a respective a BMS node controller 112 electrically coupled to each cell assembly 110 to rest the cell assembly for its desired rest period duration. For example, a cell assembly 110 with a poor state of health may be rested for a longer period than a cell assembly 110 with a good state of health, to help achieve common state of health of the cell assemblies.

Additionally, cell assemblies that rest at low SOC experience less degradation than cell assemblies which rest at a high SOC. Therefore, it is desirable for a cell assembly's SOC to low be during resting. However, in some applications, a cell assembly must be rested at a high SOC to be prepared to deliver power on demand. For example, cell assemblies used in an UPS must be rested at a sufficiently high SOC to enable the cell assemblies to provide necessary power to a load in the event of primary power source failure. Accordingly, some embodiments of system controller 102 are configured to individually determine a desired SOC for resting each cell assembly 110 based on one or more characteristics of the cell assembly, such as cell assembly health and/or temperature, and system controller 102 then controls BMS node controllers 112 so that each cell assembly 110 is rested at its desired SOC. For example, a cell assembly 110 with a poor state of health may be rested at a low SOC to prolong its life, while a cell assembly 110 with a good state of health may be rested at a high SOC to be able to provide power on demand. As another example, a cell assembly 110 having a high temperature may be rested at a low SOC to prolong its life, while a cell assembly 110 having a low temperature may be rested at a high SOC to be able to provide power on demand.

Furthermore, particular embodiments of system controller 102 are configured to individually determine a desired SOC for resting each cell assembly 110 while maintaining a system level objective, and system controller 102 then controls BMS node controllers 112 so that each cell assembly 110 is rested at its desired SOC. For example, assume that a system level objective is to maintain at least a minimum amount of energy stored in energy storage system 100, such as in an UPS application of energy storage system 100. Certain embodiments of system controller 102 may be configured to individually determine a desired SOC for resting each cell assembly 110, such as based on cell assembly health and/or temperature, while ensuring that energy storage system 100 has sufficient stored energy to provide necessary power to a load for sufficient time duration in the event of primary power source failure. For instance, system controller 102 may compensate for one cell assembly 110 being rested at a low SOC by raising a resting SOC of one or more additional cell assemblies 110, to maintain the minimum amount of energy stored in energy storage system 100.

Figure 28:
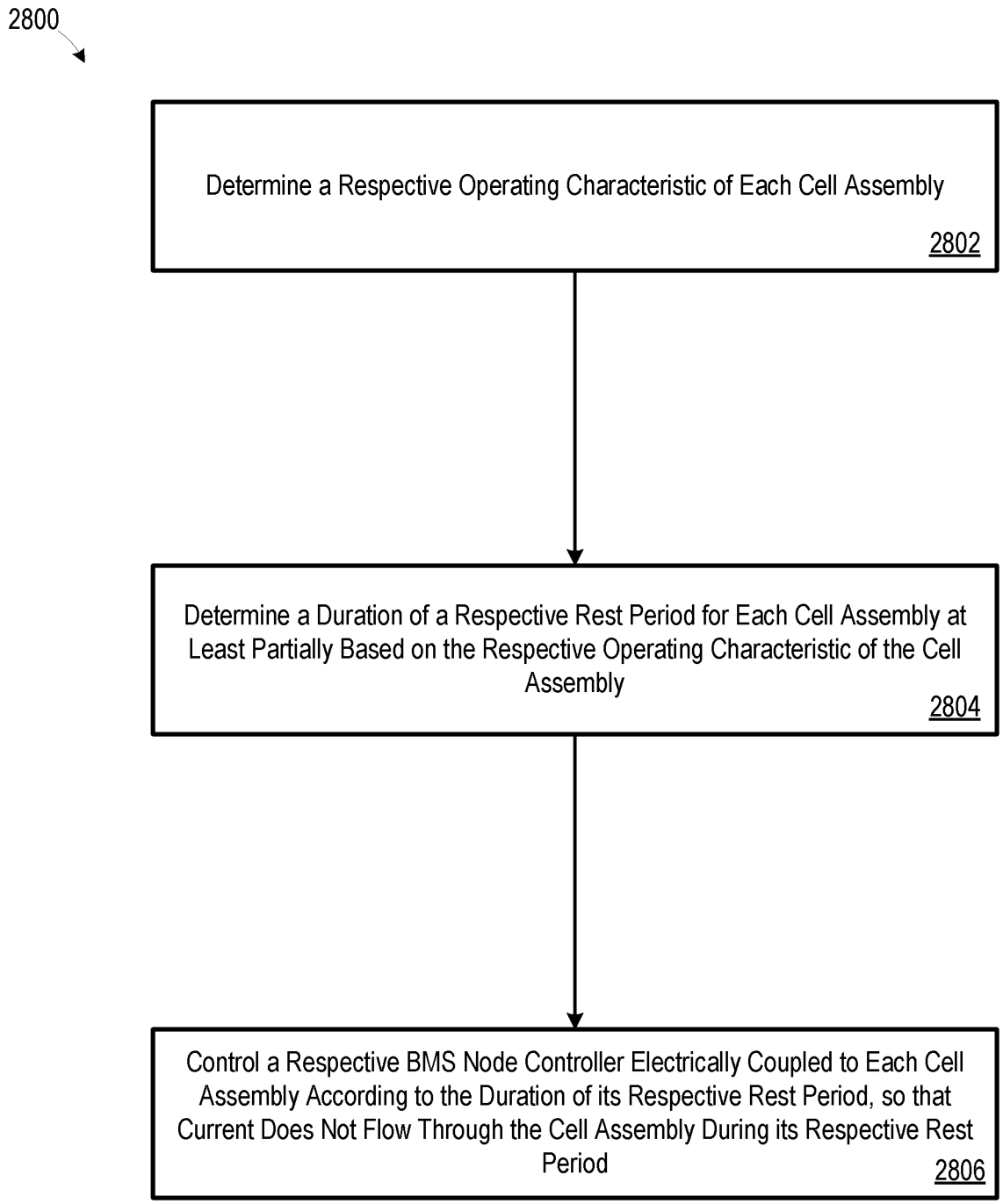
FIG. 28 is a flow chart of a method for managing electrochemical cell rest periods, according to an embodiment.

FIG. 28 is a flow chart of a method 2800 for managing cell assembly rest periods. In a block 2802, a respective operating characteristic is determined for each cell assembly. In one example one block 2802, system controller 102 determines a respective state of health or state of degradation of each cell assembly 110 in energy storage system 100. In another example of block 2802, system controller 102 determines a respective state of health or state of degradation of each cell assembly 1810 in energy storage system 1800. In a block 2804, a respective rest period duration is determined for each cell assembly of the energy storage system, at least partially based on the respective operating characteristic of the cell assembly. In one example of block 2804, system controller 102 determines a respective rest period duration for each cell assembly 110 based on its respective state of health or state of degradation. In another example of block 2804, system controller 102 determines a respective rest period duration for each cell assembly 1810 based on its respective state of health or state of degradation.

For instance, a cell assembly 110 or 1810 with a poor state of health or a significant state of degradation may have a longer respective rest period than a cell assembly with a good state of health or minimal state of degradation. In a block 2806, a respective BMS node controller 112 electrically coupled to each cell assembly is controlled according to the duration of its respective rest period, so that current does not flow through the cell assembly during its respective rest period. In one example of block 2806, system controller 102 controls BMS node controllers 112, so that current does not flow through cell assemblies 110 during their respective rest periods. In another example of block 2806, system controller 102 controls BMS node controllers 112, so that current does not flow through cell assemblies 1810 during their respective rest periods.

Controlled Transition Between Anode Intercalation Stages

An electrochemical cell may be particularly prone to degradation during transitions between anode intercalation stages. For example, a graphite anode of a Lithium-ion electrochemical cell may be particularly prone to degradation during transitions between anode intercalation stage 1 and anode intercalation stage 2. However, electrochemical cell degradation from intercalation stage transitions can be exponentially decreased by decreasing electrochemical cell charge/discharge rate during the transitions. Accordingly, certain embodiments of system controller 102 are configured to control cell assemblies 110 via their respective BMS node controllers 112 to (a) decrease cell assembly 110 charge/discharge rate during a transition between two intercalation stages (e.g., during a transition between intercalation stages 1 and 2 in the case of a graphite anode) and (b) increase cell assembly charge/discharge rate after the transition between the two intercalation stages. For example, some embodiments of system controller 102 are configured to (a) group cell assemblies 110 having similar SOCs, (b) control one or more BMS node controllers 112 to decrease the charge/discharge rate of a given group of cell assemblies 110 in response to the group transitioning between two anode intercalation stages, and (c) control one or more BMS node controllers 112 to increase the charge/discharge rate of each group of cell assemblies 110 in response to the group completing the transition between the two anode intercalation stages, such that different groups of cell assemblies 110 transition between the two intercalation stages at different times and at relatively low charge/discharge rates. As another example, certain embodiments of system controller 102 are configured to control one or more BMS node controllers 112 to (a) cause cell assemblies 110, or groups of cell assemblies 110, to transition between anode intercalation stages, e.g., between intercalation stages 1 and 2, at different respective times, (b) decrease the charge/discharge rate of a given cell assembly 110, or a given group of cell assemblies 110, in response to the cell assembly or group transitioning between the two anode intercalation stages, and (c) increase the charge/discharge rate of the cell assembly 110, or the group of cell assemblies 110, in response to the cell assembly or group completing the transition between the two anode intercalation stages.

Decreasing charge/discharge rate of a cell assembly 110, or a group of cell assemblies 110, during their transition between anode intercalation states may change operation of the energy storage system including the cell assemblies. Accordingly, certain embodiments of system controller 102 are configured to compensate for charge/discharge rate of a cell assembly 110, or a group of cell assemblies 110, being decreased by increasing charge/discharge rate of one or more additional cell assemblies 110, e.g., so that magnitude of power supplied by an energy storage system including the cell assemblies 110, or magnitude of power consumed by the energy storage system including the cell assemblies, does not change during transitions between anode intercalation stages.

SOC/Voltage Limiting

There may be a maximum SOC or voltage where a cell assembly remains safe, e.g., unable to thermally runaway, even if the cell assembly has experienced a significant failure. For example, an electrochemical cell including an internal short may not enter thermal runaway as long as its state of charge, or voltage, does not exceed a maximum threshold value. Accordingly, some embodiments of system controller 102 are configured to limit SOC of a cell assembly 110, or voltage $V_{cell}$ across the cell assembly, to a maximum threshold value in response to a safety signal, e.g., a signal indicating that the cell assembly is at risk of an unsafe failure, such as thermal runaway. For example, assume that system controller 102 receives, or internally generates, a safety signal indicating that cell assembly 110(2) is at risk of unsafe failure. In response thereto, system controller 102 may control BMS node controller 112(2) such that SOC of cell assembly 110(2), or $V_{cell}(2)$ across cell assembly 110(2), does not exceed a maximum threshold value. The maximum threshold value is, for example, a maximum SOC or voltage at which cell assembly 110(2) may operate without risk of an unsafe failure, e.g., without risk of the cell assembly entering thermal runaway. In some embodiments, the maximum threshold value is dynamic. For example, system controller 102 may reduce the maximum threshold value in response to further degradation of cell assembly 110(2) and/or in response to excessive heating of other cell assemblies 110 by cell assembly 110(2). Moreover, some embodiments of system controller 102 are configured to disconnect and/or bypass a given cell assembly 110 if the cell assembly continues to present a risk of unsafe failure after limiting its SOC or voltage to a maximum threshold value.

Additional Embodiments

Figure 29:
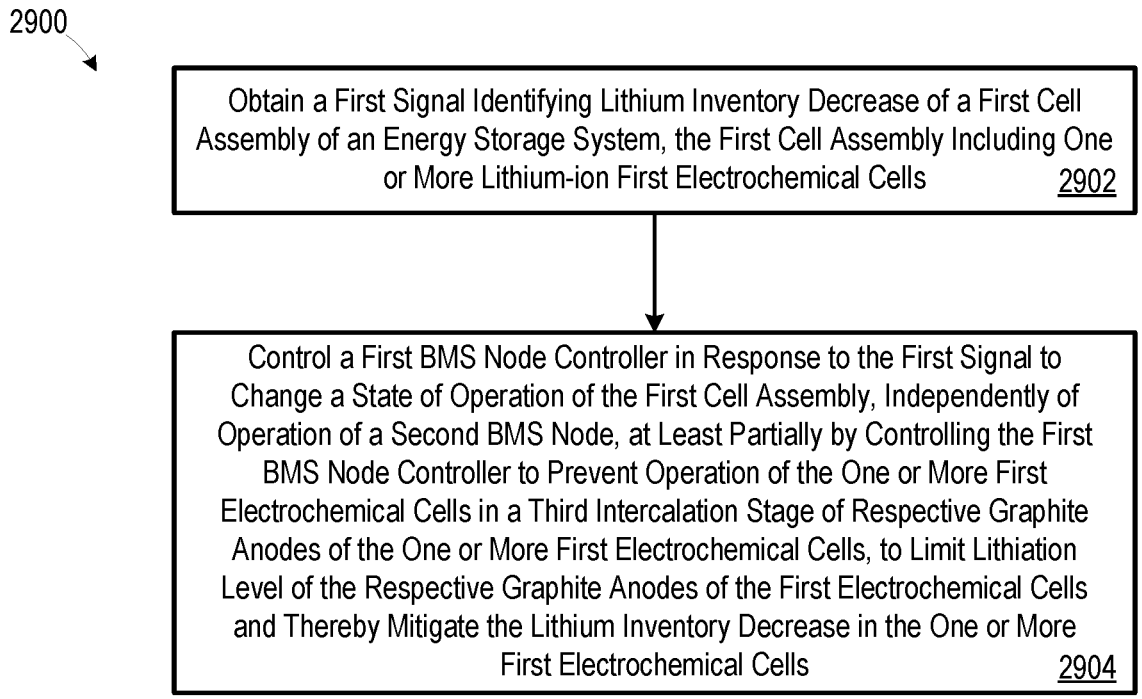
FIG. 29 is a flow chart of another method for adaptive electrochemical cell management in an energy storage system including a plurality of BMS nodes, according to an embodiment.

FIG. 29 is a flow chart of a method 2900 for adaptive electrochemical cell management in an energy storage system including a plurality of BMS nodes, to mitigate cell assembly degradation. In a block 2902 of method 2900, a first signal is obtained, where the first signal identifies Lithium inventory decrease of a first cell assembly of a first BMS node of the plurality of BMS nodes, and where the first cell assembly includes one or more Lithium-ion first electrochemical cells. In a block 2904 of method 2900, a first BMS node controller of the first BMS node is controlled in response to the first signal to change a state of operation of the first cell assembly, independently of operation of a second BMS node of the plurality of BMS nodes, at least partially by controlling the first BMS node controller to prevent operation of the one or more first electrochemical cells in a third intercalation stage of respective graphite anodes of the one or more first electrochemical cells, to limit lithiation level of the respective graphite anodes of the one or more first electrochemical cells and thereby mitigate the Lithium inventory decrease in the one or more first electrochemical cells.

Figure 30:
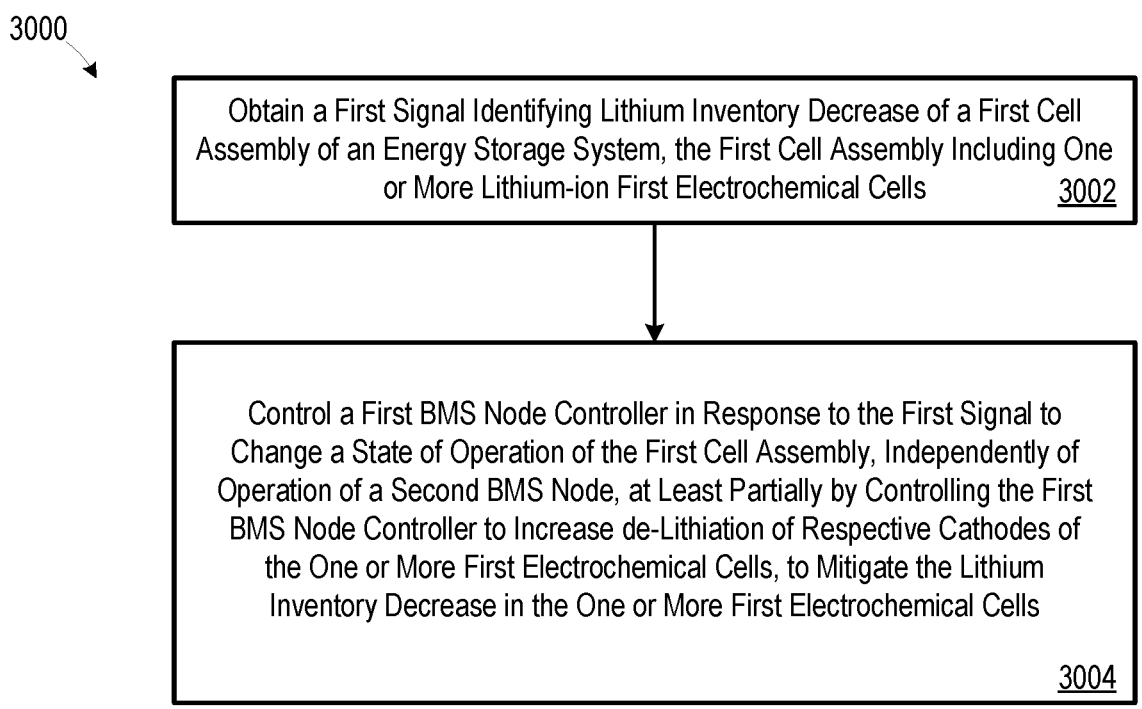
FIG. 30 is a flow chart of another method for adaptive electrochemical cell management in an energy storage system including a plurality of BMS nodes, according to an embodiment.

FIG. 30 is a flow chart of a method 3000 for adaptive electrochemical cell management in an energy storage system including a plurality of BMS nodes, to mitigate cell assembly degradation. In a block 3002 of method 3000, a first signal is obtained, where the first signal identifies Lithium inventory decrease of a first cell assembly of a first BMS node of the plurality of BMS nodes, and where the first cell assembly includes one or more Lithium-ion first electrochemical cells. In a block 3004 of method 3000, a first BMS node controller of the first BMS node is controlled in response to the first signal to change a state of operation of the first cell assembly, independently of operation of a second BMS node of the plurality of BMS nodes, at least partially by controlling the first BMS node controller to increase de-lithiation of respective cathodes of the one or more first electrochemical cells, to mitigate the Lithium inventory decrease in the one or more first electrochemical cells.

Figure 31:
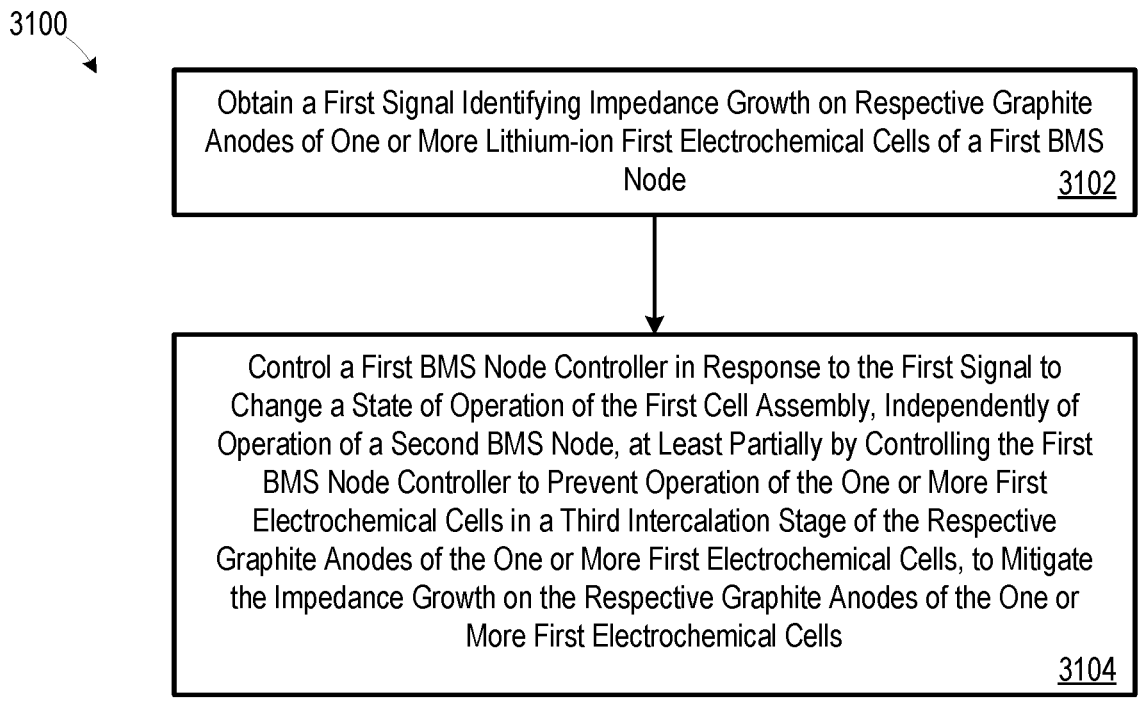
FIG. 31 is a flow chart of another method for adaptive electrochemical cell management in an energy storage system including a plurality of BMS nodes, according to an embodiment.

FIG. 31 is a flow chart of a method 3100 for adaptive electrochemical cell management in an energy storage system including a plurality of BMS nodes, to mitigate cell assembly degradation. In a block 3102 of method 3100, a first signal is obtained, where the first signal identifies impedance growth on respective graphite anodes of one or more Lithium-ion first electrochemical cells of a first BMS node of the plurality of BMS nodes. In a block 3104 of method 3100, a first BMS node controller of the first BMS node is controlled in response to the first signal to change a state of operation of the first cell assembly, independently of operation of a second BMS node of the plurality of BMS nodes, at least partially by controlling the first BMS node controller to prevent operation of the one or more first electrochemical cells in a third intercalation stage of the respective graphite anodes of the one or more first electrochemical cells, to mitigate the impedance growth on the respective graphite anodes of the one or more first electrochemical cells.

Figure 32:
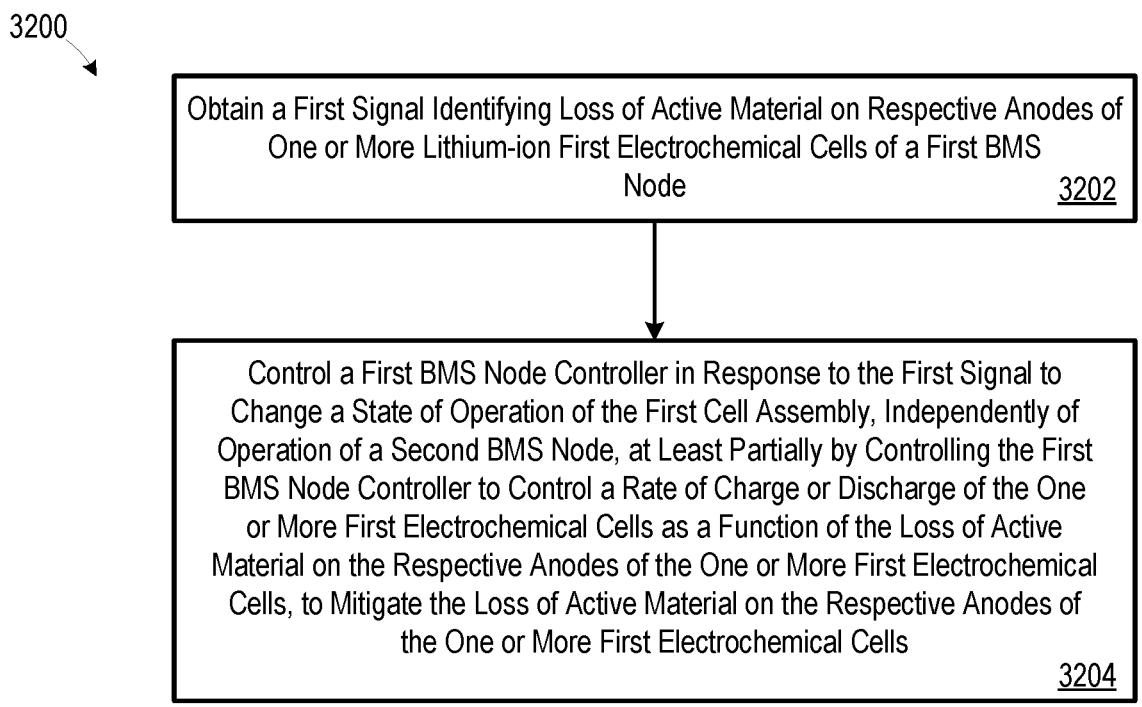
FIG. 32 is a flow chart of another method for adaptive electrochemical cell management in an energy storage system including a plurality of BMS nodes, according to an embodiment.

FIG. 32 is a flow chart of a method 3200 for adaptive electrochemical cell management in an energy storage system including a plurality of BMS nodes, to mitigate cell assembly degradation. In a block 3202 of method 3200, a first signal is obtained, where the first signal identifies loss of active material on respective anodes of one or more Lithium-ion first electrochemical cells of a first BMS node of the plurality of BMS nodes. In a block 3204 of method 3200, a first BMS node controller of the first BMS node is controlled in response to the first signal to change a state of operation of the first cell assembly, independently of operation of a second BMS node of the plurality of BMS nodes, at least partially by controlling the first BMS node controller to control a rate of charge or discharge of the one or more first electrochemical cells as a function of the loss of active material on the respective anodes of the one or more first electrochemical cells, to mitigate the loss of active material on the respective anodes of the one or more first electrochemical cells.

Figure 33:
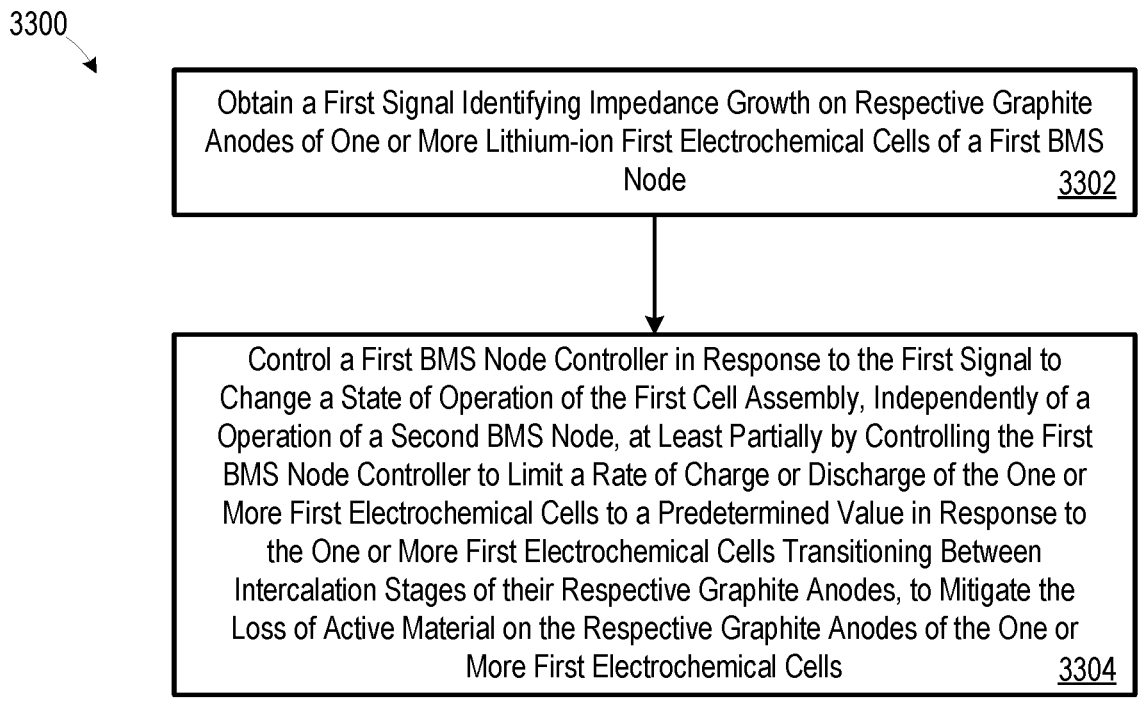
FIG. 33 is a flow chart of another method for adaptive electrochemical cell management in an energy storage system including a plurality of BMS nodes, according to an embodiment.

FIG. 33 is a flow chart of a method 3300 for adaptive electrochemical cell management in an energy storage system including a plurality of BMS nodes, to mitigate cell assembly degradation. In a block 3302 of method 3300, a first signal is obtained, where the first signal identifies loss of active material on respective graphite anodes of one or more Lithium-ion first electrochemical cells of a first BMS node of the plurality of BMS nodes. In a block 3304 of method 3300, a first BMS node controller of the first BMS node is controlled in response to the first signal to change a state of operation of the first cell assembly, independently of operation of a second BMS node of the plurality of BMS nodes, at least partially by controlling the first BMS node controller to limit a rate of charge or discharge of the one or more first electrochemical cells to a predetermined value in response to the one or more first electrochemical cells transitioning between intercalation stages of their respective graphite anodes, to mitigate the loss of active material on the respective graphite anodes of the one or more first electrochemical cells.

Figure 34:
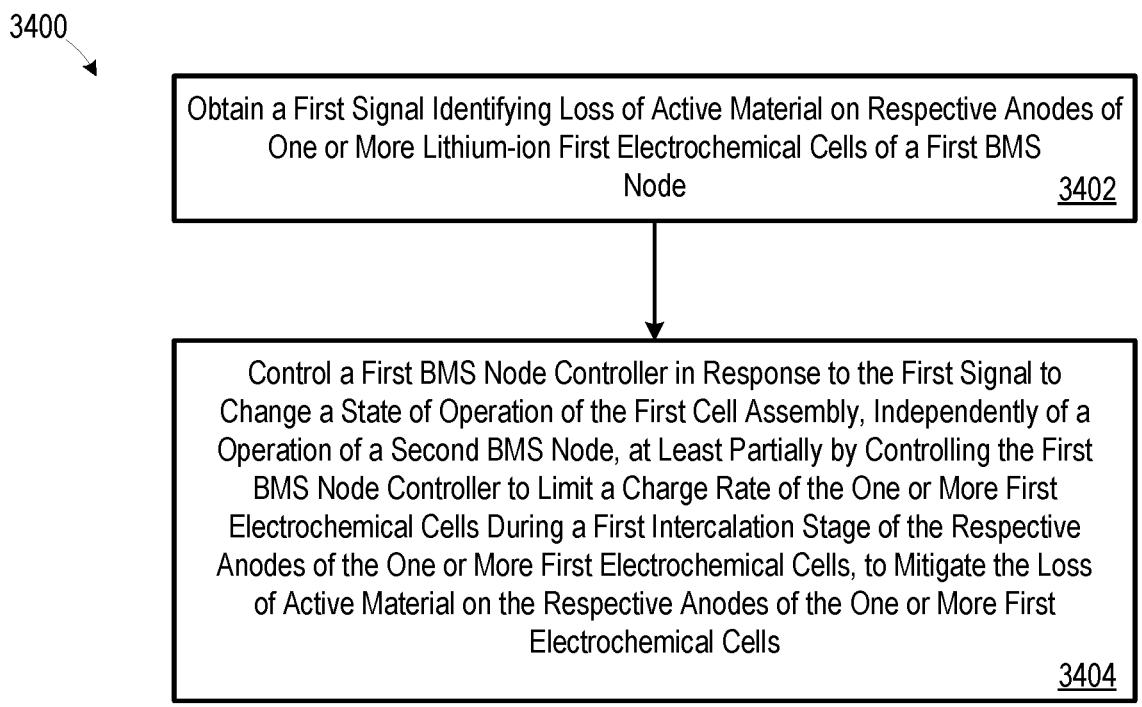
FIG. 34 is a flow chart of another method for adaptive electrochemical cell management in an energy storage system including a plurality of BMS nodes, according to an embodiment.

FIG. 34 is a flow chart of a method 3400 for adaptive electrochemical cell management in an energy storage system including a plurality of BMS nodes, to mitigate cell assembly degradation. In a block 3402 of method 3400, a first signal is obtained, where the first signal identifies loss of active material on respective anodes of one or more Lithium-ion first electrochemical cells of a first BMS node of the plurality of BMS nodes. In a block 3404 of method 3400, a first BMS node controller of the first BMS node is controlled in response to the first signal to change a state of operation of the first cell assembly, independently of operation of a second BMS node of the plurality of BMS nodes, at least partially by controlling the first BMS node controller to limit a charge rate of the one or more first electrochemical cells during a first intercalation stage of the respective anodes of the one or more first electrochemical cells, to mitigate the loss of active material on the respective anodes of the one or more first electrochemical cells.

Changes may be made in the above methods, devices, and systems without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and system, which as a matter of language, might be said to fall therebetween.

What is claimed is:

1. A method for adaptive electrochemical cell management in an energy storage system including a plurality of battery management system (BMS) nodes, the method comprising:

obtaining a first signal identifying a plurality of degradation mechanisms of a first cell assembly of a first BMS node of the plurality of BMS nodes, the first cell assembly including one or more first electrochemical cells, each degradation mechanism of the plurality of degradation mechanisms representing a different respective type of degradation of the first cell assembly;

weighting the plurality of degradation mechanisms to obtain a plurality of weighted degradation mechanisms;

selecting a first one of the plurality of weighted degradation mechanisms for mitigation at least partially based on respective values of the plurality of weighted degradation mechanisms;

selecting, from a plurality of predetermined operating state changes stored in a memory, a first operating state change that is appropriate for mitigating the selected first one of the plurality of weighted degradation mechanisms, each operating state change of the plurality of predetermined operating state changes being appropriate for mitigating a different respective degradation mechanism of the plurality of degradation mechanisms; and controlling a first BMS node controller of the first BMS node to change a state of operation of the first cell assembly according to the first operating state change, to mitigate at least the selected first one of the plurality of degradation mechanisms of the first cell assembly without electrically disconnecting the first cell assembly from the energy storage system, independently of operation of a second BMS node of the plurality of BMS nodes.

2. The method of claim 1, wherein the one or more first electrochemical cells are Lithium-ion electrochemical cells, and the plurality of degradation mechanisms of the first cell assembly comprise at least one of loss of Lithium inventory of the one or more first electrochemical cells, loss of active material in respective anodes of the one or more first electrochemical cells, loss of active material in respective cathodes of the one or more first electrochemical cells, impedance growth on the respective anodes of the one or more first electrochemical cells, impedance growth on the respective cathodes of the one or more first electrochemical cells, abnormal lithiation level on the respective anodes of the one or more first electrochemical cells, and abnormal lithiation level on the respective cathodes of the one or more first electrochemical cells.

3. The method of claim 1, further comprising controlling a third BMS node controller of a third BMS node of the plurality of BMS nodes to at least partially compensate for the change in the state of operation of the first cell assembly, such that a power contribution of the energy storage system does not change in response to the change in the state of operation of the first cell assembly.

4. The method of claim 1, wherein the one or more first electrochemical cells comprise a plurality of first electrochemical cells electrically coupled together.

5. The method of claim 1, wherein:
each first electrochemical cell of the one or more first electrochemical cells is a Lithium-ion electrochemical cell;
the plurality of degradation mechanisms of the first cell assembly comprise Lithium inventory decrease in the one or more first electrochemical cells; and
controlling the first BMS node controller to change the state of operation of the first cell assembly according to the first operating state change comprises controlling the first BMS node controller to prevent operation of the one or more first electrochemical cells in a third intercalation stage of respective graphite anodes of the one or more first electrochemical cells, to limit lithiation level of the respective graphite anodes of the one or more first electrochemical cells and thereby mitigate the Lithium inventory decrease in the one or more first electrochemical cells.

6. The method of claim 1, wherein:
each first electrochemical cell of the one or more first electrochemical cells is a Lithium-ion electrochemical cell;
the plurality of degradation mechanisms of the first cell assembly comprise Lithium inventory decrease in the one or more first electrochemical cells; and
controlling the first BMS node controller to change the state of operation of the first cell assembly according to the first operating state change comprises controlling the first BMS node controller to increase de-lithiation of respective cathodes of the one or more first electrochemical cells, to mitigate the Lithium inventory decrease in the one or more first electrochemical cells.

7. The method of claim 1, wherein:
each first electrochemical cell of the one or more first electrochemical cells is a Lithium-ion electrochemical cell;
the plurality of degradation mechanisms of the first cell assembly comprise impedance growth on respective graphite anodes of the one or more first electrochemical cells; and
controlling the first BMS node controller to change the state of operation of the first cell assembly according to the first operating state change comprises controlling the first BMS node controller to prevent operation of the one or more first electrochemical cells in a third intercalation stage of the respective graphite anodes of the one or more first electrochemical cells, to mitigate the impedance growth on the respective graphite anodes of the one or more first electrochemical cells.

8. The method of claim 1, wherein:
each first electrochemical cell of the one or more first electrochemical cells is a Lithium-ion electrochemical cell;
the plurality of degradation mechanisms of the first cell assembly comprise loss of active material on respective anodes of the one or more first electrochemical cells; and
controlling the first BMS node controller to change the state of operation of the first cell assembly according to the first operating state change comprises controlling the first BMS node controller to control a rate of charge or discharge of the one or more first electrochemical cells as a function of the loss of active material on the respective anodes of the one or more first electrochemical cells, to mitigate the loss of active material on the respective anodes of the one or more first electrochemical cells.

9. The method of claim 1, wherein:
each first electrochemical cell of the one or more first electrochemical cells is a Lithium-ion electrochemical cell;
the plurality of degradation mechanisms of the first cell assembly comprise loss of active material on respective graphite anodes of the one or more first electrochemical cells; and
controlling the first BMS node controller to change the state of operation of the first cell assembly according to the selected first operating state change comprises controlling the first BMS node controller to limit a rate of charge or discharge of the one or more first electrochemical cells to a predetermined value while the one or more first electrochemical cells transition between intercalation stages of their respective graphite anodes, to mitigate the loss of active material on the respective graphite anodes of the one or more first electrochemical cells.

10. The method of claim 1, wherein:
each first electrochemical cell of the one or more first electrochemical cells is a Lithium-ion electrochemical cell;
the plurality of degradation mechanisms of the first cell assembly comprise loss of active material on respective anodes of the one or more first electrochemical cells; and
controlling the first BMS node controller to change the state of operation of the first cell assembly according to the first operating state change comprises controlling the first BMS node controller to limit a charge rate of the one or more first electrochemical cells during a first intercalation stage of the respective anodes of the one or more first electrochemical cells, to mitigate the loss of active material on the respective anodes of the one or more first electrochemical cells.

11. A method for adaptive electrochemical cell management in an energy storage system including a plurality of battery management system (BMS) nodes, the method comprising:
obtaining a first signal identifying a plurality of hazardous failure mechanisms of a first cell assembly of a first BMS node of the plurality of BMS nodes, the first cell assembly including one or more first electrochemical cells;

generating a composite hazardous failure value at least partially based on the plurality of hazardous failure mechanisms and respective weights for each of the plurality of hazardous failure mechanisms;

determining that the composite hazardous failure value does not exceed a threshold value for deactivating the first cell assembly; and in response to determining that the composite hazardous failure value does not exceed the threshold value for deactivating the first cell assembly;

selecting, from a plurality of predetermined operating state changes stored in a memory, a first operating state change that is appropriate for mitigating a selected one of the plurality of hazardous failure mechanisms of the first cell assembly, each operating state change of the plurality of predetermined operating state changes being appropriate for mitigating a different respective type of hazardous failure mechanism, and controlling a first power converter of a first BMS node controller of the first BMS node to change a state of operation of the first cell assembly according to the first operating state change, to mitigate at least one of the plurality of hazardous failure mechanisms of the first cell assembly, independently of operation of a second power converter of a second BMS node of the plurality of BMS nodes.

12. The method of claim 11, wherein the plurality of hazardous failure mechanisms of the first cell assembly comprise one or more of metallic plating on respective electrodes of the one or more first electrochemical cells, mechanical shorting in the one or more first electrochemical cells, and gas evolution in the one or more first electrochemical cells.

13. The method of claim 11, further comprising controlling a third BMS node controller of a third BMS node of the plurality of BMS nodes to at least partially compensate for the change in the state of operation of the first cell assembly, such that a power contribution of the energy storage system does not change in response to the change in the state of operation of the first cell assembly.

14. The method of claim 11, wherein the one or more first electrochemical cells comprise a plurality of first electrochemical cells electrically coupled together.

15. The method of claim 11, wherein:
each first electrochemical cell of the one or more first electrochemical cells is a Lithium-ion electrochemical cell;
the plurality of hazardous failure mechanisms of the first cell assembly comprise metallic plating on respective electrodes of the one or more first electrochemical cells; and
controlling the first power converter of the first BMS node controller to change the state of operation of the first cell assembly according to the first operating state change comprises controlling the first power converter of the first BMS node controller to decrease a charge or discharge rate of the one or more first electrochemical cells in response to a state of charge of the one or more first electrochemical cells exceeding a threshold value, to mitigate the metallic plating on the respective electrodes of the one or more first electrochemical cells.

16. The method of claim 11, wherein:
each first electrochemical cell of the one or more first electrochemical cells is a Lithium-ion electrochemical cell;
the plurality of hazardous failure mechanisms of the first cell assembly comprise metallic plating on respective electrodes of the one or more first electrochemical cells; and
controlling the first power converter of the first BMS node controller to change the state of operation of the first cell assembly according to the first operating state change comprises controlling the first power converter of the first BMS node controller to decrease a maximum permissible state of charge of the one or more first electrochemical cells so that the one or more first electrochemical cells do not operate in a third intercalation stage of respective graphite anodes of the one or more first electrochemical cells, to mitigate the metallic plating on the respective electrodes of the one or more first electrochemical cells.

17. The method of claim 11, wherein:
each first electrochemical cell of the one or more first electrochemical cells is a Lithium-ion electrochemical cell;
the plurality of hazardous failure mechanisms of the first cell assembly comprise metallic plating on respective electrodes of the one or more first electrochemical cells; and
controlling the first power converter of the first BMS node controller to change a state of operation of the first cell assembly according to the first operating state change comprises controlling the first power converter of the first BMS node controller to regulate a charge or discharge rate of the one or more first electrochemical cells based at least in part on a graphite anode-level impedance of the one or more first electrochemical cells, to mitigate the metallic plating on the respective electrodes of the one or more first electrochemical cells.

18. The method of claim 11, wherein:
each first electrochemical cell of the one or more first electrochemical cells is a Lithium-ion electrochemical cell;
the plurality of hazardous failure mechanisms of the first cell assembly comprise metallic plating on respective electrodes of the one or more first electrochemical cells; and
controlling the first power converter of the first BMS node controller to change a state of operation of the first cell assembly according to the first operating state change comprises controlling the first power converter of the first BMS node controller to increase a discharge rate of the one or more first electrochemical cells to strip the metallic plating on the respective electrodes of the one or more first electrochemical cells.

19. A method for mitigating degradation in an energy storage system including a plurality of cell assemblies, each cell assembly including one or more electrochemical cells, the method comprising:

performing a selection process wherein at least a first cell assembly of the plurality of cell assemblies and a second cell assembly of the plurality of cell assemblies are selected for preventative discharge at different respective times according to a predetermined selection sequence; and for at least each of the first cell assembly and the second cell assembly, performing a preventative discharge procedure when the cell assembly is selected for preventative discharge, the preventative discharge procedure including:
increasing a respective power contribution of the cell assembly selected for preventative discharge, and
decreasing respective power contributions of at least one cell assembly of the plurality of cell assemblies, other than the cell assembly selected for preventative discharge, to compensate for increasing the respective power contribution of the cell assembly selected for preventative discharge.

20. The method of claim 19, further comprising, for at least each of the first cell assembly and the second cell assembly, returning the cell assembly to normal operation after the cell assembly is no longer selected for preventative discharge.

21. The method of claim 19, wherein the predetermined selection process includes periodically selecting at least one of the first cell assembly and the second assembly for preventative discharge.

22. The method of claim 19, further comprising performing the selection process in response to beginning of discharge of the plurality of cell assemblies.

23. The method of claim 19, further comprising selecting the first cell assembly for preventative discharge in response to a signal indicating an anomaly in the first cell assembly.

24. The method of claim 23, wherein the anomaly in the first cell assembly comprises metallic plating on respective electrodes of the one or more electrochemical cells of the first cell assembly crossing a threshold value.

25. The method of claim 19, further comprising setting respective power contributions of the plurality of cell assemblies such that a bus voltage collectively generated by the plurality of cell assemblies does not change in response to the first cell assembly being selected for preventative discharge.

26. The method of claim 19, further comprising controlling a respective battery management system (BMS) node controller for each cell assembly to achieve a respective power contribution of each cell assembly.

27. The method of claim 19, wherein each cell assembly comprises a plurality of electrochemical cells electrically coupled together.

* * * * *